US012094416B1

(12) United States Patent
Chen et al.

(10) Patent No.: US 12,094,416 B1
(45) Date of Patent: Sep. 17, 2024

(54) DISPLAY PANEL AND DISPLAY DEVICE

(71) Applicants: Wuhan Tianma Micro-Electronics Co., Ltd., Wuhan (CN); Wuhan Tianma Microelectronics Co., LTD. Shanghai Branch, Shanghai (CN)

(72) Inventors: Xi Chen, Wuhan (CN); Qibing Wei, Wuhan (CN)

(73) Assignees: Wuhan Tianma Micro-Electronics Co., Ltd., Wuhan (CN); Wuhan Tianma Microelectronics Co., LTD. Shanghai Branch, Shanghai (CN)

(*) Notice: Subject to any disclaimer, the term of this patent is extended or adjusted under 35 U.S.C. 154(b) by 0 days.

(21) Appl. No.: 18/382,334

(22) Filed: Oct. 20, 2023

(30) Foreign Application Priority Data

Apr. 12, 2023 (CN) .......................... 202310389172.1

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01); *G09G 2300/0819* (2013.01); *G09G 2300/0852* (2013.01); *G09G 2320/0209* (2013.01); *G09G 2320/0233* (2013.01); *G09G 2320/0247* (2013.01); *G09G 2320/045* (2013.01)

(58) Field of Classification Search
None
See application file for complete search history.

(56) References Cited

U.S. PATENT DOCUMENTS

| | | | |
|---|---|---|---|
| 11,361,713 B1* | 6/2022 | Fu | G09G 3/3241 |
| 2022/0406254 A1* | 12/2022 | Wang | H01L 27/1225 |
| 2023/0048014 A1* | 2/2023 | Wang | G09G 3/3258 |
| 2023/0093830 A1* | 3/2023 | Zhang | H10K 59/131 |
| | | | 345/690 |
| 2023/0351969 A1* | 11/2023 | Zhang | G09G 3/3258 |

FOREIGN PATENT DOCUMENTS

| | | |
|---|---|---|
| CN | 113314073 B | 4/2022 |
| CN | 115151970 A | 10/2022 |

\* cited by examiner

*Primary Examiner* — Christopher J Kohlman
(74) *Attorney, Agent, or Firm* — Anova Law Group, PLLC

(57) ABSTRACT

A display panel and a display device are provided. The display panel includes a plurality of sub-pixels. Each sub-pixel includes a pixel circuit and a light-emitting element. The pixel circuit includes a driving module, a compensation module, and a voltage regulation module. The compensation module includes a first double-gate transistor, and the first double-gate transistor includes a middle node. First and second electrodes of the first double-gate transistor are electrically connected to a control terminal and a second terminal of the driving module, respectively. A gate of the first double-gate transistor is connected to a first scan line providing a first scan signal. First and second terminals of the voltage regulation module are electrically connected to the middle node and a second scan line providing a second scan signal, respectively. A phase of the second scan signal is opposite to a phase of the first scan signal.

20 Claims, 38 Drawing Sheets

DISPLAY PANEL AND DISPLAY DEVICE

CROSS-REFERENCE TO RELATED APPLICATION

This application claims the priority of Chinese patent application No. 202310389172.1, filed on Apr. 12, 2023, the entirety of which is incorporated herein by reference.

FIELD

The present disclosure generally relates to the field of display technology and, more particularly, relates to a display panel and a display device.

BACKGROUND

Organic light-emitting diode (OLED) display panels have advantages such as thinness, lightness, wide viewing angle, active emission of light, continuous adjustable emission color, low cost, fast response speed, low energy consumption, low driving voltage, wide operating temperature range, simple production process, high luminous efficiency, and flexible display, and thus have become increasingly popular in the display fields of mobile phones, tablets, digital cameras, and other devices.

An existing OLED display panel often includes a pixel circuit. The pixel circuit includes a driving transistor and a light-emitting device, and the driving transistor generates a driving current for driving the light-emitting device to emit light. However, in the existing pixel circuit, the presence of a leakage current is a common issue which affects the stability of the gate voltage of the driving transistor and even the display quality of the display panel in the subsequent light-emitting process of the light-emitting device. At the same time, the leakage current makes the display panel be difficult to adapt to a low refresh rate, in other words, when the display panel is refreshed at a low frequency, the brightness within one frame changes greatly, which leads to undesirable effects such as screen flickering and affects the display quality.

Therefore, how to provide a display panel and a display device capable of improving the stability of the gate voltage of the driving transistor in the pixel circuit, improving the stability of display brightness and improving display quality is an urgent technical problem that needs to be solved.

SUMMARY

One aspect of the present disclosure provides a display panel. The display panel includes a plurality of sub-pixels. Each of the plurality of sub-pixels includes a pixel circuit and a light-emitting element that are electrically connected to each other. The pixel circuit at least includes a driving module and a compensation module. A first terminal of the driving module is electrically connected to a first power signal line, a second terminal of the driving module is electrically connected to an anode of the light-emitting element, and a cathode of the light-emitting element is electrically connected to a second power signal line. The compensation module includes a first double-gate transistor. A first electrode of the first double-gate transistor is electrically connected to a control terminal of the driving module, and a second electrode of the first double-gate transistor is electrically connected to the second terminal of the driving module. A gate of the first double-gate transistor is connected to a first scan line, and the first scan line provides a first scan signal. The pixel circuit further includes a voltage regulation module, and the first double-gate transistor includes a middle node. A first terminal of the voltage regulation module is electrically connected to the middle node, and a second terminal of the voltage regulation module is electrically connected to a second scan line, where the second scan line provides a second scan signal. A phase of the second scan signal is opposite to a phase of the first scan signal.

Another aspect of the present disclosure provides a display device. The display device includes a display panel. The display panel includes a plurality of sub-pixels. Each of the plurality of sub-pixels includes a pixel circuit and a light-emitting element that are electrically connected to each other. The pixel circuit at least includes a driving module and a compensation module. A first terminal of the driving module is electrically connected to a first power signal line, a second terminal of the driving module is electrically connected to an anode of the light-emitting element, and a cathode of the light-emitting element is electrically connected to a second power signal line. The compensation module includes a first double-gate transistor. A first electrode of the first double-gate transistor is electrically connected to a control terminal of the driving module, and a second electrode of the first double-gate transistor is electrically connected to the second terminal of the driving module. A gate of the first double-gate transistor is connected to a first scan line, and the first scan line provides a first scan signal. The pixel circuit further includes a voltage regulation module, and the first double-gate transistor includes a middle node. A first terminal of the voltage regulation module is electrically connected to the middle node, and a second terminal of the voltage regulation module is electrically connected to a second scan line, where the second scan line provides a second scan signal. A phase of the second scan signal is opposite to a phase of the first scan signal.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Various modifications and changes can be made to the embodiments of the present disclosure without departing from the spirit or scope of the present disclosure, which is apparent to those skilled in the art. Therefore, the present disclosure is intended to cover modifications and changes falling within the scope of the corresponding claims (the technical solutions to be protected) and their equivalents. It should be noted that the embodiments provided by the present disclosure can be combined with each other without contradiction.

Similar reference numbers and letters represent similar terms in the following Figures, such that once an item is defined in one Figure, it does not need to be further discussed in subsequent Figures.

Figure 1:
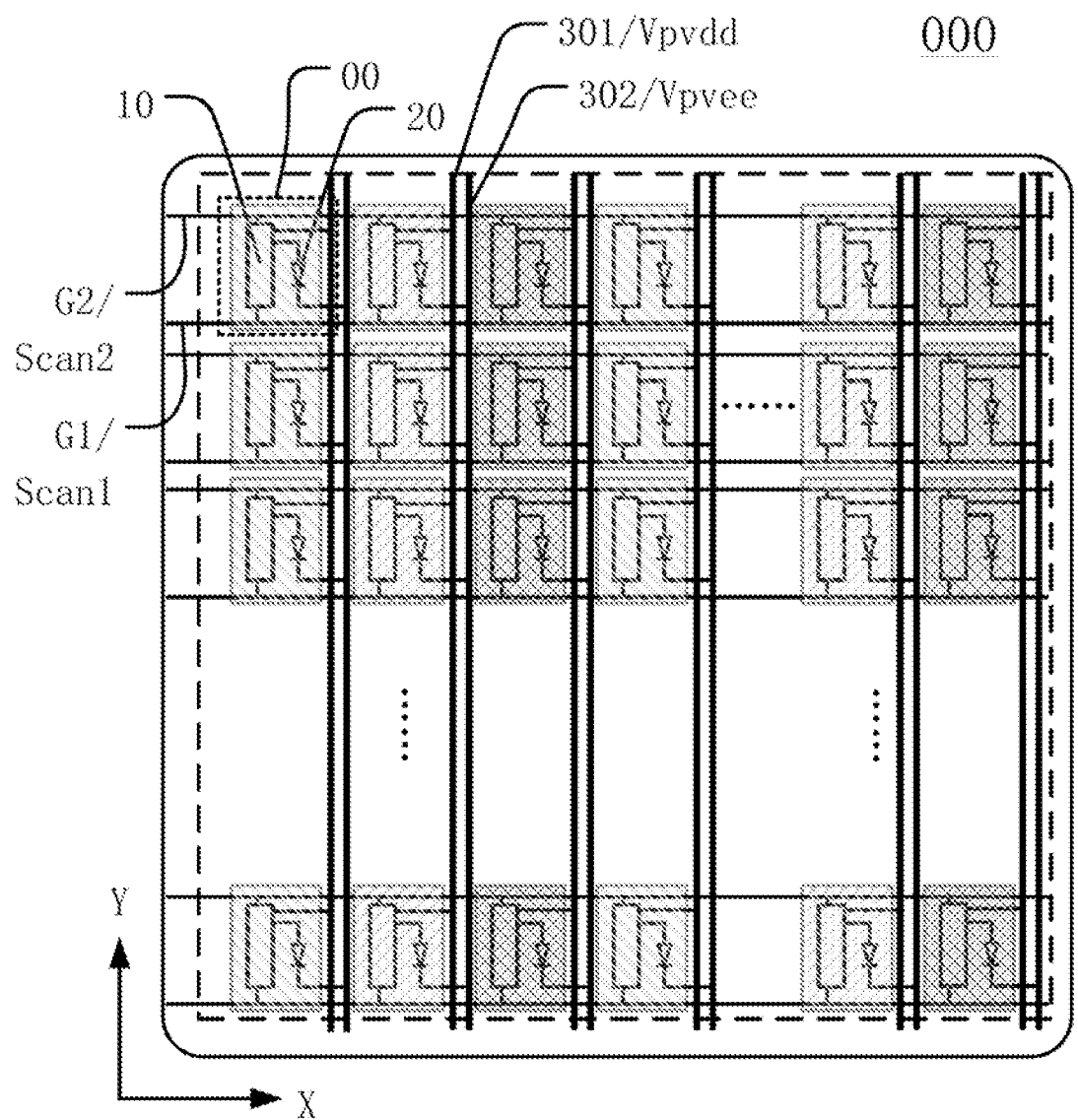
FIG. 1 illustrates a schematic diagram of a planar structure of an exemplary display panel consistent with disclosed embodiments of the present disclosure.
Figure 2:
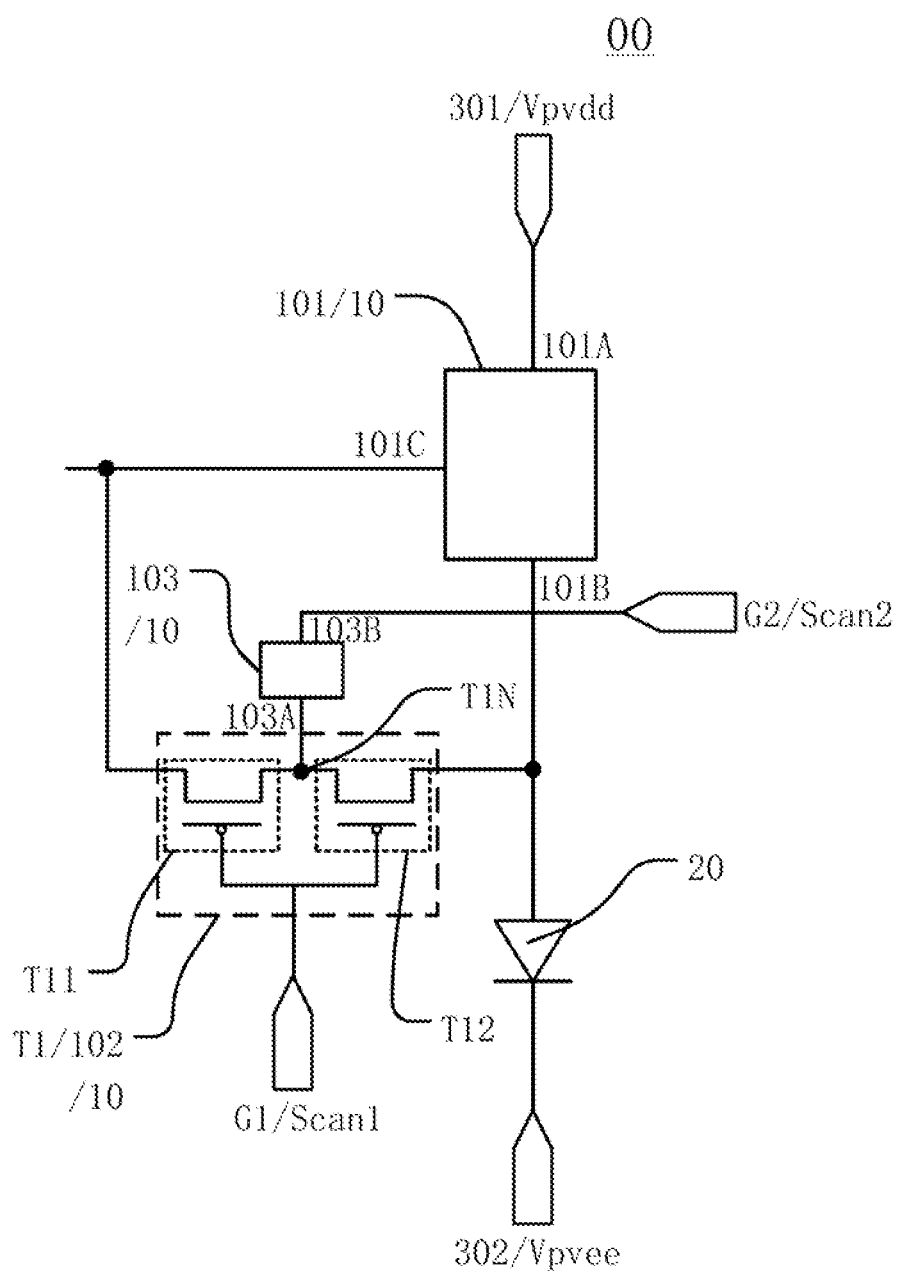
FIG. 2 illustrates a schematic diagram of a circuit connection structure of a sub-pixel in the display panel in FIG. 1 consistent with disclosed embodiments of the present disclosure.

The present disclosure provides a display panel and a display device, to improve the display effect of the display panel. FIG. 1 illustrates a schematic diagram of a planar structure of a display panel consistent with disclosed embodiments of the present disclosure; and FIG. 2 illustrates a schematic diagram of a circuit connection structure of a sub-pixel in the display panel in FIG. 1. It should be noted that transparent filling is applied to FIG. 1 for clarity of the structure in the present disclosure. Referring to FIG. 1 and FIG. 2, the display panel 000 may include a plurality of sub-pixels 00, and each of the plurality of sub-pixels 00 may include a pixel circuit 10 and a light-emitting element 20 that are electrically connected to each other.

The pixel circuit 10 may at least include a driving module 101 and a compensation module 102. A first terminal 101A of the driving module 101 may be electrically connected to a first power signal line 301, and a second terminal 101B of the driving module 101 may be electrically connected to an anode of the light-emitting element 20. A cathode of the light-emitting element 20 may be electrically connected to a second power signal line 302.

The compensation module 102 may include a first double-gate transistor T1. A first electrode of the first double-gate transistor T1 may be electrically connected to a control terminal 101C of the driving module 101, and a second electrode of the first double-gate transistor T1 may be electrically connected to the second terminal 101B of the driving module 101. A gate of the first double-gate transistor T1 may be connected to a first scan line G1, and the first scan line G1 may provide a first scan signal Scan1.

The pixel circuit 10 may further include a voltage regulation module 103. The first double-gate transistor T1 may include a middle node TIN. A first terminal 103A of the voltage regulation module 103 may be electrically connected to the middle node TIN, and a second terminal 103B of the voltage regulation module 103 may be electrically connected to a second scan line G2, and the second scan line G2 may provide a second scan signal Scan2. A phase of the second scan signal Scan2 may be opposite to a phase of the first scan signal Scan1.

In one embodiment, the disclosed display panel 000 may be an organic light-emitting display panel, or may be any other display panel that control the driving transistor in the pixel circuits 10 to provide the driving current to drive the light-emitting element 20 to emit light. The disclosed light-emitting element 20 may be an organic light-emitting diode. In certain embodiments, the light-emitting element 20 may be a micro light-emitting diode or a sub-millimeter light-emitting diode, which may not be limited by the present disclosure. For illustrative purposes, the display panel may be an organic light-emitting display panel as an example. The disclosed display panel 000 may include the plurality of sub-pixels 00 (sub-pixels of different colors may be distinguished by different filling patterns in the Figure). In one embodiment, the plurality of sub-pixels 00 may be arranged in an array. As shown in FIG. 1, the plurality of sub-pixels 00 may be arranged along a first direction X to form a plurality of sub-pixel rows, and the plurality of sub-pixel rows may be arranged along a second direction Y. The plurality of sub-pixels 00 may be arranged along the second direction Y to form a plurality of sub-pixel columns, and the plurality of sub-pixel columns may be arranged along the first direction X. The first direction X and the second direction Y may be understood as intersecting or perpendicular to each other in a plane parallel to the display panel 000. In certain embodiments, the plurality of sub-pixels 00 may also have other arrangements, which may not be limited by the present disclosure. For illustrative purposes, FIG. 1 may merely use the array arrangement of the plurality of sub-pixels 00 as an example.

The sub-pixel 00 may include a pixel circuit 10 and a light-emitting element 20 that are electrically connected to each other. The pixel circuit 10 may be configured to control the light-emitting element 20 to emit light. Because the light-emitting element 20 in an organic light-emitting diode display panel is often an organic light-emitting diode, which belongs to current-driven devices, therefore, a corresponding pixel circuit 10 may need to be disposed to provide driving current to the light-emitting element 20 to make the light-emitting element 20 emit light. The disclosed pixel circuit 10 may at least include the driving module 101 and the compensation module 102. In one embodiment, the driving module 101 may include a driving transistor (not shown in the Figure). The first terminal 101A of the driving module 101 may be understood as a source electrode of the driving transistor, and the second terminal 101B of the driving module 101 may be understood as a drain electrode of the driving transistor. Alternatively, the first terminal 101A of the driving module 101 may be understood as the drain electrode of the driving transistor, and the second terminal 101B of the driving module 101 may be understood as the source electrode of the driving transistor, which may not be limited by the present disclosure. The pixel circuit 10 may also include any other module, such as a reset module and a data-writing module, which may not be further elaborated herein and may refer to the electrical connection structure and operating process of the pixel circuit in the subsequent embodiments.

The first terminal 101A of the driving module 101 may be electrically connected to a first power signal line 301. The first power signal line 301 may be configured to provide a first power signal Vpvdd to the pixel circuits 10 of the display panel 000. The first power signal Vpvdd may be a positive power signal. The second terminal 101B of the driving module 101 may be electrically connected to the anode of the light-emitting element 20. The cathode of the light-emitting element 20 may be electrically connected to a second power signal line 302. The second power signal line 302 may be configured to provide a second power signal Vpvee to the pixel circuit 10 of the display panel 000. The second power signal Vpvee may be a negative power signal. It may be understood that the first terminal 101A of the driving module 101 being electrically connected to the first power signal line 301 may include various ways to achieve electrical connection therebetween. For example, when there is no any other structure between the first terminal 101A of the driving module 101 and the first power signal line 301 in the pixel circuit 10, the first terminal 101A of the driving module 101 may be directly connected to the first power signal line 301 to achieve electrical connection. If there is any other structure between the first terminal 101A of the driving module 101 and the first power signal line 301, such as a first light-emitting control module connected to the first terminal 101A of the driving module 101 (not shown in the Figure), in the case where the first light-emitting control module is turned on, the first terminal 101A of the driving module 101 may also be electrically connected to the first power signal line 301. The specific structure for the electrical connection between the first terminal 101A of the driving module 101 and the first power signal line 301 may not be limited by the present disclosure, which may be determined based on the actual design structure of the pixel circuit in the specific implementation.

In one embodiment, the second terminal 101B of the driving module 101 may be connected to the second power signal line 302. If the pixel circuit also includes a second light-emitting control module (not shown in the Figure) connected to the second terminal 101B of the driving module 101 in the pixel circuit 10, in the case where the second light-emitting control module is turned on, the second terminal 101B of the driving module 101 may be electrically connected to the light-emitting element 20 and the second power signal line 302. When the pixel circuit 10 drives the light-emitting element 20 electrically connected thereto to emit light, the driving module 101 may generate the driving current that drives the light-emitting element 20 to emit light through a conductive path between the first power signal line 301, the light-emitting element 20, and the second power signal line 302, thereby achieving the light-emitting effect of the light-emitting element 20.

Figure 3:
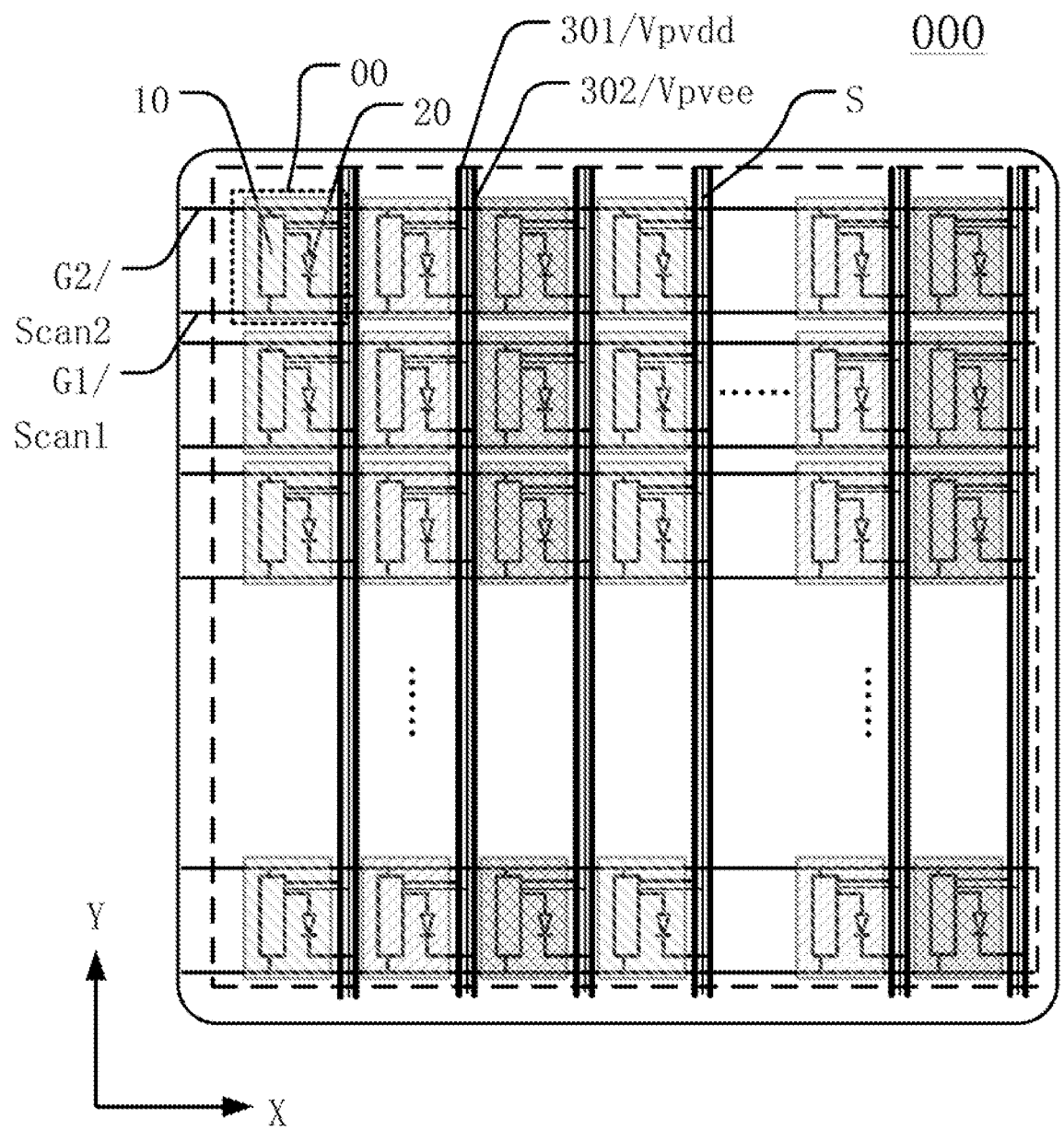
FIG. 3 illustrates a schematic diagram of a planar structure of another exemplary display panel consistent with disclosed embodiments of the present disclosure.
Figure 4:
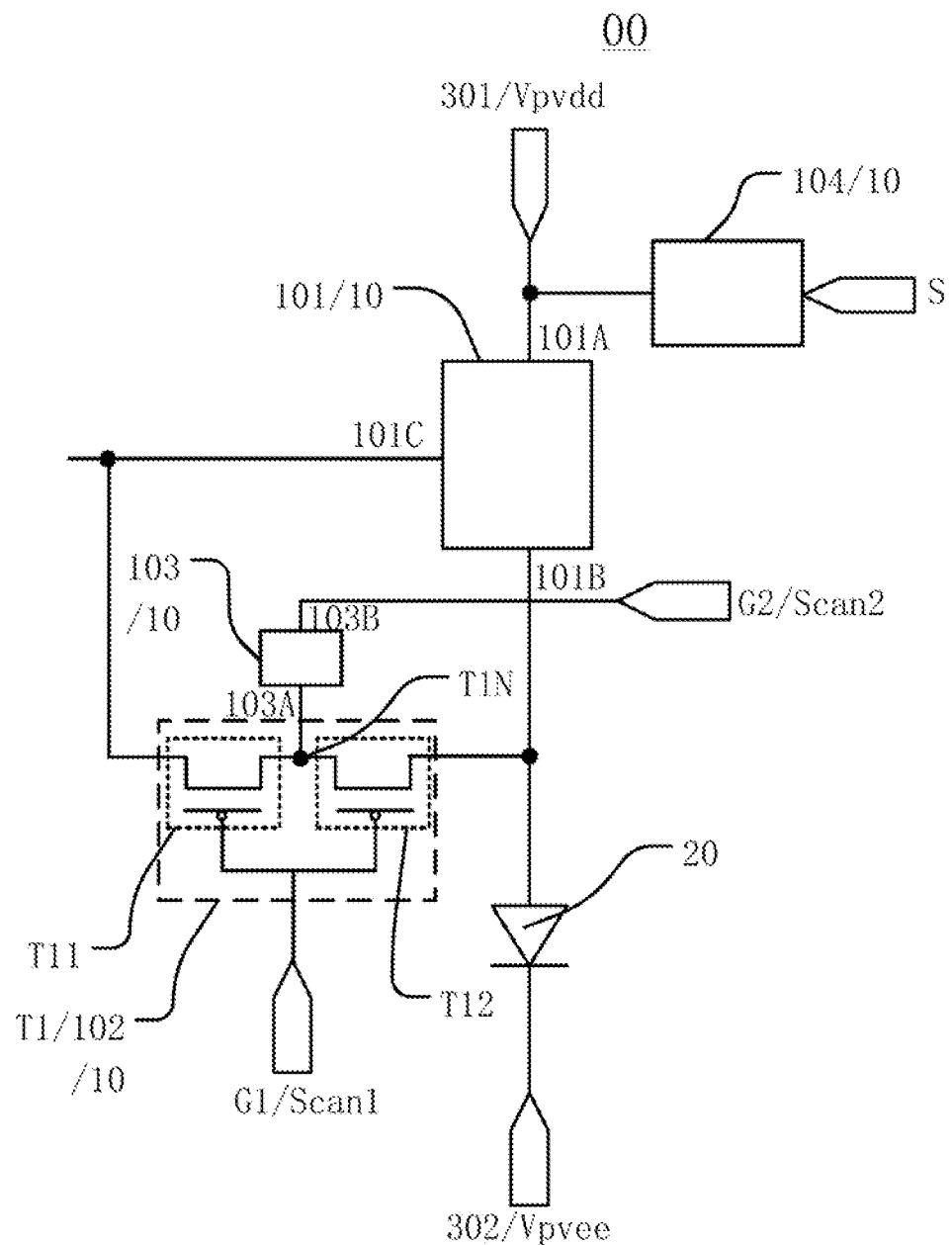
FIG. 4 illustrates a schematic diagram of a circuit connection structure of a sub-pixel in the display panel in FIG. 3 consistent with disclosed embodiments of the present disclosure.

FIG. 3 illustrates another schematic diagram of the planar structure of the display panel consistent with various disclosed embodiments, and FIG. 4 illustrates a schematic diagram of the circuit connection structure of the sub-pixel in FIG. 3. It should be noted that transparent filling is applied to FIG. 3 for clarity of the structure in the present disclosure. In one embodiment, as shown in FIG. 3 and FIG. 4, the pixel circuit 10 may also include a data-writing module 104. A first terminal of the data-writing module 104 may be connected to the first terminal 101A of the driving module 101, and a second terminal of the data-writing module 104 may be connected to a data line S in the display panel 000, to provide a data voltage signal to the driving module 101 of the pixel circuit 10 through the data line S during the data writing stage. The data voltage signal may be a voltage signal associated with a threshold voltage of the driving module 101.

The disclosed pixel circuit 10 may include a compensation module 102. The compensation module 102 may be understood as a threshold compensation module. The compensation module 102 may connect the control terminal 101C and the second terminal 101B of the driving module 101. The compensation module 102 may be configured to compensate for the threshold voltage of the driving transistor in the driving module 101 when the pixel circuit 10 operates in the data writing and threshold compensation stages. The data-writing module 104, the compensation module 102, and the driving module 101 may be turned on, and the data signal on the data line S may sequentially pass through the data-writing module 104, the driving module 101, and the compensation module 102, and then may be written into the control terminal 101C of the driving module 101, until the voltage difference between the control terminal 101C and the first terminal 101A of the driving module 101 reaches the threshold voltage of the driving transistor in the driving module 101, to realize the threshold compensation of the driving module 101 and ensure that the current flowing from the driving module 101 to the light-emitting element 20 is not affected by the threshold voltage of the driving transistor in the driving module 101. The compensation module 102 may avoid the problem of uneven display caused by the difference in threshold voltages of the driving transistors in the driving module 101 due to the manufacturing process and the threshold voltage drift of the driving transistors in the driving module 101 due to aging.

The light emission of the light-emitting components in an organic light-emitting diode display panel may be controlled by the output current of the pixel circuit. The unstable output current may cause unstable brightness and flickering of the image. The output current of the pixel circuit may be controlled by the driving transistors in the driving module. By controlling the voltage of the gate of the driving transistor (e.g., the control terminal of the driving module), the output current of the drain of the driving transistor (e.g., the second terminal of the driving transistor) may be controlled. The unstable voltage of the control terminal of the driving transistor may cause unstable output current. In existing pixel circuit, a compensation module connected to the control terminal of the driving module in the pixel circuit often includes a switch transistor. If the leakage current of the switch transistor is large, the voltage at the control terminal of the driving module (e.g., the gate voltage of the driving transistor) may be pulled down by a reset signal inputted from the control terminal of the driving module or the voltage of the drain of the driving transistor (e.g., the second terminal of the driving module) when the pixel circuit is in a hold stage, which may cause unstable voltage of the control terminal of the driving module, may make the output current of the pixel circuit unstable, and may cause flickering of the light-emitting elements. To avoid the leakage current phenomenon of the compensation module, in the existing pixel circuit, the switch transistor in the compensation module may be a metal oxide semiconductor transistor, such as an IGZO transistor (IGZO stands for indium gallium zinc oxide). The switch transistor made of the semiconductor material with a small leakage current may avoid the leakage current phenomenon. However, the fabrication of IGZO transistors in a display panel may increase the complexity of the circuit and manufacturing process.

Therefore, in one embodiment, the compensation module 102 may include the first dual gate transistor T1. The first electrode of the first dual gate transistor T1 may be electrically connected to the control terminal 101C of the driving module 101, and the second electrode of the first dual gate transistor T1 may be electrically connected to the second terminal 101B of the driving module 101. The gate of the first dual gate transistor T1 may be connected to the first scan line G1, and the first scan line G1 may provide the first scan signal Scan1. Depending on the type of the first dual gate transistor T1, the turn-on and turn-off of the first dual gate transistor T1 may be achieved through the control of the first scan signal Scan1.

It should be understood that for illustrative purposes, the first dual gate transistor T1 in FIG. 2 is a P-type transistor as an example. When the first scan signal Scan1 is a low voltage signal, the first dual gate transistor T1 may be turned on, and there is conduction between the first electrode and the second electrode of the first dual gate transistor T1, in other words, there is conduction between the control terminal 101C and the second terminal 101B of the driving module 101, to achieve threshold compensation. When the first scan signal Scan1 is a high voltage signal, the first dual gate transistor T1 may be turned off, there is no conduction between the control terminal 101C and the second terminal 101B of the driving module 101, and the pixel circuit 10 may operate in any other non-threshold compensation stage.

In the present disclosure, by changing the switch transistor in the compensation module 102 from a single gate structure to a dual gate structure, because the leakage current in the dual gate transistor is far smaller than the leakage current in the single gate structure, the first dual gate transistor T1 in the compensation module 102 may improve the leakage current characteristic of the switch transistor in the compensation module 102. When the pixel circuit drives the light-emitting element 20 to emit light, the voltage at the control terminal 101C of the driving module 101 may be kept as stable as possible.

Although the compensation module 102 using a switch transistor with a double-gate structure is capable of improving the leakage current characteristics of the pixel circuit, a small amount of leakage current may be still inevitable. Taking the first double-gate transistor T1 is a P-type double-gate transistor as an example. After the first double-gate transistor T1 changes from the turned-on state to the turned-off state, in other words, when the gate voltage of the first double-gate transistor T1 changes from a low-level to a high-level, due to the coupling effect of the first double-gate transistor T1, the voltage at the middle node TIN of the first double-gate transistor T1 may be coupled to a high-level. The coupling effect of the transistor may refer to that in the film layer structure of the panel, the transistor may include a coupling capacitor where an active portion and a gate film layer may overlap with each other, and a gate insulation layer may be disposed there-between. Because when the first double-gate transistor T1 is turned off, the high-level of the gate of the first double-gate transistor T1 may be easily coupled to the active portion of the first double-gate transistor T1. The middle node TIN may be understood as the connection portion of the two sub-transistors in the first double-gate transistor T1. Because the leakage current characteristics of the first double-gate transistor T1 are improved but inevitably still exist, the high-level at the middle node TIN may affect the voltage at the control terminal 101C of the driving module 101 due to the leakage current characteristics of a first sub-transistor of the first double-gate transistor T1. Therefore, the data voltage signal which is stably written to the control terminal 101C of the driving module 101 through the data-writing module 104 may be unstable, which may cause the luminance of the light-emitting element 20 to be unstable, in other words, the problem of display flicker still exists.

To solve the problem of display flicker in the display panel when the compensation module in the pixel circuit includes the first double-gate transistor, in the present disclosure, the pixel circuit 10 may include the voltage regulation module 103. The first terminal 103A of the voltage regulation module 103 may be electrically connected to the middle node TIN of the first double-gate transistor T1, and the second terminal 103B of the voltage regulation module 103 may be electrically connected to the second scan line G2. The second scan line G2 is used to provide a second scan signal Scan2 to the voltage regulation module 103. By using the second scan signal Scan2 provided by the second scan line G2. The second scan line G2 may be configured to provide the second scan signal Scan2 for the voltage regulation module 103. Through the second scan signal Scan2 provided by the second scan line G2, the coupling potential of the middle node TIN of the first double-gate transistor T1 may be improved, thereby compensating the potential of the middle node TIN of the first double-gate transistor T1, and further reducing the leakage current of the first double-gate transistor T1 to the control terminal 101C of the driving module 101.

Specifically, in the present disclosure, the first double-gate transistor T1 is a P-type transistor as an example. After the first double-gate transistor T1 changes from the turned-on state to the turned-off state, in other words, when the gate voltage of the first double-gate transistor T1 changes from a low-level to a high-level, due to the coupling effect of the first double-gate transistor T1, the voltage at the middle node TIN of the first double-gate transistor T1 may be coupled to a high-level. The first double-gate transistor T1 may be understood as two sub-transistors connected in series, and the gates of the two sub-transistors may be connected to the same first scan signal Scan1. The middle node TIN may be understood as the connection portion of the two sub-transistors in the first double-gate transistor T1. However, because the first terminal 103A of the voltage regulation module 103 is electrically connected to the middle node TIN of the first double-gate transistor T1, and the second terminal 103B of the voltage regulation module 103 is connected to the second scan line G2, a phase of the second scan signal Scan2 may be opposite to a phase of the first scan signal Scan1. In other words, when the first scan signal Scan1 is at a high-level that controls turned-off of the first double-gate transistor T1, the second scan signal Scan2 may be at a low-level.

By using the second scan signal Scan2 at a low-level, the high potential signal coupled to the middle node TIN of the first double-gate transistor T1 may be pulled down. In other words, the middle node TIN of the first double-gate transistor T1 may be kept at a low-level, to eliminate the coupling high voltage generated by the coupling effect of the transistor. Therefore, the voltage at the middle node TIN of the first double-gate transistor T1 may change as little as possible when the first double-gate transistor T1 is switched on and off. The degree of voltage change at the middle node TIN of the first double-gate transistor T1 may be reduced, and the voltage of the middle node TIN of the first double-gate transistor T1 may be maintained at the potential when the first double-gate transistor T1 is turned on. Even if the leakage current characteristics of the first sub-transistor of the first double-gate transistor T1 inevitably exist, after the potential at the middle node TIN is transmitted to the control terminal 101C of the driving module 101, the stability of the control terminal 101C of the driving module 101 may not be affected. Then, the voltage at the control terminal 101C of the driving module 101 may tend to be stable (such stable voltage value may be understood as the data voltage signal stably written by the data-writing module 104), thereby making the luminous intensity of the light-emitting element 20 stable, improving the overall stability of the display brightness of the display panel 000, and facilitating to improve the display quality.

It should be understood that in one embodiment, the first double-gate transistor T1 is a P-type transistor as an example. In another embodiment, the first double-gate transistor T1 is an N-type transistor as an example. After the first double-gate transistor T1 changes from the turned-on state to the turned-off state, in other words, after the gate voltage of the first double-gate transistor T1 changes from a high-level to a low-level, due to the coupling effect of the first double-gate transistor T1, the voltage at the middle node TIN of the first double-gate transistor T1 may be coupled to a low-level. The first double-gate transistor T1 may be understood as two sub-transistors connected in series, and the gates of the two sub-transistors may be connected to the same first scan signal Scan1. The middle node TIN may be understood as the connection portion of the two sub-transistors in the first double-gate transistor T1. However, because the first terminal 103A of the voltage regulation module 103 is electrically connected to the middle node TIN of the first double-gate transistor T1, and the second terminal 103B of the voltage regulation module 103 is connected to the second scan line G2, a phase of the second scan signal Scan2 may be opposite to a phase of the first scan signal Scan1. In other words, when the first scan signal Scan1 is at a low-level that controls turned-off of the first double-gate transistor T1, the second scan signal Scan2 may be at a high-level.

By using the second scan signal Scan2 at a high-level, the low potential signal coupled to the middle node TIN of the first double-gate transistor T1 may be pulled up. In other words, the middle node TIN of the first double-gate transistor T1 may be kept at a high-level, to eliminate the coupling low voltage generated by the coupling effect of the transistor. Therefore, the voltage at the middle node TIN of the first double-gate transistor T1 may change as little as possible when the first double-gate transistor T1 is switched on and off, and may be maintained at the potential when the first double-gate transistor T1 is turned on. Then, the voltage at the control terminal 101C of the driving module 101 may tend to be stable (such stable voltage value may be understood as the data voltage signal stably written by the data-writing module 104), thereby making the luminous intensity of the light-emitting element 20 stable, improving the overall stability of the display brightness of the display panel 000, and facilitating to improve the display quality.

A specific type of the first double-gate transistor T1 may not be limited by the present disclosure, as long as the phase of the second scan signal Scan2 is opposite to the phase of the first scan signal Scan1, which may be capable of maintaining the stable potential of the control terminal 101C of the driving module 101. It should be noted that in one embodiment, the phase of the second scan signal Scan2 may be opposite to the phase of the first scan signal Scan1. In other words, when the first scan signal Scan1 is at a high-level, the second scan signal Scan2 may be at a low-level, and when the first scan signal Scan1 is at a low-level, the second scan signal Scan2 may be at a high-level. Compared with using a stable fixed potential signal for the second scan signal Scan2, the second scan signal Scan2 with the phase opposite to the phase of the first scan signal Scan1 may reversely pull down or pull up the coupling voltage of the middle node TIN of the first double-gate transistor T1, thereby minimizing coupling fluctuations. In other words, by using the voltage regulation module 103 to reversely pull down or pull up the potential of the middle node TIN of the first double-gate transistor T1, the potential of the control terminal 101C of the driving module 101 may be better stabilized, and the problem of screen flickering may be improved.

It should be understood that the disclosed embodiments may merely exemplify the electrical connection structure of the pixel circuit 10 of each sub-pixel 00 in the display panel 000. In practical applications, the pixel circuit 10 may include any other structure, such as a reset module for resetting or a light-emitting control module for controlling the light emission of the light-emitting element 20, etc. These structures may not be described in detail in the present disclosure, and may be understood by referring to the circuit structure of the existing organic light-emitting diode display panel.

It should be understood that when the display panel 000 is an organic light-emitting diode display panel, the layout of signal lines in the display panel 000 may be substantially complex. In addition to the data line S, the first scan line G1, the second scan line G2, the first power signal line 301, and the second power signal line 302 shown in FIG. 1, the display panel 000 may also include any other signal line such as a reference voltage line (not shown in the Figure). One sub-pixel row may correspond to multiple scan lines. In specific implementation, the layout structure of the signal routing may be understood based on the practical applications.

It should be noted that the display panel 000 in the present disclosure may be an organic light-emitting diode display panel. The structure of the display panel 000 shown in the Figure may merely be an illustrative example, and the actual structure of the display panel 000 may not be limited to this, and may include any other structure that is capable of achieving display functions. The structure of the organic light-emitting diode display panel may be understood by referring to the relevant technology, which may not be repeated herein.

In one embodiment, the first double-gate transistor T1 may include the first sub-transistor T11 and the second sub-transistor T12 that are connected in series. The first electrode of the first sub-transistor T11 may be electrically connected to the control terminal 101C of the driving module 101, the second electrode of the first sub-transistor T11 may be electrically connected to the first electrode of the second sub-transistor T12, and the second electrode of the second sub-transistor T12 may be electrically connected to the second terminal 101B of the driving module 101. Both the gate of the first sub-transistor T11 and the gate of the second sub-transistor T12 may be connected to the first scan line G1. The middle node TIN may be the connection portion of the second electrode of the first sub-transistor T11 and the first electrode of the second sub-transistor T12.

The disclosed embodiments explain that the structure of the first double-gate transistor T1 in the compensation module 102 may be understood as a structure consisting of two sub-transistors connected in series. Specifically, the first double-gate transistor T1 may include the first sub-transistor T11 and the second sub-transistor T12 that are connected in series. The first electrode of the first sub-transistor T11 may serve as the first terminal of the compensation module 102 and may be electrically connected to the control terminal 101C of the driving module 101. The second electrode of the second sub-transistor T12 may serve as the second terminal of the compensation module 102 and may be electrically connected to the second terminal 101B of the driving module 101. The second electrode of the first sub-transistor T11 may be electrically connected to the first electrode of the second sub-transistor T12, to achieve the connection of the two sub-transistors in series. Both the gate of the first sub-transistor T11 and the gate of the second sub-transistor T12 may be connected to the first scan line G1. In other words, the gate of the first sub-transistor T11 and the gate of the second sub-transistor T12 may be connected to the same first scan line G1, and may be provided with the same first scan signal Scan1. The connection portion of the second electrode of the first sub-transistor T11 and the first electrode of the second sub-transistor T12 may be understood as the middle node TIN of the first double-gate transistor T1.

In the film layer structure of the display panel 000, the active portion of the first sub-transistor T11 and the active portion of the second sub-transistor T12 may together form the active portion of the first double-gate transistor T1. When the active portion is a semiconductor, the active portion of the first sub-transistor T11 may include a channel region, and a source region and a drain region that are located on both sides of the channel region. The active portion of the second sub-transistor T12 may also include a channel region, and a source region and a drain region that are located on both sides of the channel region. The portion that connects the channel region of the first sub-transistor T11 and the channel region of the second sub-transistor T12 may be understood as the middle node TIN of the first double-gate transistor T1. The channel region may be understood as the region where the gate of the transistor overlaps with the active portion.

It should be noted that the location and structure of the middle node TIN of the first double-gate transistor T1 in the film layer structure of the display panel may not be repeated herein, which may be set according to the layout of the panel and may not be limited by the present disclosure.

Figure 5:
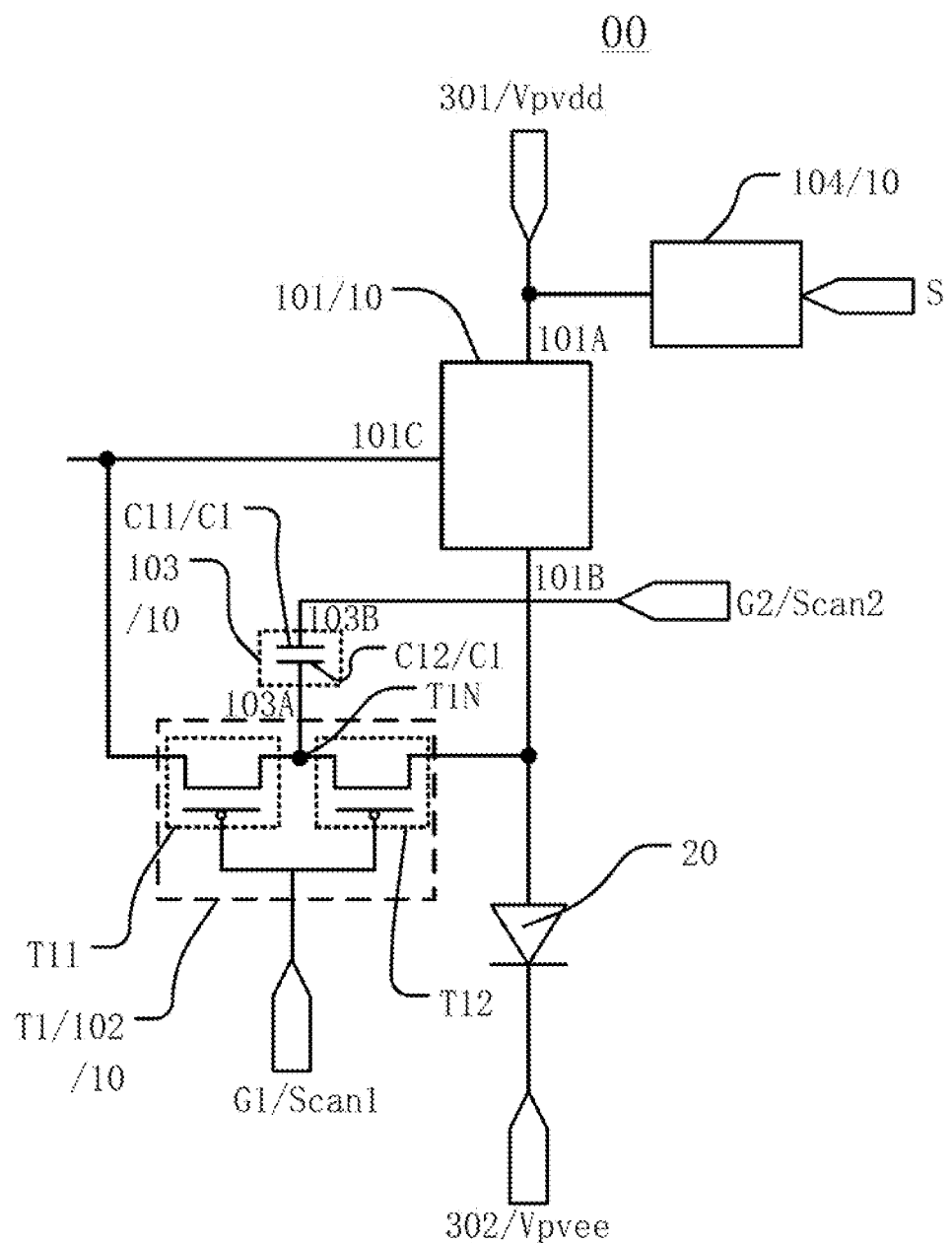
FIG. 5 illustrates a schematic diagram of another circuit connection structure of a sub-pixel in the display panel in FIG. 3 consistent with disclosed embodiments of the present disclosure.

FIG. 5 illustrates a schematic diagram of another circuit connection structure of a sub-pixel in the display panel in FIG. 3. In certain embodiments, referring to FIG. 3 and FIG. 5, the voltage regulation module 103 may include a voltage regulation capacitor C1. The voltage regulation capacitor C1 may include a first electrode portion C11 and a second electrode portion C12. The first electrode portion C11 may be electrically connected to the second scan line G2, and the second electrode portion C12 may be electrically connected to the middle node TIN.

The disclosed embodiments may explain that the voltage regulation module 103 connected to the middle node TIN of the first double-gate transistor T1 may include the voltage regulation capacitor C1. The capacitance structure may have a coupling potential effect. By connecting the first electrode portion C11 of the voltage regulation capacitor C1 to the second scan line G2 and connecting the second electrode portion C12 of the voltage regulation capacitor C1 to the middle node TIN, the second scan signal Scan2 provided by the second scan line G2 may pull down the potential on the first electrode portion C11. The coupling potential effect of the capacitance structure may also pull down the potential on the second electrode portion C12. Therefore, the potential at the middle node TIN of the first double-gate transistor T1 may be reversely pulled down to eliminate the high potential of the middle node TIN originally coupled to the high potential of the first scan signal Scan1. By designing the voltage regulation module 103 as a voltage regulation capacitor C1 with a coupling potential effect, the voltage at the control terminal 101C of the driving module 101 may be stabilized through a simple panel structure, thereby improving the display quality by maintaining the brightness of the light-emitting element 20.

Figure 6:
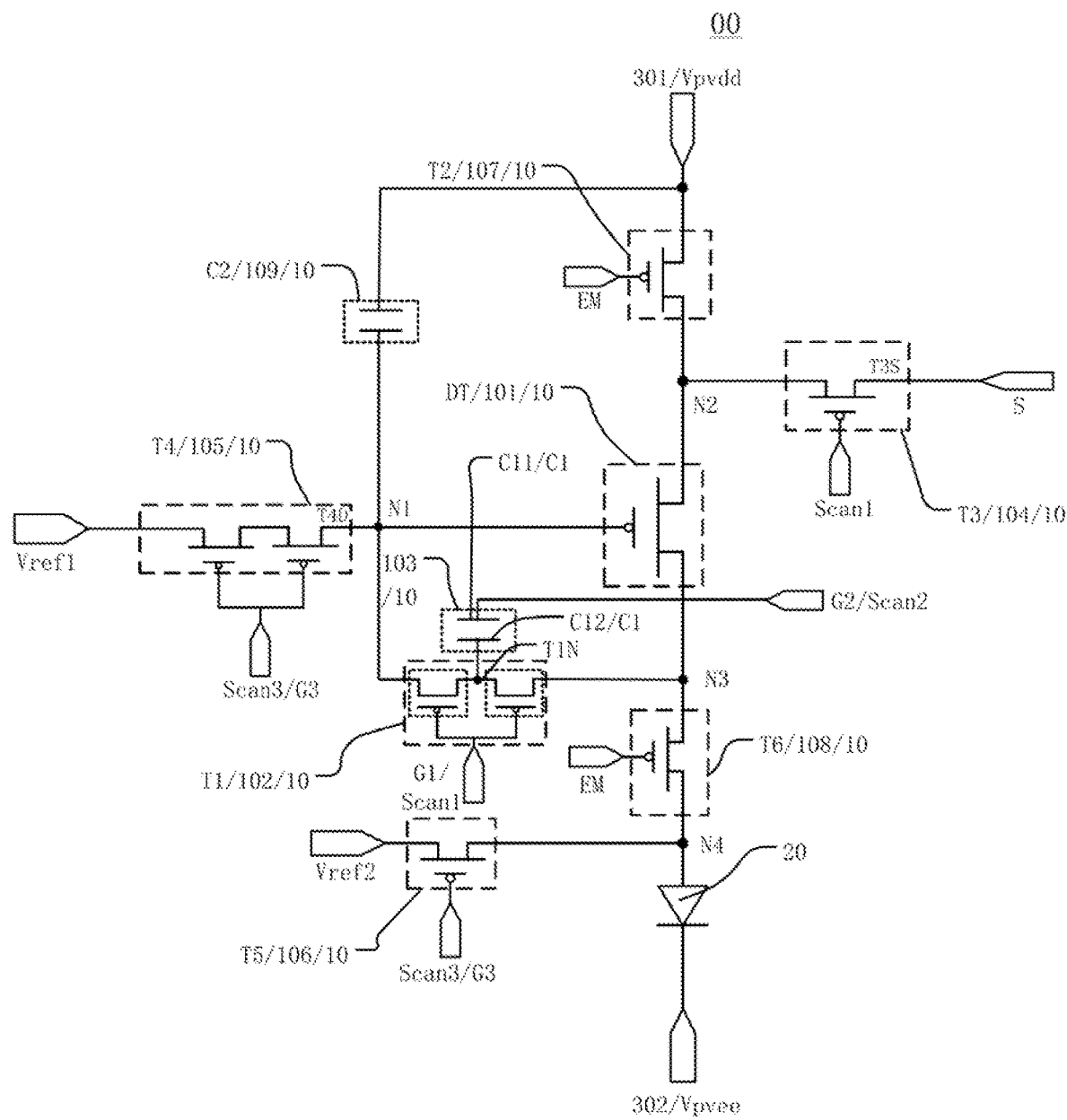
FIG. 6 illustrates a schematic diagram of another circuit connection structure of a sub-pixel in the display panel in FIG. 3 consistent with disclosed embodiments of the present disclosure.
Figure 7:
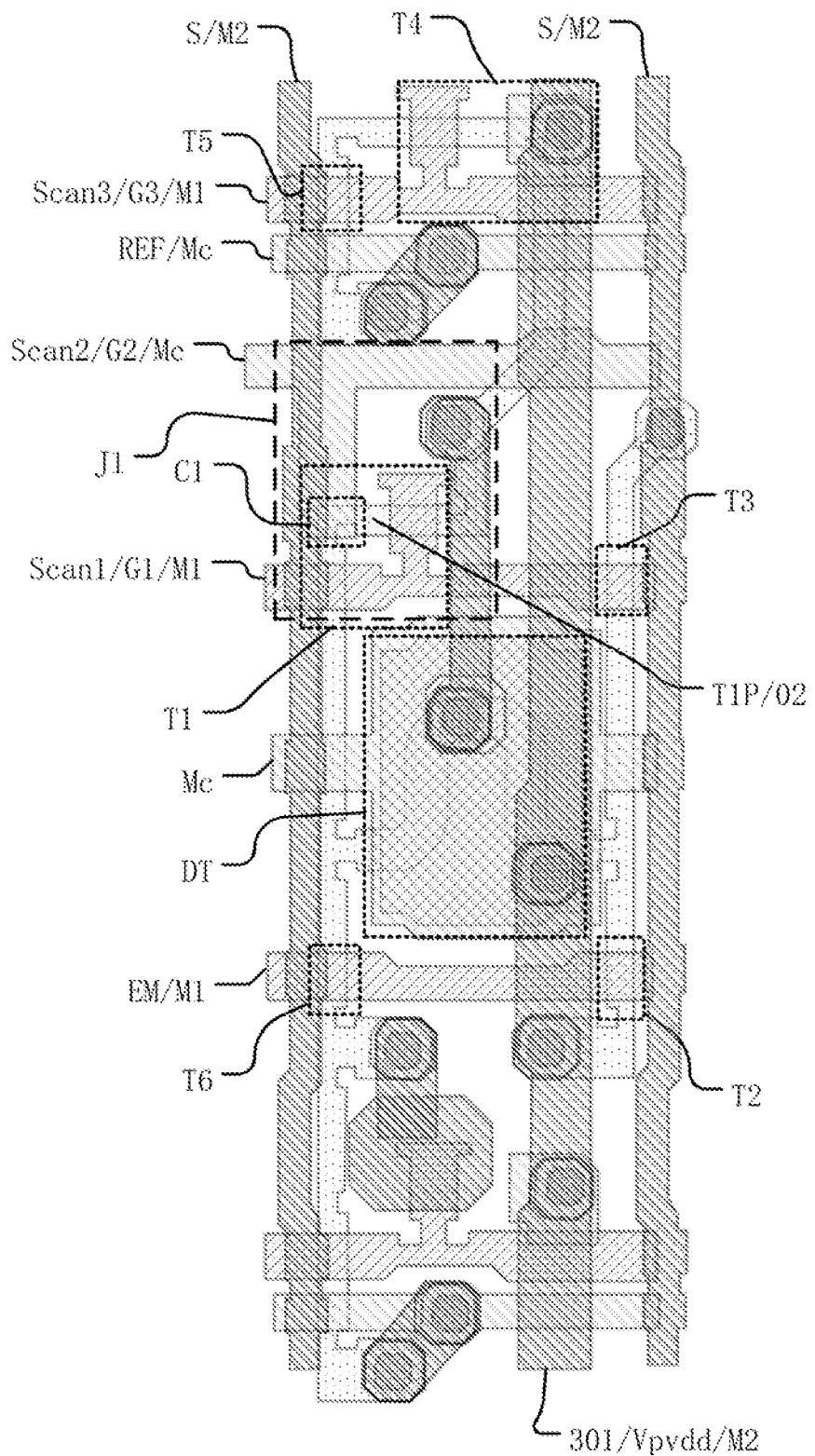
FIG. 7 illustrates a layout structure of the circuit connection structure in FIG. 6 fabricated on a substrate of the display panel consistent with disclosed embodiments of the present disclosure.
Figure 8:
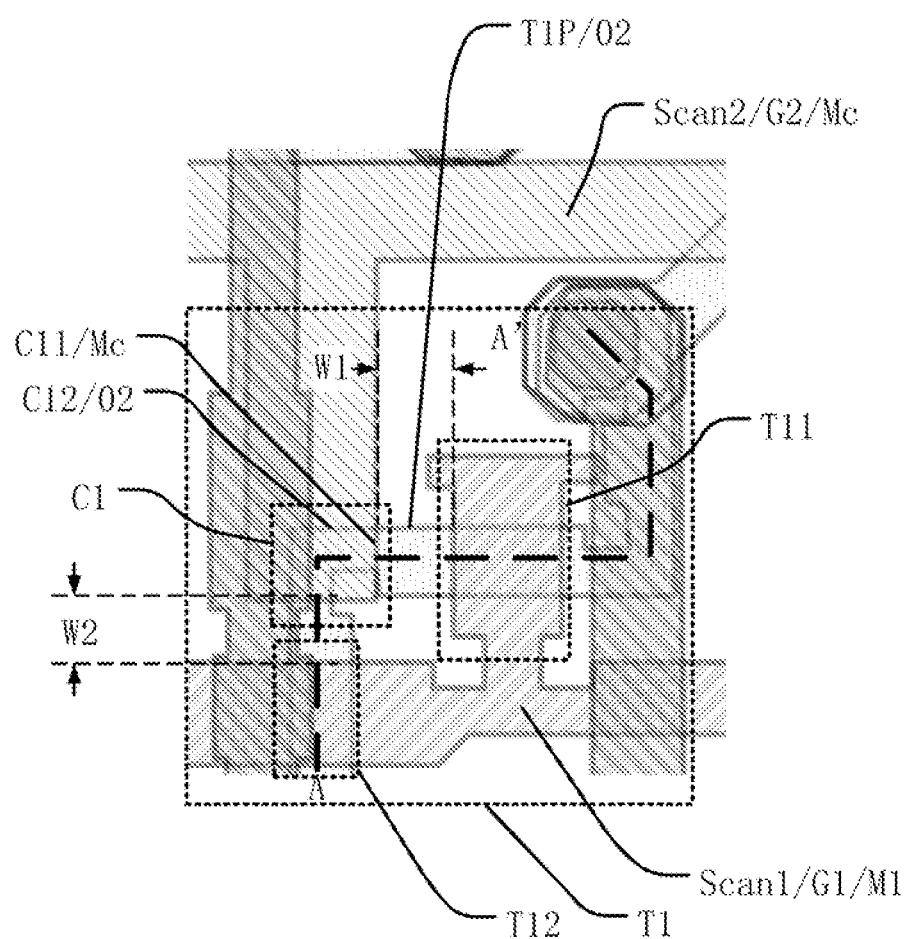
FIG. 8 illustrates a local zoom-in view of a region J1 in FIG. 7.

FIG. 6 illustrates a schematic diagram of another circuit connection structure of a sub-pixel in the display panel in FIG. 3; FIG. 7 illustrates a layout structure of the circuit connection structure in FIG. 6 fabricated on a substrate of the display panel; and FIG. 8 illustrates a local zoom-in view of a region J1 in FIG. 7. It should be noted that transparent filling is applied to FIGS. 7-8 for clarity of the structure in the present disclosure. In certain embodiments, referring to FIG. 3 and FIGS. 6-8, the display panel 000 may at least include a substrate 01 and an active layer 02 located on a side of the substrate 01. The active layer 02 may include the active portion TIP of the first double-gate transistor T1.

In the direction perpendicular to the plane of the substrate 01, the first electrode portion C11 may at least partially overlap with the active portion TIP of the first double-gate transistor T1, and at least a portion of the active portion TIP of the first double-gate transistor T1 may be multiplexed as the second electrode portion C12.

The disclosed embodiments may explain that when the pixel circuit 10 in the display panel 000 is fabricated on the substrate 01, at least the active layer 02 may be located on a side of the substrate 01. Alternatively, any other metal layers such as a gate metal layer M1, a capacitor metal layer Mc, and a second metal layer M2 may be located on a side of the substrate 01. The active layer 02 may be configured to fabricate the active portion TIP of the first double-gate transistor T1, and may also be configured to fabricate the active portions of other transistor structures in the display panel. The active layer 02 may directly form the source electrode and drain electrode of the first double-gate transistor T1. The active layer 02 may be made of a material including polysilicon or metal oxide semiconductor. For illustrative purposes, the active layer 02 may be made of a polysilicon semiconductor as an example.

Optionally, the gate of the first double-gate transistor T1 and the first scan line G1, or the gate of any other transistor, may be made from the gate metal layer M1. The data line S or the first power signal line 301 may be made from the second metal layer M2. Alternatively, the second metal layer M2 may also be configured to form the overlap portion. The overlap portion may be configured to electrically connect the source and drain electrodes of the first double-gate transistor T1 formed by the active layer 02 with the signal lines of other film layers. The capacitor metal layer Mc may be configured to form one of the electrode plates of the capacitor structure in the pixel circuit 10, or may be configured to form the reference voltage signal line in the display panel. The film layer structure may not be limited by the present disclosure, and may be understood by referring to the film layer structure of the existing display panel.

FIGS. 6-7 illustrate an example of a pixel circuit 10 with electrically connected 7T1C (including the first double-gate transistor T1, the second transistor T2, the third transistor T3, the fourth transistor T4, the fifth transistor T5, the sixth transistor T6, the driving transistor DT, and one storage capacitor C2) and the voltage regulation capacitor C1. In other words, the electrical connection structure of the pixel circuit 10 and the light-emitting element 20 shown in FIG. 7 may include seven transistors, one storage capacitor (similar to the pixel circuit structure of the 7T1C in the relevant technology), and one voltage regulation capacitor C1. The specific connection structure of the pixel circuit in the present disclosure may not be described in detail and may be understood by referring to FIGS. 6-7 and the structure description in the relevant technology. In one embodiment, one electrode plate of the storage capacitor C2 in the pixel circuit 10 may be disposed on the gate metal layer M1, and the other electrode plate of the storage capacitor C2 may be disposed on the capacitor metal layer Mc. Alternatively, other metal film layers may be selected to dispose the two electrode plates of the storage capacitor C2, which may not be repeated herein.

When the disclosed pixel circuit 10 is operating, the fourth transistor T4 and the fifth transistor T5 may be turned on under the control of the third scan signal Scan3 provided by the third scan line G3 (not shown in FIG. 3). In the reset stage, the reset signal on the reference voltage line REF (not shown in FIG. 3) may be transmitted to the gate of the driving transistor DT and the anode of the light-emitting element 20 to reset the gate of the driving transistor DT and the anode of the light-emitting element 20. The third transistor T3 and the first double-gate transistor T1 may be turned on under the control of the first scan signal Scan1 provided by the first scan line G1, to sequentially transmit the data signal provided by the data line S through the third transistor T3 of the data-writing module 104, the driving transistor DT of the driving module 101, and the first double-gate transistor T1 of the compensation module 102 to the gate of the driving transistor DT during the data writing and threshold compensation stages. The second transistor T2 and the sixth transistor T6 may be turned on under the control of the light-emitting control signal provided by the light-emitting signal line EM (not shown in FIG. 3), to form a conductive path between the first power signal line 301 and the second power signal line 302 in the light-emitting stage, and the driving transistor DT may output a driving current to drive the light-emitting element 20 to emit light.

Optionally, to improve the leakage current characteristics of the fourth transistor T4 and maintain the voltage stability of the gate of the driving transistor DT, the fourth transistor T4 may also be a double-gate transistor. The reference voltage line REF may also be made from the capacitor metal layer Mc, and the third scan line G3 and the light-emitting signal line EM may also be made from the gate metal layer M1. The voltage regulation capacitor C1 may be configured to stabilize the gate potential of the driving transistor DT when the pixel circuit 10 is operating in a hold stage.

Therefore, when the first double-gate transistor T1 is turned off and the potential of the middle node TIN is coupled to a high potential by the gate of the first double-gate transistor T1, the potential of the middle node TIN may be pulled-down by the low-level of the second scan signal Scan2. Even if the first double-gate transistor T1 has a leakage current, the degree of change in the gate potential of the driving transistor DT may be reduced, which may facilitate to improve the stability of data writing in the hold stage and solve the problem of flickering of the display screen.

It should be understood that the electrical connection structure of the pixel circuit 10 in the display panel 000 may include but may not be limited to the structures described above, and may also include other electrical connection structures, which may not be limited by the present disclosure. The disclosed embodiments may be merely used as an example to illustrate the relationship between the various film layers of the display panel 000.

Figure 9:
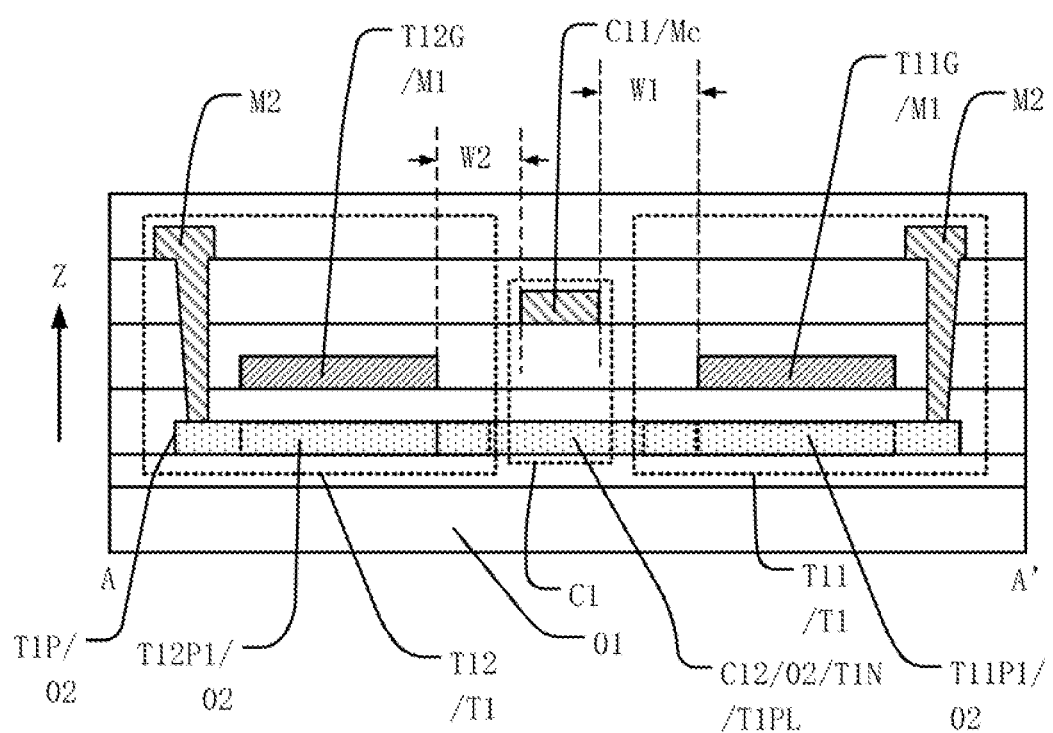
FIG. 9 illustrates an AA'-sectional view of the display panel in FIG. 8.

In one embodiment, the active layer 02 may include the active portion TIP of the first double-gate transistor T1. FIG. 9 illustrates an AA'-sectional view of the display panel in FIG. 8, which may also be understood as a film layer structure diagram of the first double-gate transistor formed on the substrate. It should be understood that as shown in FIGS. 5-9, the active portion TIP of the first double-gate transistor T1 may at least include a first sub-channel portion T11P1, a second sub-channel portion T12P1, and a channel connection portion T1PL. The first sub-channel portion T11P1 and the second sub-channel portion T12P1 may be connected by the channel connection portion T1PL, and the channel connection portion T1PL may include the middle node TIN. The region where the first sub-channel portion T11P1 is located may be understood as a portion of the region where the first gate T11G of the first sub-transistor T11 overlaps with the active portion TIP, and the region where the second sub-channel portion T12P1 is located may be understood as a portion of the region where the second gate T12G of the second sub-transistor T12 overlaps with the active portion TIP.

In the direction Z perpendicular to the plane where the substrate 01 is located, the first electrode portion C11 may at least partially overlap with the channel connection portion T1PL, and the channel connection portion T1PL may be multiplexed as the second electrode portion C12. Specifically, when the first double-gate transistor T1 includes the first sub-transistor T11 and the second sub-transistor T12, the active portion of the first sub-transistor T11 and the active portion of the second sub-transistor T12 may together form the active portion TIP of the first double-gate transistor T1. In the case of semiconductorization of the active portion, the active portion of the first sub-transistor T11 may include the first sub-channel portion T11P1, and the source and drain electrodes located on both sides of the first sub-channel portion T11P1. The active portion of the second sub-transistor T12 may include the second sub-channel portion T12P1 and the source and drain electrodes located on both sides of the second sub-channel portion T12P1. The portion connecting the first sub-channel portion T11P1 of the first sub-transistor T11 and the second sub-channel portion T12P1 of the second sub-transistor T12 may be understood as the channel connection portion T1PL of the first double-gate transistor T1, in other words, the region where the middle node TIN of the first double-gate transistor T1 is located.

In one embodiment, at least part of the active portion TIP of the first double-gate transistor T1 may be multiplexed as the second electrode portion C12. Optionally, in the direction Z perpendicular to the plane where the substrate 01 is located, the first electrode portion C11 may at least partially overlap with the channel connection portion T1PL, and the channel connection portion T1PL may be multiplexed as the second electrode portion C12. In other words, the channel connection portion T1PL (the region where the middle node TIN is located) connecting the first sub-channel portion T11P1 of the first sub-transistor T11 and the second sub-channel portion T12P1 of the second sub-transistor T12, e.g., a portion of the active portion TIP of the first double-gate transistor T1, may be multiplexed as the second electrode portion C12 of the voltage regulation capacitor C1. A portion of the middle node TIN of the first double-gate transistor T1 may be directly used as the second electrode portion C12 of the voltage regulation capacitor C1, without setting up an additional film layer to produce the second electrode portion C12 of the voltage regulation capacitor C1, which may facilitate to reduce the film layer thickness of the panel.

When forming the voltage regulation capacitor C1, the first electrode portion C11 may at least partially overlap with the active portion TIP of the first double-gate transistor T1 in the direction Z perpendicular to the plane where the substrate 01 is located. In other words, the first electrode portion C11 located in the capacitor metal layer Mc may at least partially overlap with the active portion TIP of the first double-gate transistor T1 at the middle node TIN, to form the voltage regulation capacitor C1. When the first double-gate transistor T1 is turned-off, the active portion TIP of the first double-gate transistor T1 may be coupled with a high potential at the gate thereof (including the first gate T11G of the first sub-transistor T11 and the second gate T12G of the second sub-transistor T12), such that the potential of the active portion TIP of the first double-gate transistor T1 may be pulled up. In view of this, the first electrode portion C11 may be connected to the second scan line G2, and the second scan line G2 may provide the second scan signal Scan2 with the low potential opposite to the first scan signal Scan1 provided by the first scan line G1. The second scan signal Scan2 with the low potential may be coupled to the active portion TIP (i.e., the second electrode portion C12) of the first double-gate transistor T1 at the middle node TIN through the first electrode portion C11, thereby pulling down the potential of the active portion TIP of the first double-gate transistor T1. Therefore, even in the case where the first double-gate transistor T1 has a substantially small leakage current, the effect on the potential of the gate of the driving transistor DT may be substantially small, and the degree of potential variation of the gate of the driving transistor DT may be minimized, which may facilitate to avoid the display flicker phenomenon of the panel.

Optionally, as shown in FIG. 3 and FIGS. 5-8, the display panel 000 may further include a plurality of reference voltage lines REF (not shown in FIG. 3, but may be understood with reference to FIG. 7). The reference voltage line REF may be configured to provide a reset signal to the gate of the driving transistor DT and the anode of the light-emitting element 20 when the reset transistors in the pixel circuit, such as the fourth transistor T4 and the fifth transistor T5 illustrated in FIG. 6 are turned on.

The first electrode portion C11 of the voltage regulation capacitor C1 may be disposed in the same layer as the reference voltage line REF. If the reference voltage line REF is made from the capacitor metal layer Mc, the first electrode portion C11 of the voltage regulation capacitor C1 may also be made from the capacitor metal layer Mc. The first electrode portion C11 of the voltage regulation capacitor C1 may be made using the film layers of the display panel 000, and may overlap with a portion of the active portion TIP of the first double-gate transistor T1 serving as the second electrode portion C12. While pulling down the potential of the middle node TIN by the coupling of the voltage regulation capacitor C1, the quantity of film layers in the panel may be reduced, and a thinner panel design may be achieved.

In certain embodiments, referring to FIG. 3 and FIGS. 5-9, the first double-gate transistor T1 may include the first gate T11G and the second gate T12G. In the direction parallel to the plane where the substrate 01 is located, the first electrode portion C11 and the first gate T11G may be spaced apart by a first distance W1, and the first electrode portion C11 and the second gate T12G may be spaced apart by a second distance W2.

In the disclosed embodiments, the first electrode portion C11 of the voltage regulation capacitor C1 used for coupling and pulling down the potential of the middle node TIN in the pixel circuit 10 may not overlap with the gate of the first double-gate transistor T1 in the direction Z perpendicular to the plane where the substrate 01 is located. Specifically, the first double-gate transistor T1 may include the first sub-transistor T11 and the second sub-transistor T12. The first sub-transistor T11 may include the first gate T11G, and the second sub-transistor T12 may include the second gate T12G. Both the first gate T11G and the second gate T12G may be disposed on the gate metal layer M1. In the direction parallel to the plane where the substrate 01 is located, the first electrode portion C11 and the first gate T11G may be spaced apart by the first distance W1, where W1 may be greater than zero. The first electrode portion C11 may not overlap with the first gate T11G in the direction Z perpendicular to the plane where the substrate 01 is located. The first electrode portion C11 and the second gate T12G may be spaced apart by the second distance W2, where W2 may be greater than zero. The first electrode portion C11 may not overlap with the second gate T12G in the direction Z perpendicular to the plane where the substrate 01 is located. Optionally, the values for W1 and W2 may be different, which may be selected based on the specific design of the pixel circuit 10 in the display panel. Therefore, when the first electrode portion C11 is connected to the second scan line G2, the second scan signal Scan2 provided by the second scan line G2 may be prevented from affecting the potentials of the first gate T11G and the second gate T12G. Therefore, the stability of the turned-on state and turned-off state of the first double-gate transistor T1 may be respectively ensured when the first scan line G1 is connected to the first gate T11G and the second gate T12G.

Figure 10:
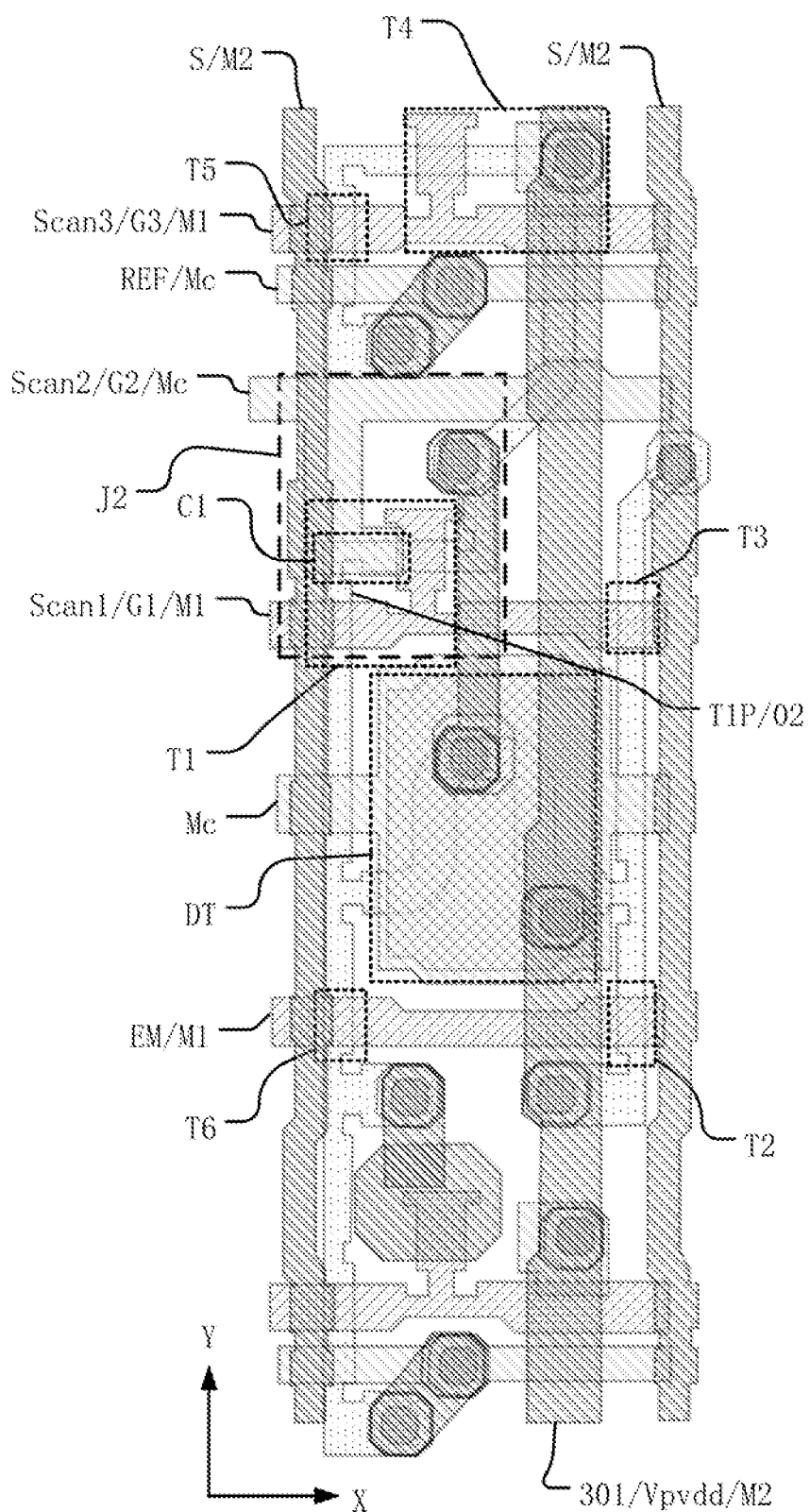
FIG. 10 illustrates another layout structure of the circuit connection structure in FIG. 6 fabricated on a substrate of the display panel consistent with disclosed embodiments of the present disclosure.
Figure 11:
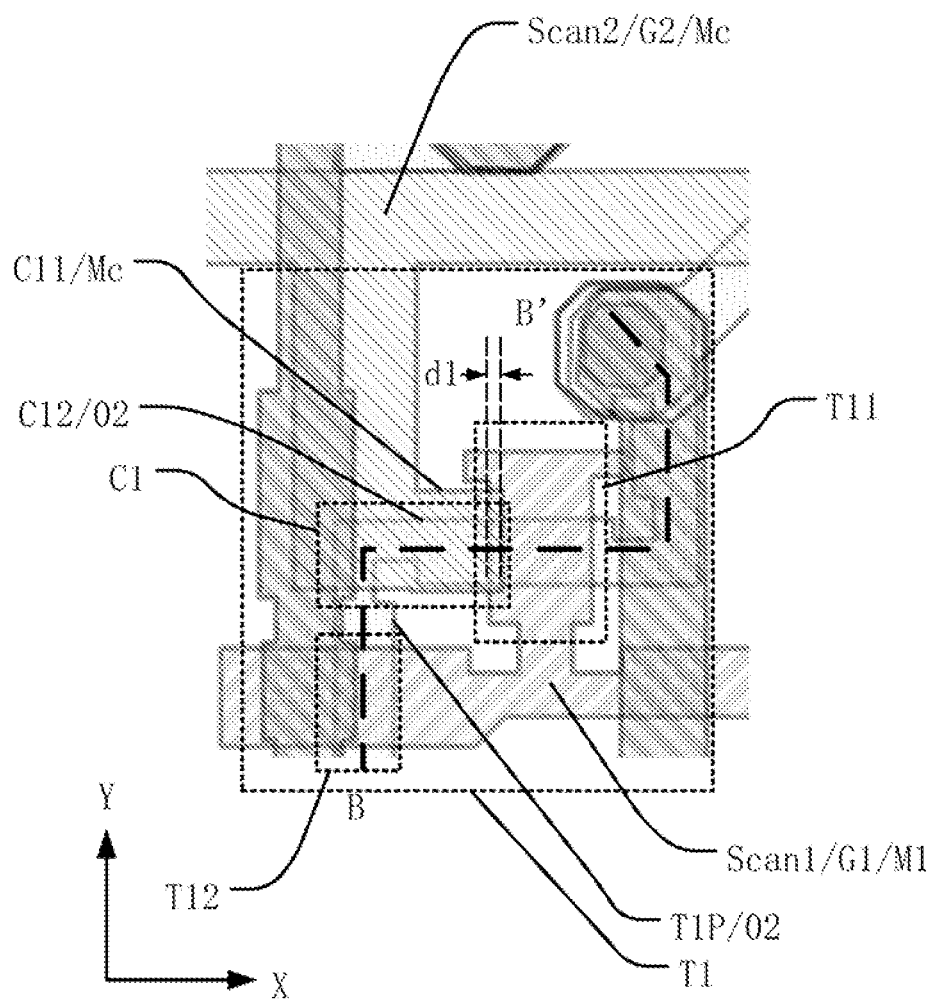
FIG. 11 illustrates a local zoom-in view of a region J2 in FIG. 10.
Figure 12:
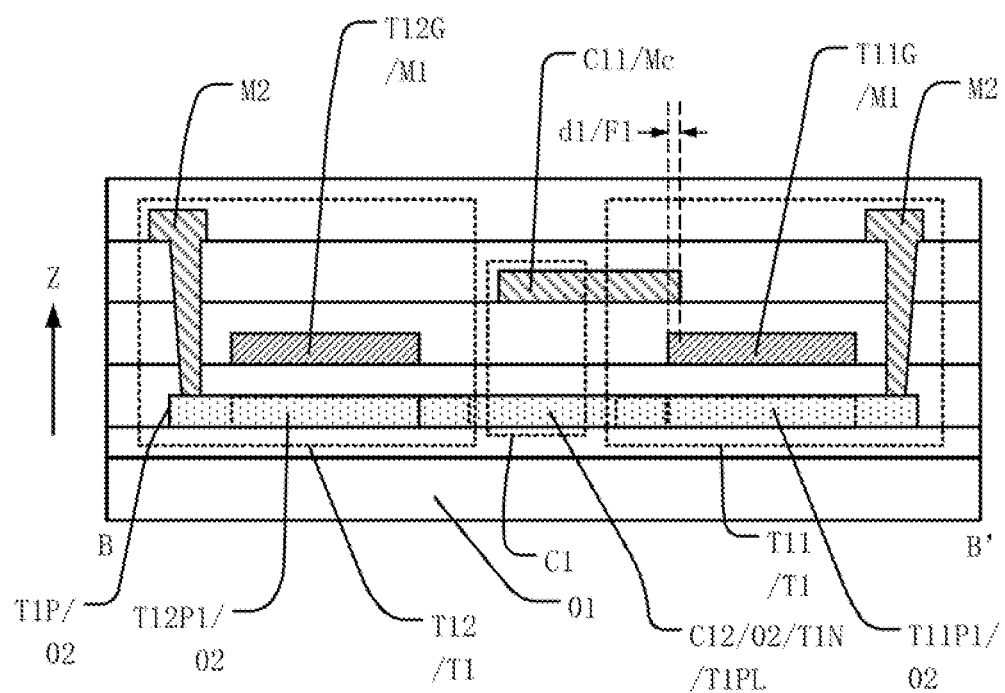
FIG. 12 illustrates a BB'-sectional view of the display panel in FIG. 11.
Figure 13:
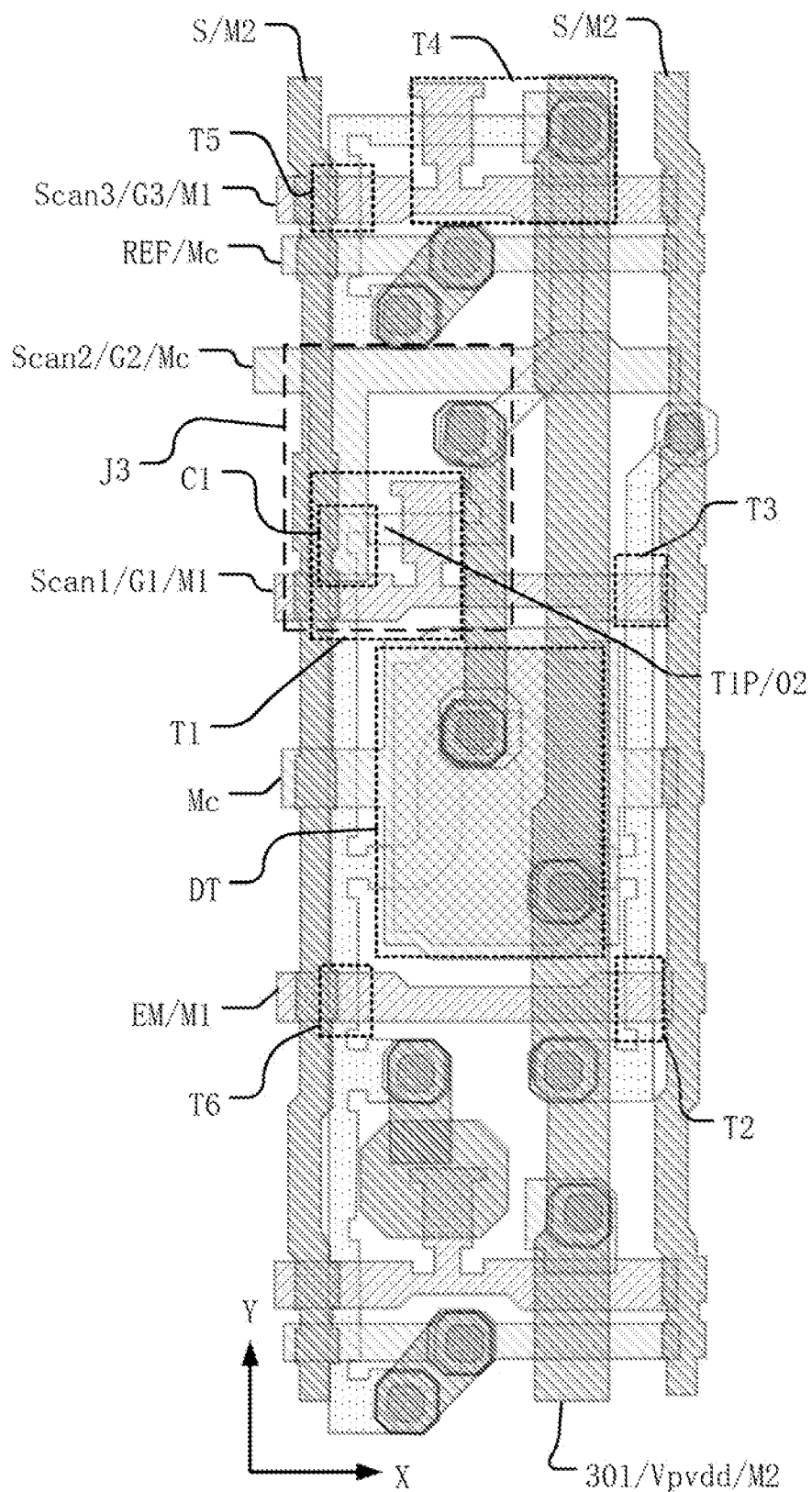
FIG. 13 illustrates another layout structure of the circuit connection structure in FIG. 6 fabricated on a substrate of the display panel consistent with disclosed embodiments of the present disclosure.
Figure 14:
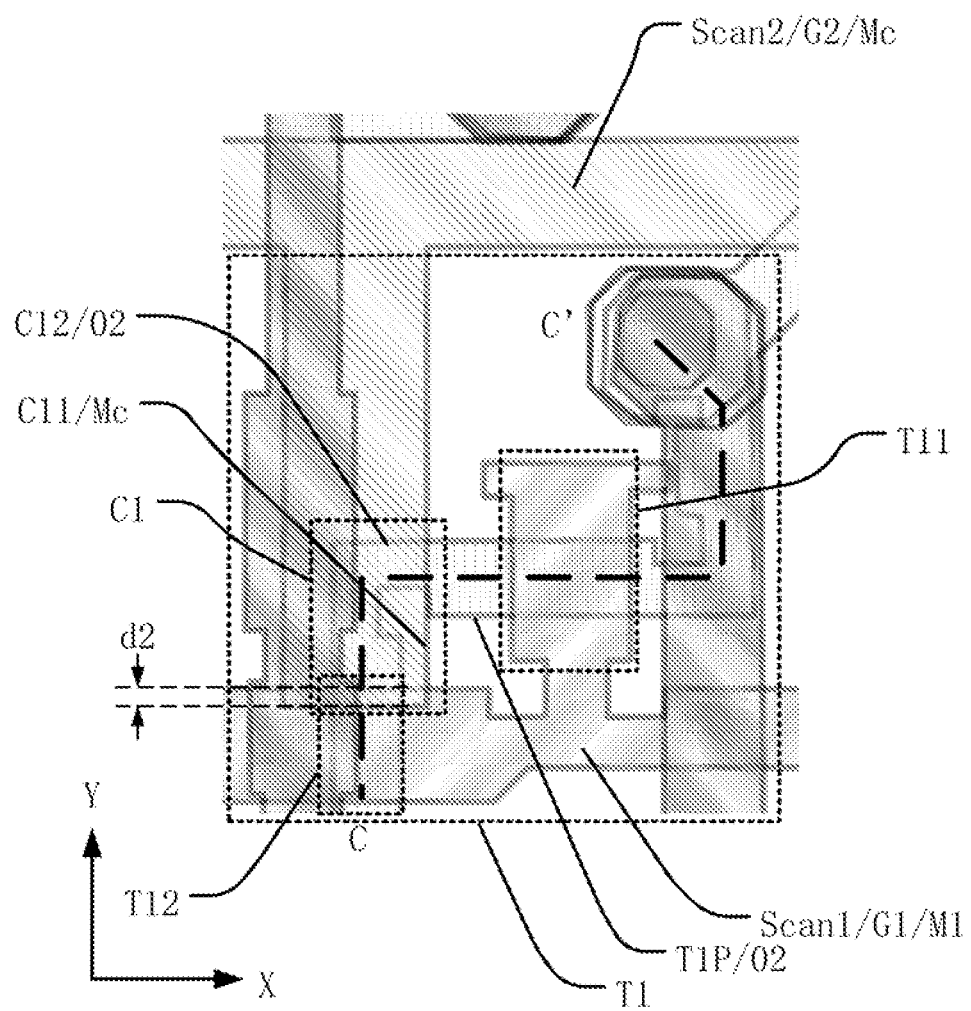
FIG. 14 illustrates a local zoom-in view of a region J3 in FIG. 13.
Figure 15:
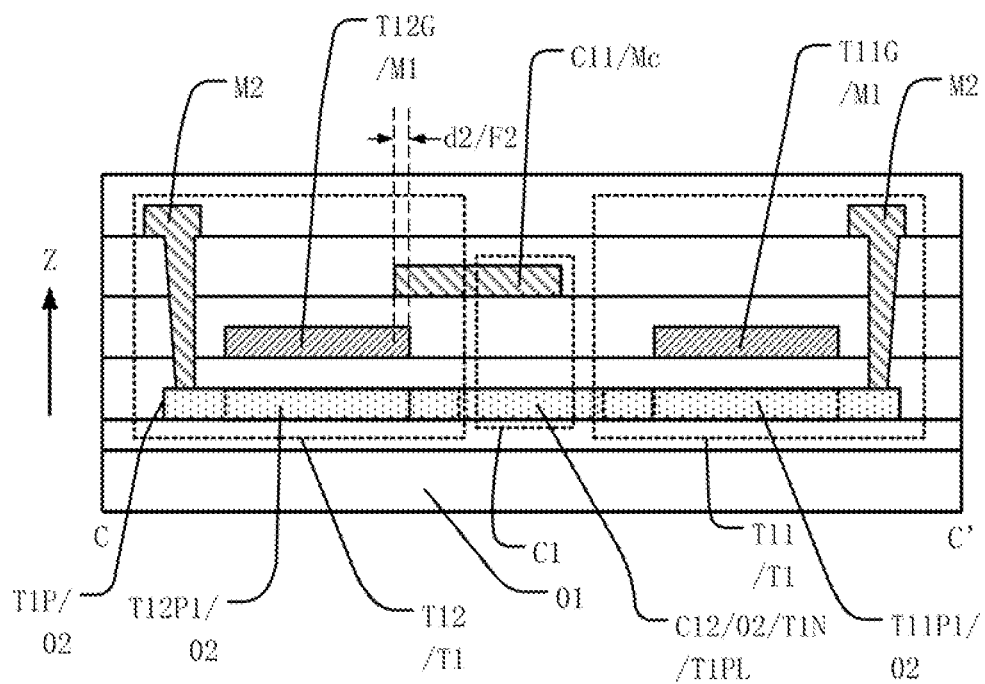
FIG. 15 illustrates a CC'-sectional view of the display panel in FIG. 14.
Figure 16:
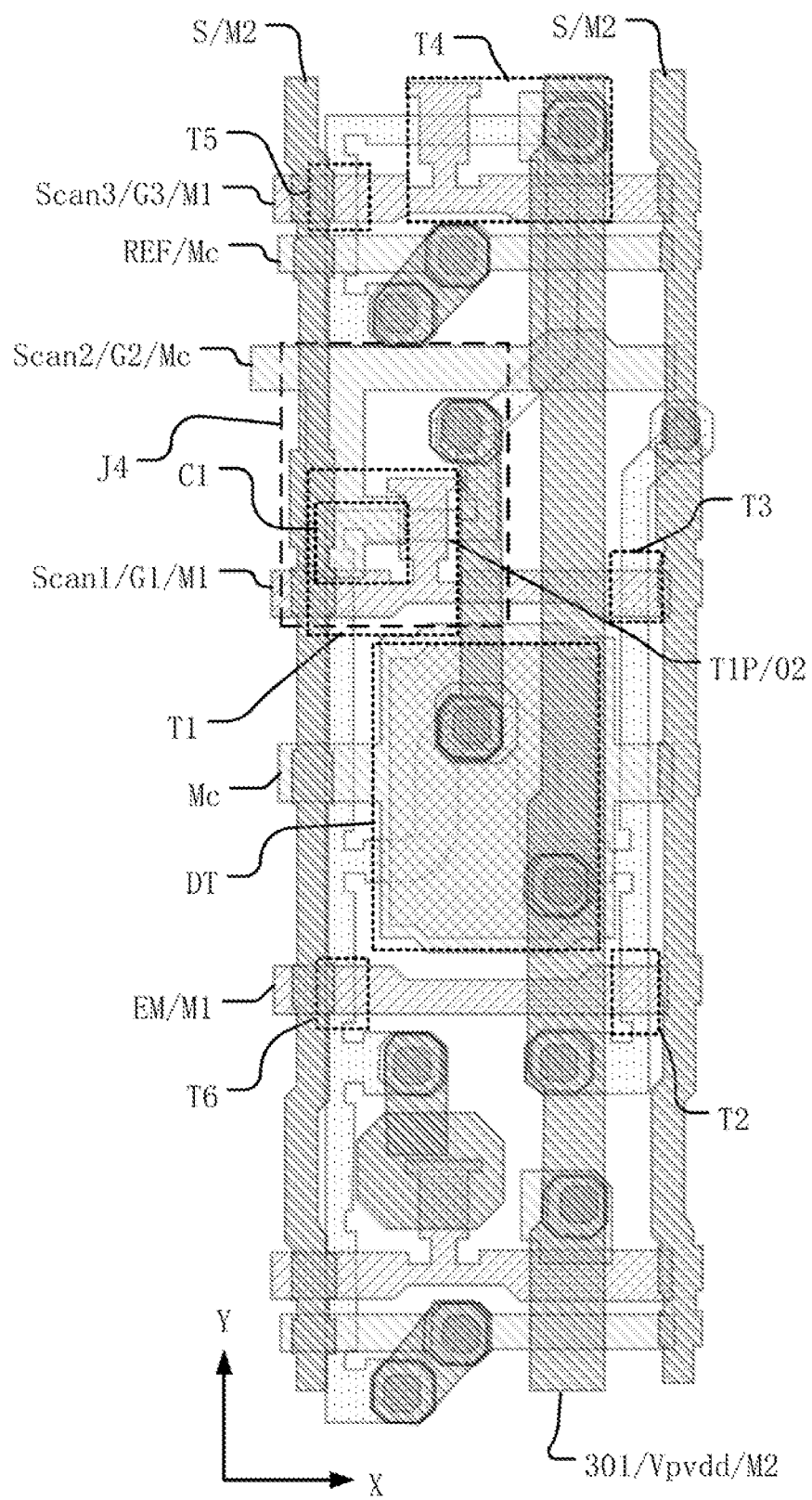
FIG. 16 illustrates another layout structure of the circuit connection structure in FIG. 6 fabricated on a substrate of the display panel consistent with disclosed embodiments of the present disclosure.
Figure 17:
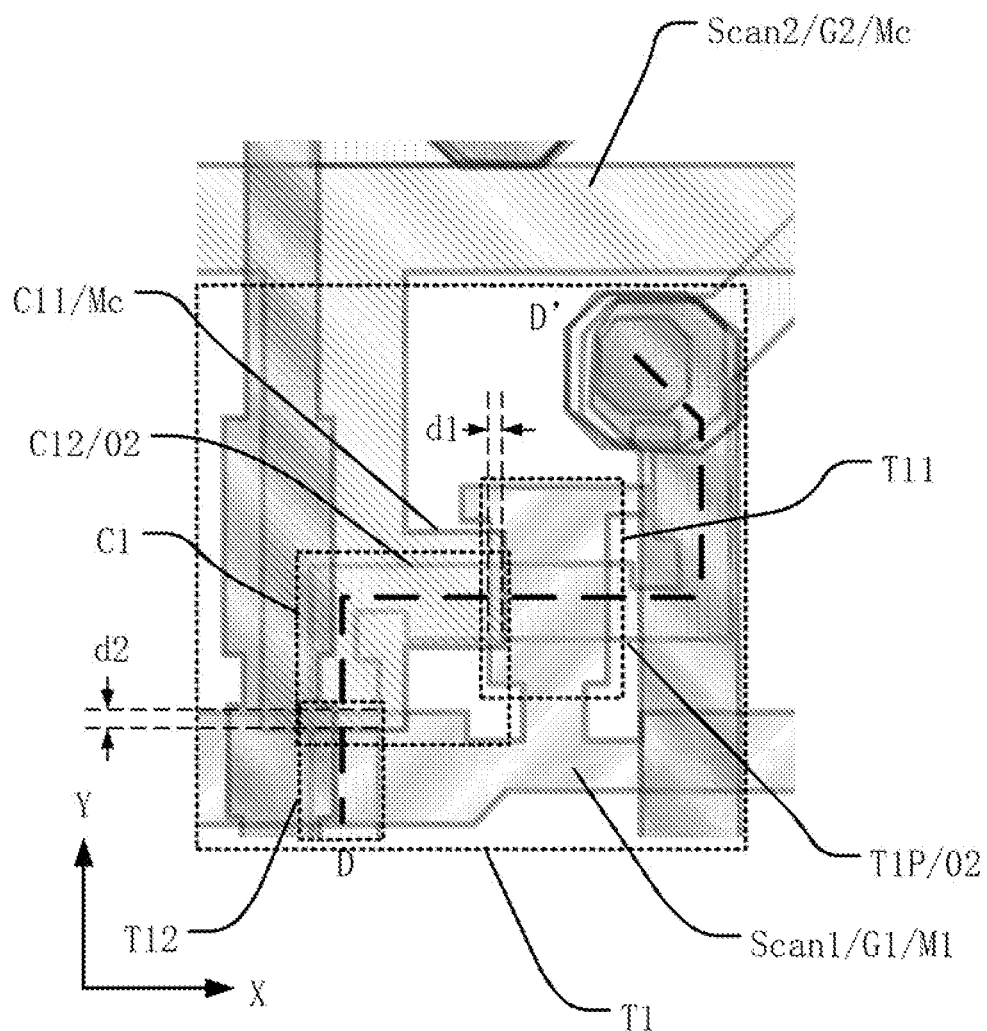
FIG. 17 illustrates a local zoom-in view of a region J4 in FIG. 16.
Figure 18:
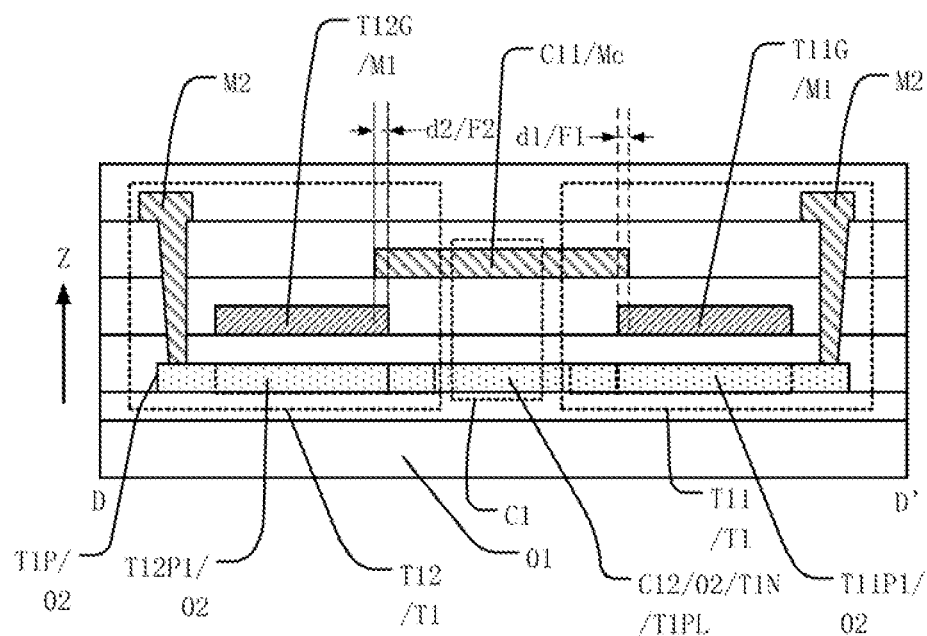
FIG. 18 illustrates a DD'-sectional view of the display panel in FIG. 17.

FIG. 10 illustrates another layout structure of the circuit connection structure in FIG. 6 fabricated on a substrate of the display panel; FIG. 11 illustrates a local zoom-in view of a region J2 in FIG. 10; FIG. 12 illustrates a BB'-sectional view of the display panel in FIG. 11; FIG. 13 illustrates another layout structure of the circuit connection structure in FIG. 6 fabricated on a substrate of the display panel; FIG. 14 illustrates a local zoom-in view of a region J3 in FIG. 13; FIG. 15 illustrates a CC'-sectional view of the display panel in FIG. 14; FIG. 16 illustrates another layout structure of the circuit connection structure in FIG. 6 fabricated on a substrate of the display panel; FIG. 17 illustrates a local zoom-in view of a region J4 in FIG. 16; and FIG. 18 illustrates a DD'-sectional view of the display panel in FIG. 17. It should be noted that transparent filling is applied to FIGS. 10-11, FIGS. 13-14 and FIGS. 16-17 for clarity of the structure in the present disclosure.

In certain embodiments, referring to FIG. 3, FIGS. 5-6 and FIGS. 10-18, the first double-gate transistor T1 may include the first gate T11G and the second gate T12G. In the direction Z perpendicular to the plane where the substrate 01 is located, the first electrode portion C11 may overlap with a portion of the first gate T11G and may not overlap with the second gate T12G (as shown in FIGS. 10-12). Alternatively, the first electrode portion C11 may not overlap with the first gate T11G, while may overlap with a portion of the second gate T12G (as shown in FIGS. 13-15). Alternatively, the first electrode portion C11 may overlap with a portion of the first gate T11G and may also overlap with a portion of the second gate T12G (as shown in FIGS. 16-18).

In the disclosed embodiments, the first electrode portion C11 of the voltage regulation capacitor C1 used for coupling and pulling down the potential of the middle node TIN in the pixel circuit 10 may partially overlap with the gate of the first double-gate transistor T1 in the direction Z perpendicular to the plane where the substrate 01 is located. Specifically, the first double-gate transistor T1 may include the first sub-transistor T11 and the second sub-transistor T12. The first sub-transistor T11 may include the first gate T11G, and the second sub-transistor T12 may include the second gate T12G. Both the first gate T11G and the second gate T12G may be disposed on the gate metal layer M1. In the direction Z perpendicular to the plane where the substrate 01 is located, the first electrode portion C11 may merely overlap with a portion of the first gate T11G, and may not overlap with the second gate T12G. Alternatively, the first electrode portion C11 may not overlap with the first gate T11G, and may merely overlap with a portion of the second gate T12G. Alternatively, the first electrode portion C11 may overlap with a portion of the first gate T11G and may also overlap with a portion of the second gate T12G. By setting a partially overlapping structure between the first electrode portion C11 and the gate of the first double-gate transistor T1, the overlapping area between the first electrode portion C11 and the second electrode portion C12 (i.e., the active portion TIP of the first double-gate transistor T1) may increase. Therefore, f the coupling and pulling down effect of the voltage regulation capacitor C1 may be enhanced, and the influence of the leakage current of the first double-gate transistor T1 on the gate potential of the driving transistor DT may be further reduced, thereby avoiding flickering of the display screen, and ensuring the display quality of the display panel 000.

In one embodiment, referring to FIG. 3, FIGS. 5-6 and FIGS. 10-18, to minimize the overlapping area between the first electrode portion C11 and the gate of the first double-gate transistor T1 and to avoid affecting the gate potential of the first double-gate transistor T1, in the direction Z perpendicular to the plane where the substrate 01 is located, the first electrode portion C11 and a portion of the first gate T11G may include a first overlapping region F1, and the first electrode portion C11 and a portion of the second gate T12G may include a second overlapping region F2. Along a length extension direction of the second scan line G2 (the first direction X as illustrated in the Figure), a width of the first overlapping region F1 may be denoted as d1; and along a length extension direction of the data line S (the second direction Y as illustrated in the Figure), a width of the second overlapping region F2 may be denoted as d2, where $d1 \leq 1$ μm, $d2 \leq 1$ μm. Therefore, the overlapping area between the first electrode portion C11 and the gate of the first double-gate transistor T1 may be controlled within a range that does not affect the gate potential of the first double-gate transistor T1. The width d1 of the first overlapping region F1 and the width d2 of the second overlapping region F2 may be prevented from being too small to increase the overlapping area between the first electrode portion C11 and the second electrode portion C12. Further, the width d1 of the first overlapping region F1 and the width d2 of the second overlapping region F2 may be prevented from being too large to affect the gate potential of the first double-gate transistor T1. While enhancing the coupling and pulling down effect of the voltage-regulation capacitor C1, the normal driving display effect of the display panel 000 may be ensured.

Figure 19:
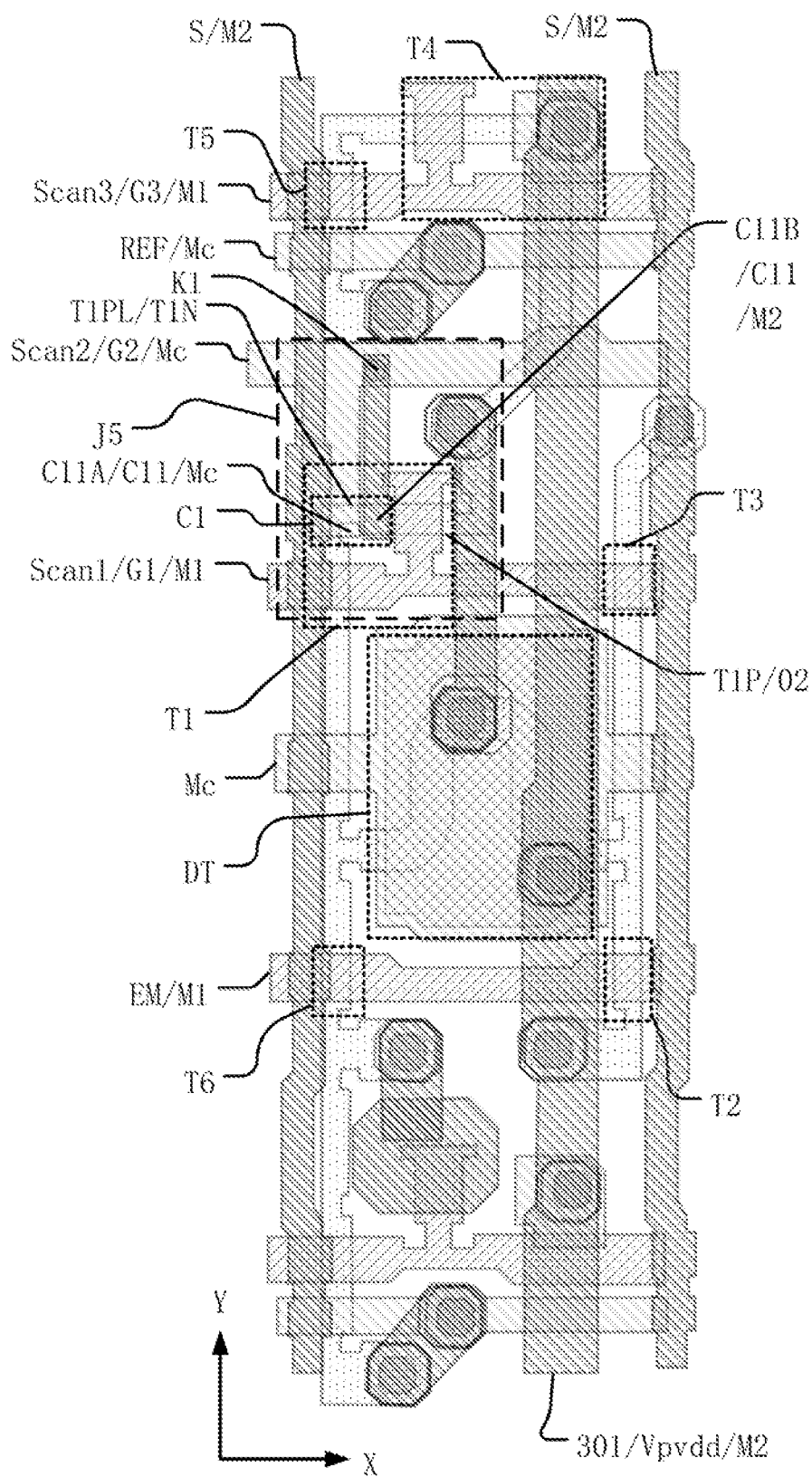
FIG. 19 illustrates another layout structure of the circuit connection structure in FIG. 6 fabricated on a substrate of the display panel consistent with disclosed embodiments of the present disclosure.
Figure 20:
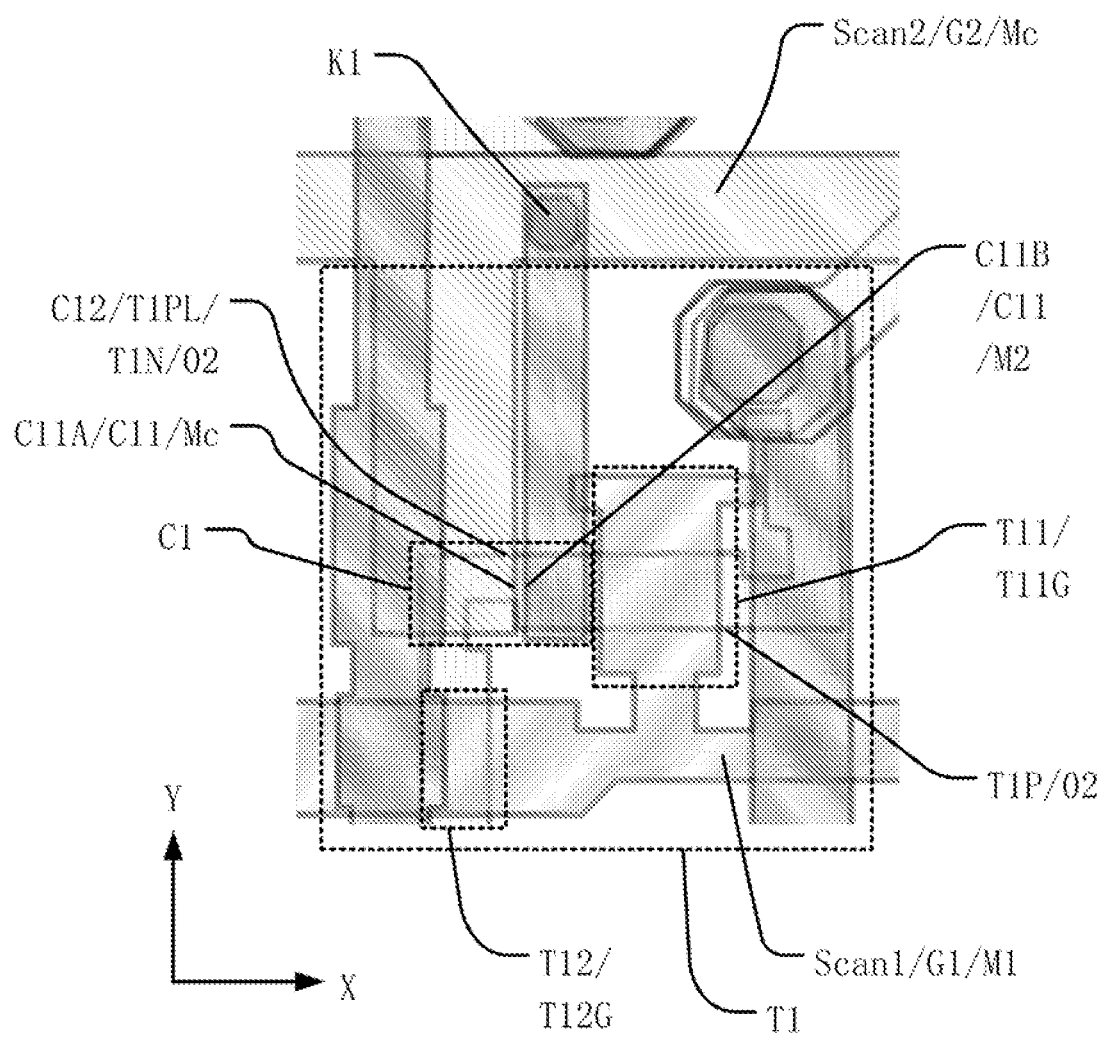
FIG. 20 illustrates a local zoom-in view of a region J5 in FIG. 19.

FIG. 19 illustrates another layout structure of the circuit connection structure in FIG. 6 fabricated on a substrate of the display panel; and FIG. 20 illustrates a local zoom-in view of a region J5 in FIG. 19. It should be noted that transparent filling is applied to FIGS. 19-20 for clarity of the structure in the present disclosure. In certain embodiments, referring to FIG. 3, FIGS. 5-6 and FIGS. 19-20, the first electrode portion C11 may at least include a first sub-electrode portion C11A and a second sub-electrode portion C11B. The first sub-electrode portion C11A and the second sub-electrode portion C11B may be arranged on different layers and may be electrically connected to each other.

In the direction perpendicular to the plane where the substrate 01 is located, the first sub-electrode portion C11A may at least partially overlap with the active portion TIP of the first double-gate transistor T1, and the second sub-electrode portion C11B may at least partially overlap with the active portion TIP of the first double-gate transistor T1.

It should be understood that FIGS. 19-20 still use the pixel circuit 10 having the circuit connection structure shown in FIG. 6 as an example to illustrate the structure of the voltage-regulation capacitor C1 on the substrate 01. In actual implementation, the pixel circuit 10 may adopt any other circuit connection structure, and the disclosed embodiments may merely be an example.

The disclosed embodiments may explain that the first electrode portion C11 of the voltage-regulation capacitor C1 may include at least the first sub-electrode portion C11A and the second sub-electrode portion C11B. The first sub-electrode portion C11A and the second sub-electrode portion C11B may be arranged on different metal film layers and may be electrically connected to each other. In other words, the first electrode portion C11 of the voltage-regulation capacitor C1 may include two parts located on different metal film layers, which may be directly electrically connected (not shown in the Figure), alternatively, both parts may be electrically connected to the second scan line G2 (as shown in FIG. 19) to achieve electrical connection between the first sub-electrode portion C11A and the second sub-electrode portion C11B. The second scan signal Scan2 having a phase opposite to the first scan signal Scan1 may be introduced by the second scan line G2. The first sub-electrode portion C11A and the second sub-electrode portion C11B connected to the same potential may be jointly used as the first electrode portion C11 of the voltage-regulation capacitor C1. In the direction perpendicular to the plane where the substrate 01 is located, not only the first sub-electrode portion C11A may at least partially overlap with the active portion TIP of the first double-gate transistor T1, but also the second sub-electrode portion C11B may at least partially overlap with the active portion TIP of the first double-gate transistor T1. Optionally, not only the first sub-electrode portion C11A may at least partially overlap with the channel connection portion T1PL of the first double-gate transistor T1, but also the second sub-electrode portion C11B may at least partially overlap with the channel connection portion T1PL of the first double-gate transistor T1.

When the first sub-electrode portion C11A and the second sub-electrode portion C11B connected to the same potential are arranged on different layers and do not overlap with each other, the overall area of the first electrode portion C11 may increase, and the overlapping area between the first electrode portion C11 and the second electrode portion C12 may increase, which may facilitate to further enhance the coupling and pulling down effect of the voltage-regulation capacitor C1. When the first sub-electrode portion C11A and the second sub-electrode portion C11B connected to the same potential are arranged on different layers and at least partially overlap with each other, the first electrode portion C11 may have a dual-layer plate structure with the same potential. The capacitor with the dual-layer plate may have a better coupling effect than the capacitor with a single-layer plate. Therefore, the coupling and pulling down effect of the voltage-regulation capacitor C1 may be further enhanced, to better pull down the coupling high potential of the middle node TIN of the first double-gate transistor T1, which may facilitate to ensure the stability of the gate potential of the driving transistor DT and to improve the display quality.

Optionally, whether the first sub-electrode portion C11A and the second sub-electrode portion C11B connected to the same potential overlap with each other may not be limited by the present disclosure, and may be determined according to actual needs in practical implementation. FIGS. 19-20 illustrate an example where the first sub-electrode portion C11A and the second sub-electrode portion C11B do not overlap with each other.

Optionally, in one embodiment, the first electrode portion C11 of the voltage regulation capacitor C1 may at least include the first sub-electrode portion C11A and the second sub-electrode portion C11B that are arranged in different layers. The display panel 000 may also include a plurality of reference voltage lines REF (not shown in FIG. 3, but may be understood by referring to FIG. 19) and a plurality of data lines S. The first sub-electrode portion C11A may be arranged in the same layer as the reference voltage line REF, and the second sub-electrode portion C11B may be arranged in the same layer as the data line S. In other words, the first sub-electrode portion C11A may be made from the capacitor metal layer Mc, and the second sub-electrode portion C11B may be made from the second metal layer M2, which may facilitate reduction of the thickness of the film layer. The electrical connection between the first sub-electrode portion C11A and the second sub-electrode portion C11B may be achieved through a first via K1. Because the distance between the capacitor metal layer Mc and the second metal layer M2 is small, the difficulty of forming the first via K1 may be reduced, which may avoid affecting the stability of the electrical connection.

Figure 21:
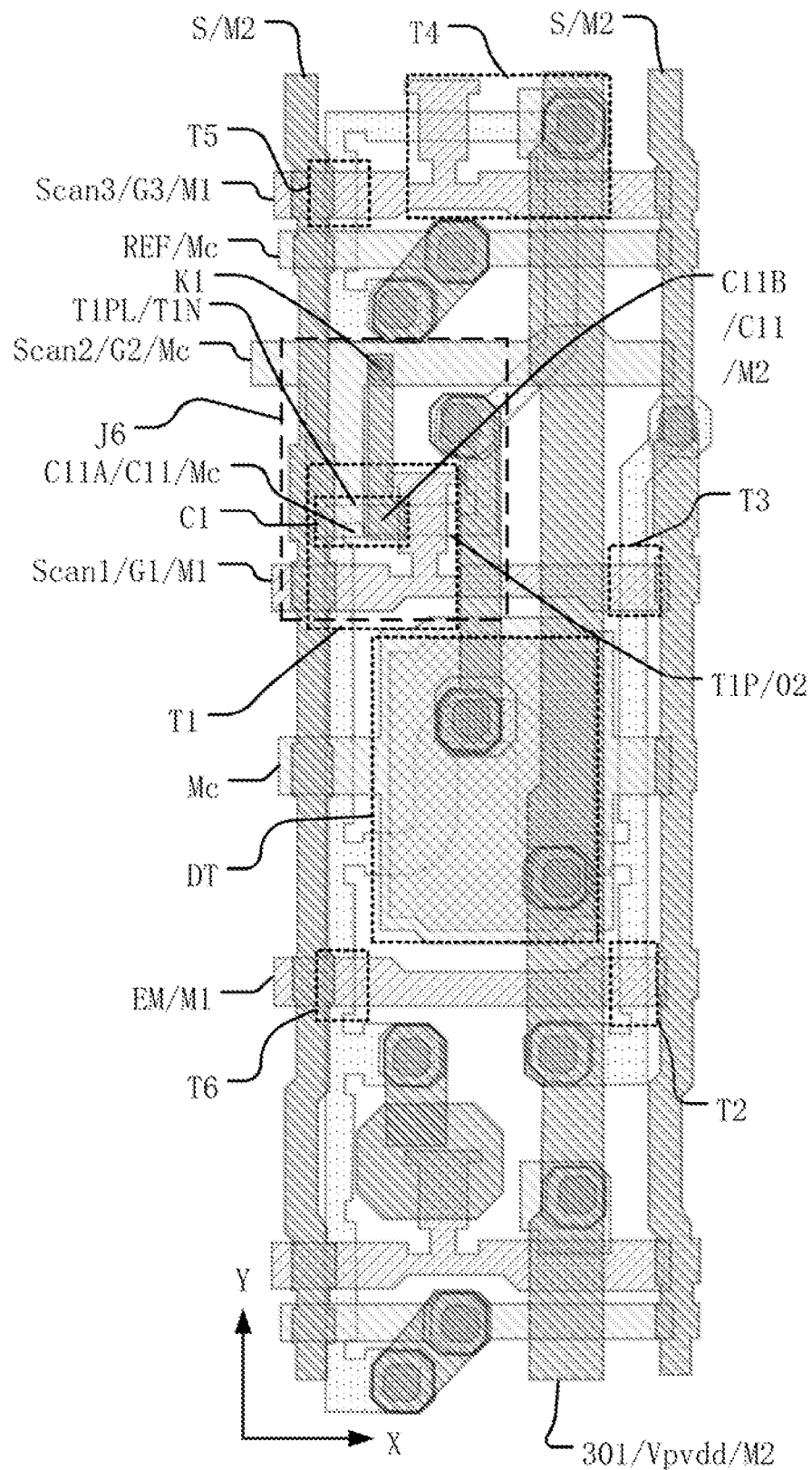
FIG. 21 illustrates another layout structure of the circuit connection structure in FIG. 6 fabricated on a substrate of the display panel consistent with disclosed embodiments of the present disclosure.
Figure 22:
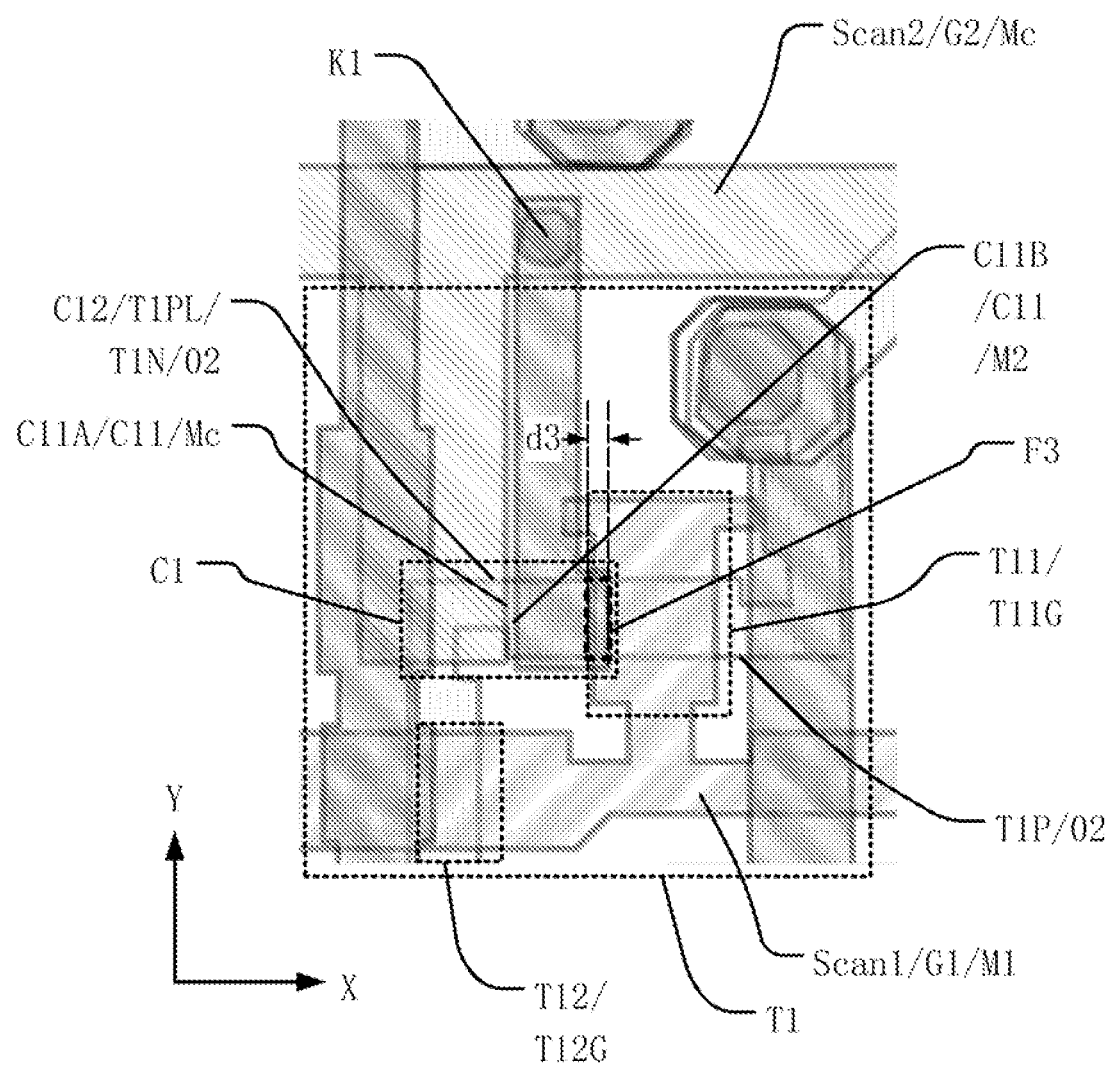
FIG. 22 illustrates a local zoom-in view of a region J6 in FIG. 20.
Figure 23:
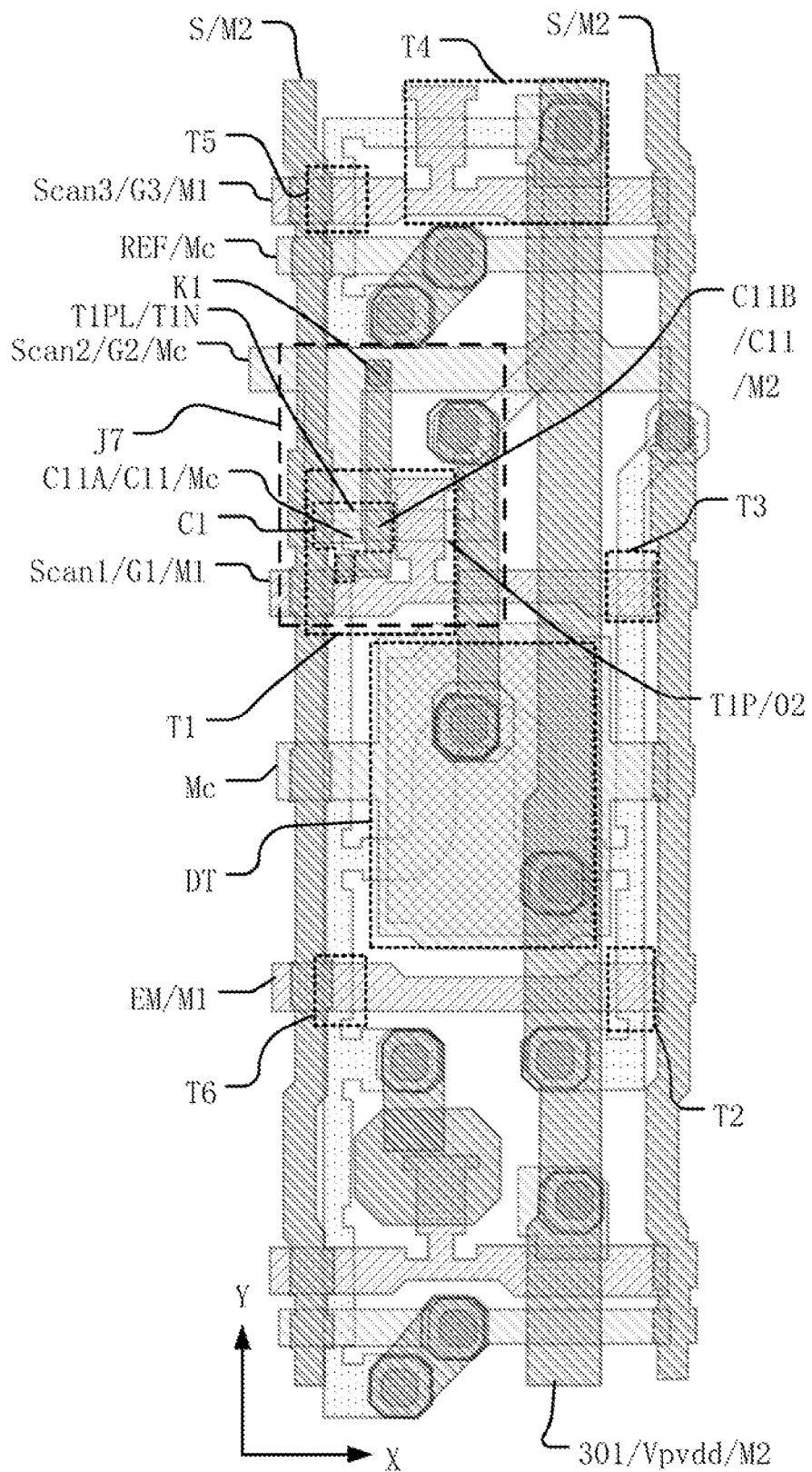
FIG. 23 illustrates another layout structure of the circuit connection structure in FIG. 6 fabricated on a substrate of the display panel consistent with disclosed embodiments of the present disclosure.
Figure 24:
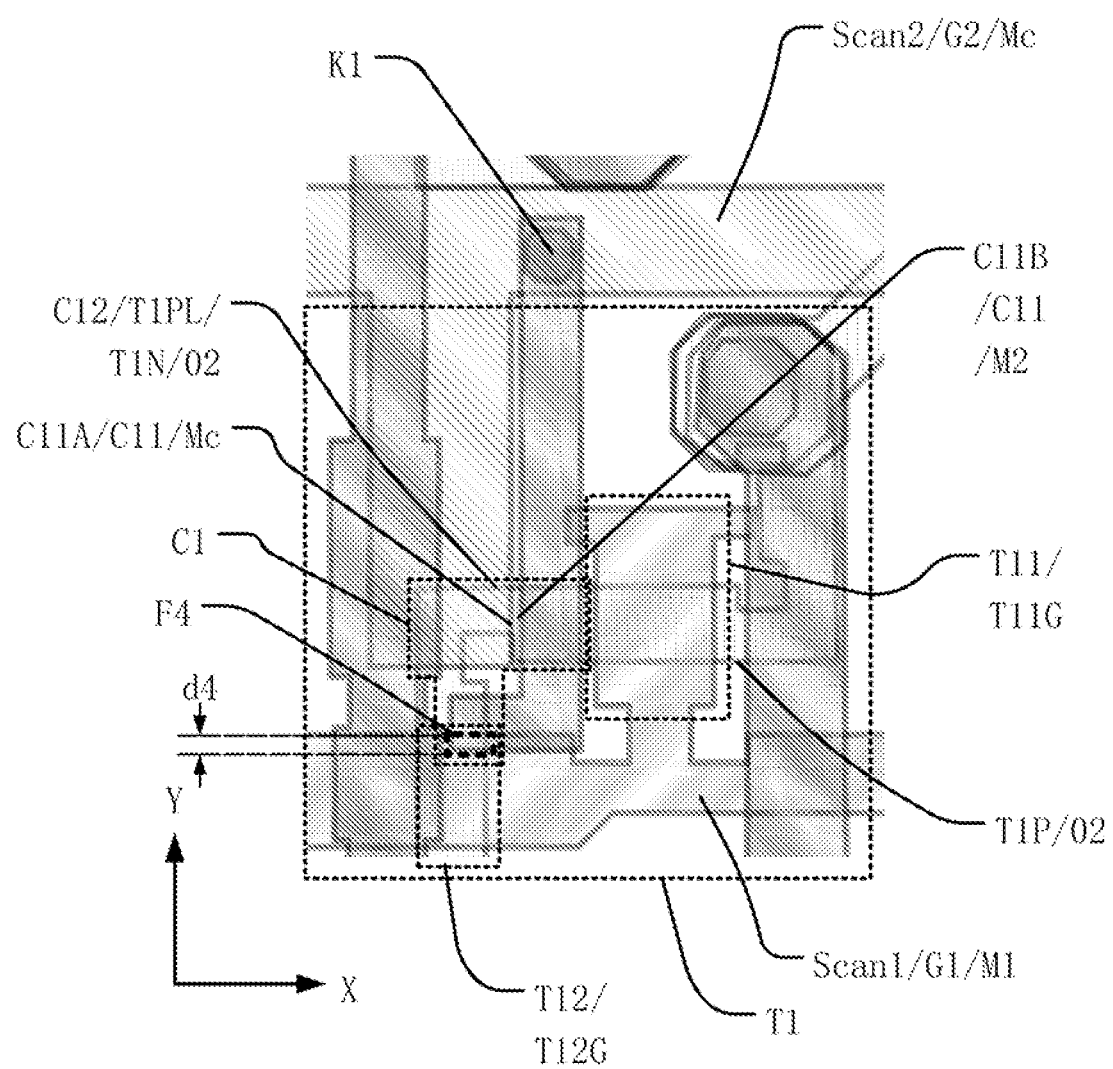
FIG. 24 illustrates a local zoom-in view of a region J7 in FIG. 23.
Figure 25:
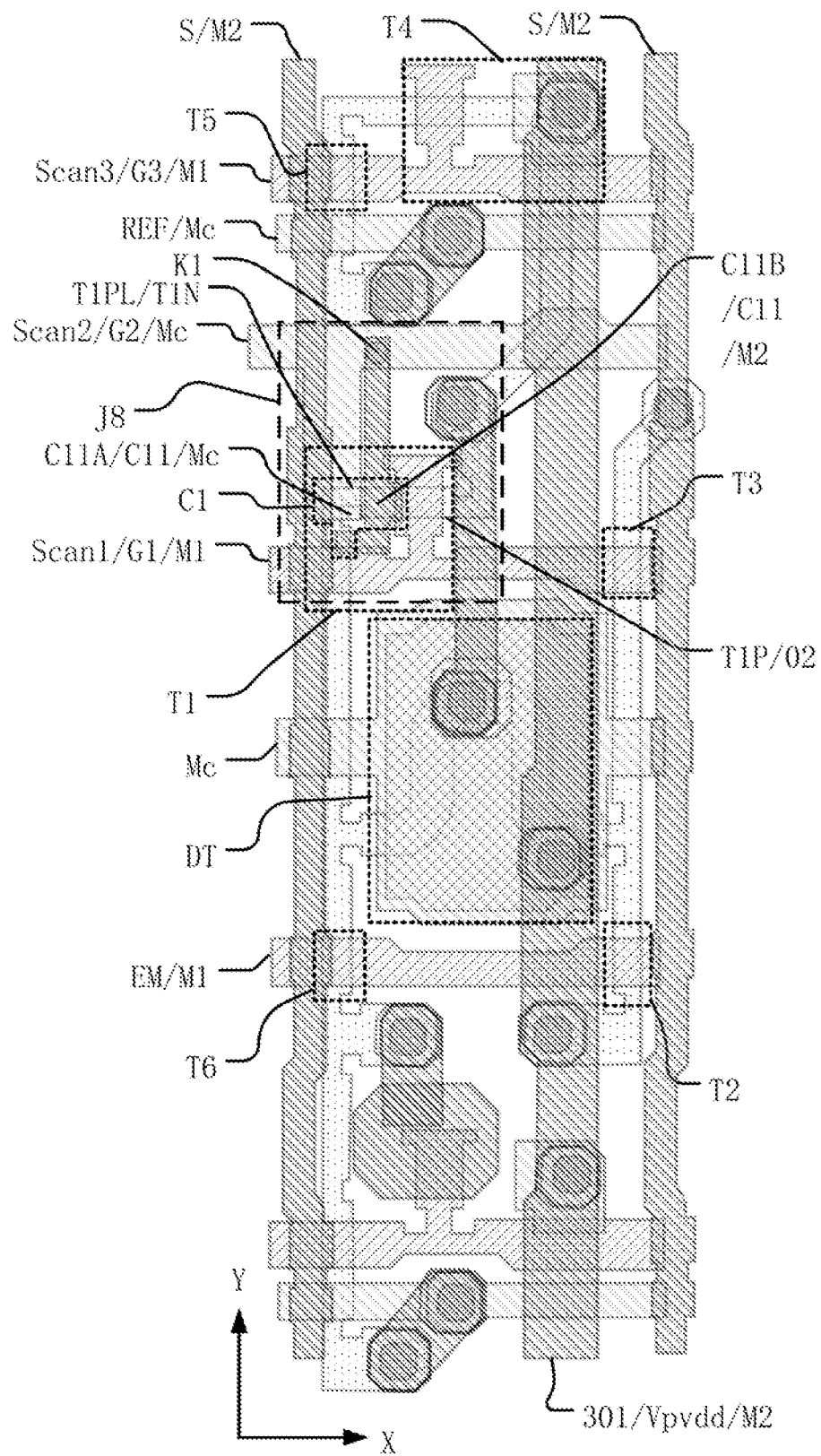
FIG. 25 illustrates another layout structure of the circuit connection structure in FIG. 6 fabricated on a substrate of the display panel consistent with disclosed embodiments of the present disclosure.
Figure 26:
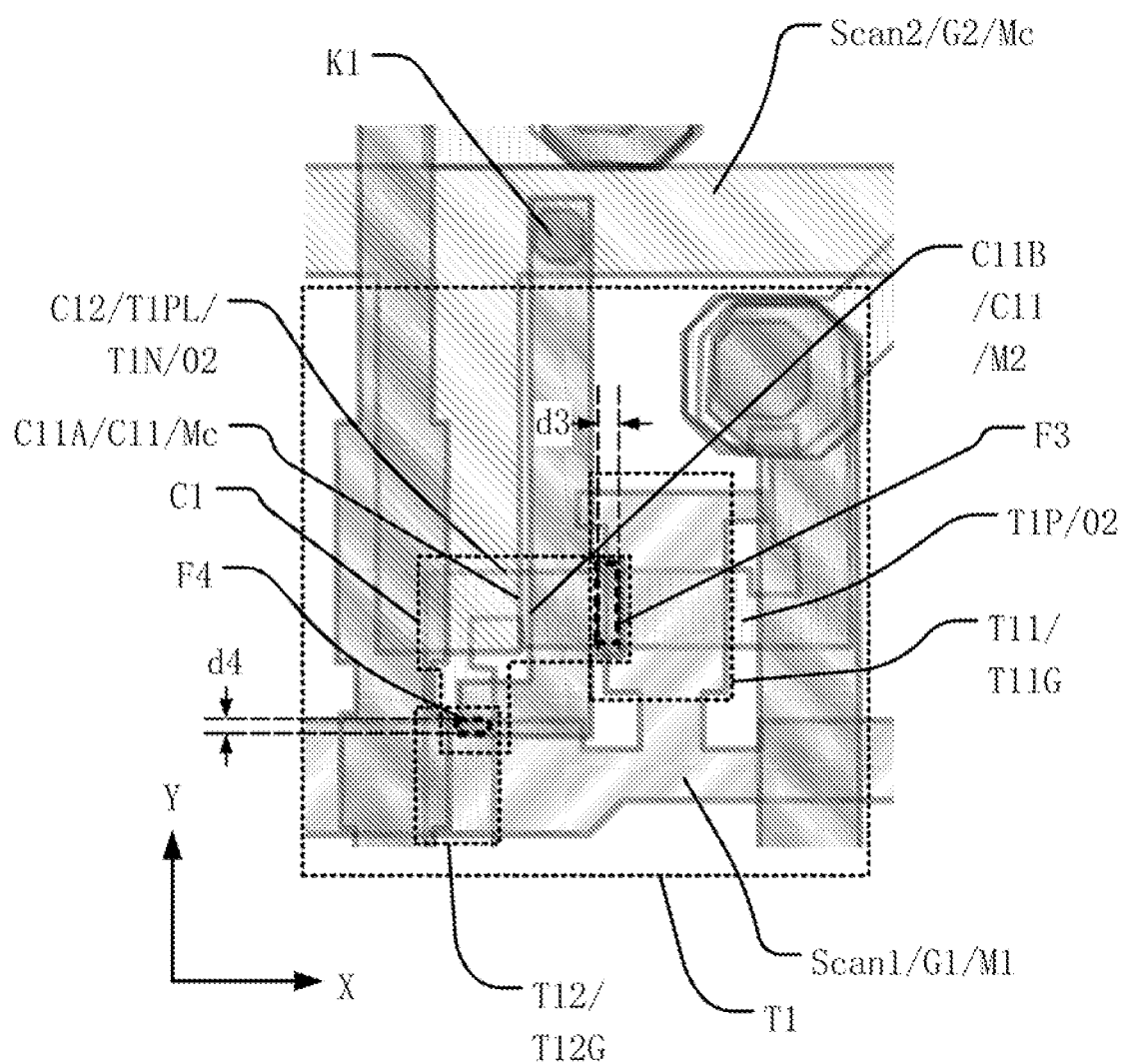
FIG. 26 illustrates a local zoom-in view of a region J8 in FIG. 25.

FIG. 21 illustrates another layout structure of the circuit connection structure in FIG. 6 fabricated on a substrate of the display panel; FIG. 22 illustrates a local zoom-in view of a region J6 in FIG. 20; FIG. 23 illustrates another layout structure of the circuit connection structure in FIG. 6 fabricated on a substrate of the display panel; FIG. 24 illustrates a local zoom-in view of a region J7 in FIG. 23; FIG. 25 illustrates another layout structure of the circuit connection structure in FIG. 6 fabricated on a substrate of the display panel; and FIG. 26 illustrates a local zoom-in view of a region J8 in FIG. 25. It should be noted that transparent filling is applied to FIGS. 21-26 for clarity of the structure in the present disclosure.

In certain embodiments, referring to FIG. 3, FIGS. 5-6, and FIGS. 21-26, the first double-gate transistor T1 may include the first gate T11G and the second gate T12G. In the direction perpendicular to the plane where the substrate 01 is located, the second sub-electrode portion C11B may overlap with a portion of the first gate T11G and/or a portion of the second gate T12G. Optionally, in view of this, the first sub-electrode portion C11A that is connected to the same potential as the second sub-electrode portion C11B and is arranged in a layer different from the second sub-electrode portion C11B may at least overlap with a portion of the first gate T11G and may not overlap with the second gate T12G. Alternatively, the first sub-electrode portion C11A may at least overlap with a portion of the second gate T12G and may not overlap with the first gate T11G. Alternatively, the first sub-electrode portion C11A may at least overlap with a portion of the first gate T11G and may at least overlap with a portion of the second gate T12G. Alternatively, the first sub-electrode portion C11A may not overlap with either the second gate T12G or the first gate T11G. FIGS. 21-26 may merely illustrate an example where the first sub-electrode portion C11A may not overlap with either the second gate T12G or the first gate T11G. The overlapping situation between the first sub-electrode portion C11A, the first gate T11G and the second gate T12G may be understood by referring to the embodiments shown in FIGS. 10-18. The FIGS. 21-26 may merely illustrate the overlapping situation between the second sub-electrode portion C11B, the first gate T11G and the second gate T12G.

It should be understood that FIGS. 21-26 still use the pixel circuit 10 having the circuit connection structure shown in FIG. 6 as an example to illustrate the structure of the voltage-regulation capacitor C1 on the substrate 01. In actual implementation, the pixel circuit 10 may adopt any other circuit connection structure, and the disclosed embodiments may merely be an example.

The disclosed embodiments may explain that the first double-gate transistor T1 may include the first gate T11G and the second gate T12G. In the direction perpendicular to the plane where the substrate 01 is located, the second sub-electrode C11B may overlap with a portion of the first gate T11G, and may not overlap with the second gate T12G (as shown in FIGS. 21-22). Alternatively, the second sub-electrode C11B may not overlap with the first gate T11G, and may overlap with a portion of the second gate T12G (as shown in FIGS. 23-24). Alternatively, the second sub-electrode C11B may overlap with a portion of the first gate T11G, and may also overlap with a portion of the second gate T12G (as shown in FIGS. 25-26).

The first electrode portion C11 of the voltage regulation capacitor C1 used in the pixel circuit 10 for coupling and pulling down the potential of the middle node TIN may include the first sub-electrode portion C11A and the second sub-electrode portion C11B that are arranged in different layers and connected to the same potential. The second sub-electrode portion C11B may be set to overlap with a small area of the gate of the first double-gate transistor T1 in the direction Z perpendicular to the plane where the substrate 01 is located. Specifically, the first double-gate transistor T1 may include the first sub-transistor T11 and the second sub-transistor T12. The first sub-transistor T11 may include the first gate T11G, and the second sub-transistor T12 may include the second gate T12G. The first gate T11G and the second gate T12G may be disposed on the gate metal layer M1. The first sub-electrode portion C11A may be disposed on the capacitor metal layer Mc on the side of the gate metal layer M1 away from the substrate 01, and the second sub-electrode portion C11B may be disposed on the second metal layer M2 on the side of the capacitor metal layer Mc away from the substrate 01.

In the direction Z perpendicular to the plane where the substrate 01 is located, the second sub-electrode portion C11B may merely overlap with a portion of the first gate T11G, and may not overlap with the second gate T12G. Alternatively, the second sub-electrode portion C11B may not overlap with the first gate T11G, and may merely overlap with a portion of the second gate T12G. Alternatively, the second sub-electrode portion C11B may overlap with a portion of the first gate T11G, and may also overlap with a portion of the second gate T12G. The second sub-electrode portion C11B connected to the second scan signal Scan2 may have an overlapping structure with a small area with the gate of the first double-gate transistor T1. The overlapping area between the second sub-electrode portion C11B and the second electrode portion C12 (e.g., the active portion TIP of the first double-gate transistor T1) may increase, which may be equivalent to increasing the overlapping area between the first electrode portion C11 and the second electrode portion C12 of the voltage regulation capacitor C1. Furthermore, through the cooperation structure of the first sub-electrode portion C11A and the second sub-electrode portion C11B of the first electrode portion C11, the coupling and pulling down effect of the voltage regulation capacitor C1 may be enhanced, which may reduce the influence of the leakage current of the first double-gate transistor T1 on the gate potential of driving transistor DT, may better avoid flickering of the display screen and may ensure the display quality of the display panel 000.

It should be understood that the overlapping area between the second sub-electrode C11B and the first gate T11G as well as the second gate T12G of the double-gate transistor may be set as small as possible. In other words, the second sub-electrode C11B may partially overlap and may not fully overlap with the first gate T11G. Similarly, the second sub-electrode C11B may partially overlap and may not fully overlap with the second gate T12G. Therefore, the overlapping area between the second sub-electrode C11B and the first gate T11G as well as the second gate T12G may be prevented from being too large, and the coupling effect may be prevented from affecting the stability of the transmitted potential of the first gate T11G and the second gate T12G.

Optionally, as shown in FIG. 3, FIGS. 5-6 and FIGS. 21-26, to make the overlapping area between the second sub-electrode C11B and the gate of the first double-gate transistor T1 as small as possible, to avoid affecting the gate potential of the first double-gate transistor T1, in the direction perpendicular to the plane where the substrate 01 is located, the second sub-electrode C11B may overlap with a portion of the first gate T11G to form a third overlapping region F3, and the second sub-electrode C11B may overlap with a portion of the second gate T12G to form a fourth overlapping region F4. Along a length extension direction of the second scan line G2 (the first direction X shown in the Figure), a width of the third overlapping region F3 may be d3; and along a length extension direction of the data line S (the second direction Y shown in the Figure), a width of the fourth overlapping region F4 may be d4, where d3≤1 μm and d4≤1 μm. Therefore, the overlapping area between the second sub-electrode portion C11B and the gate of the first double-gate transistor T1 may be controlled within a range without affecting the gate potential of the first double-gate transistor T1. The width d3 of the third overlapping region F3 and the width d4 of the fourth overlapping region F4 may be prevented from being too small to increase the overlapping area between the second sub-electrode portion C11B and the second electrode portion C12. Further, width d3 of the third overlapping region F3 and the width d4 of the fourth overlapping region F4 may be prevented from being too large to affect the gate potential of the first double-gate transistor T1. While enhancing the coupling and pulling down effect of the voltage-regulation capacitor C1, the normal driving display effect of the display panel 000 may be ensured.

Figure 27:
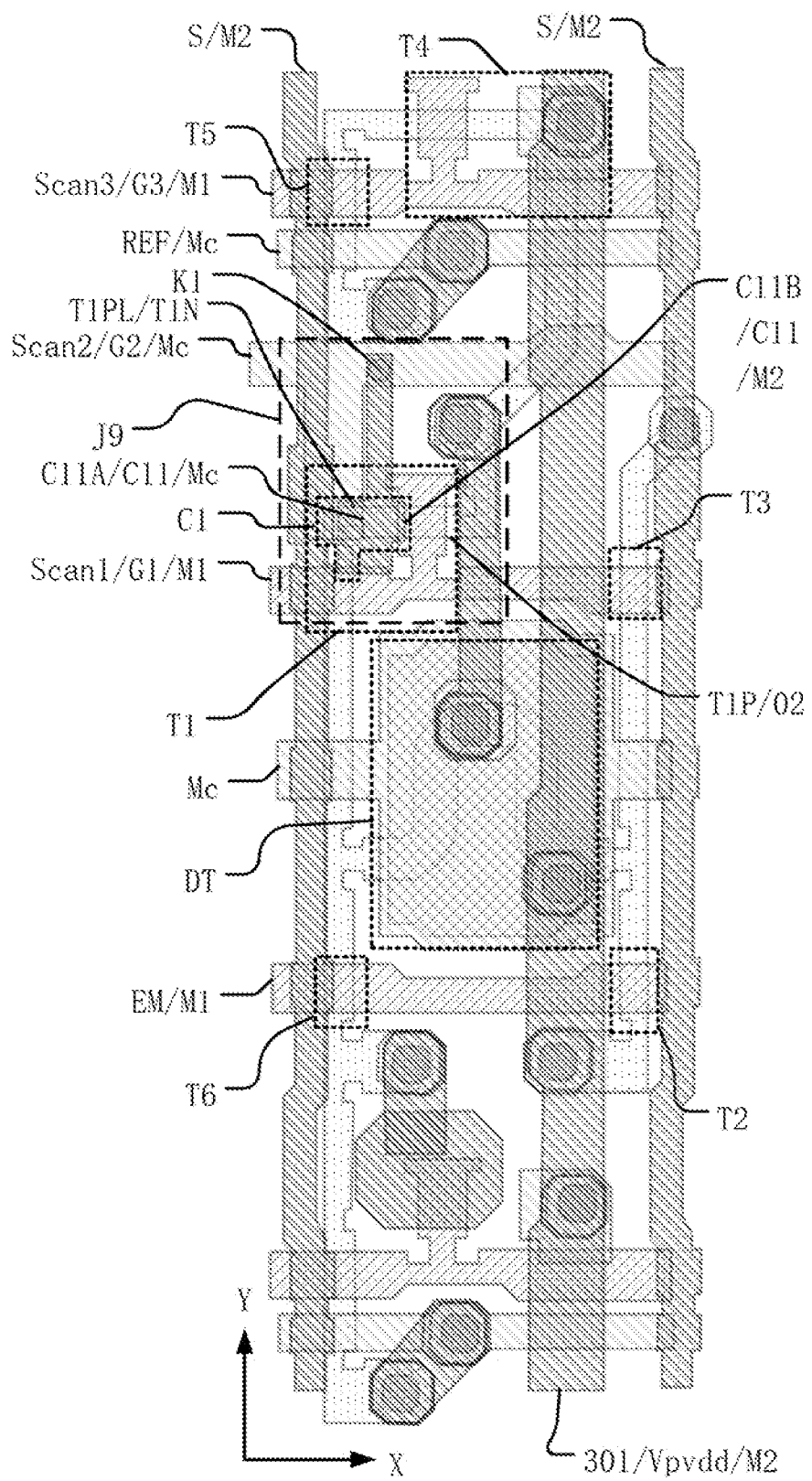
FIG. 27 illustrates another layout structure of the circuit connection structure in FIG. 6 fabricated on a substrate of the display panel consistent with disclosed embodiments of the present disclosure.
Figure 28:
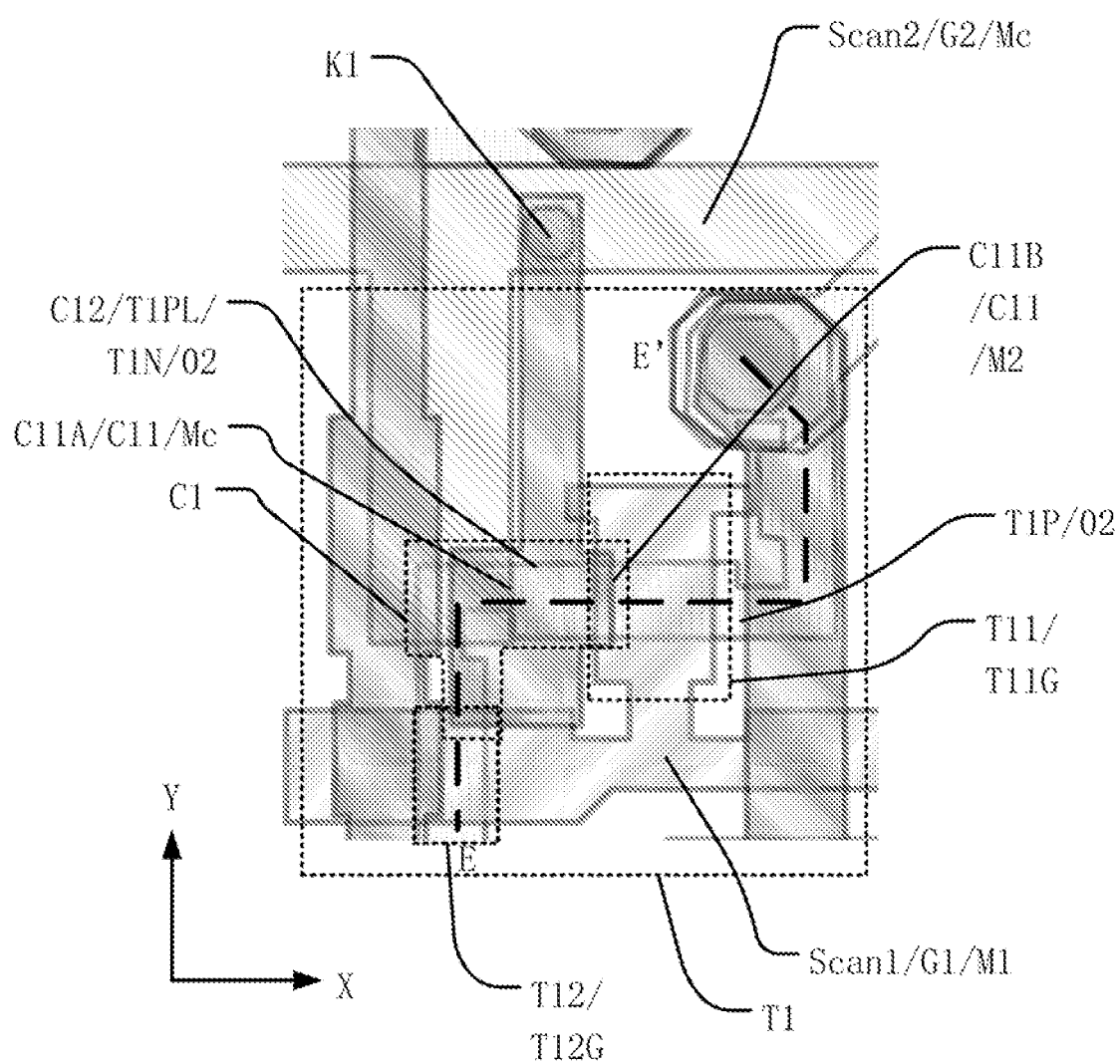
FIG. 28 illustrates a local zoom-in view of a region J9 in FIG. 27.
Figure 29:
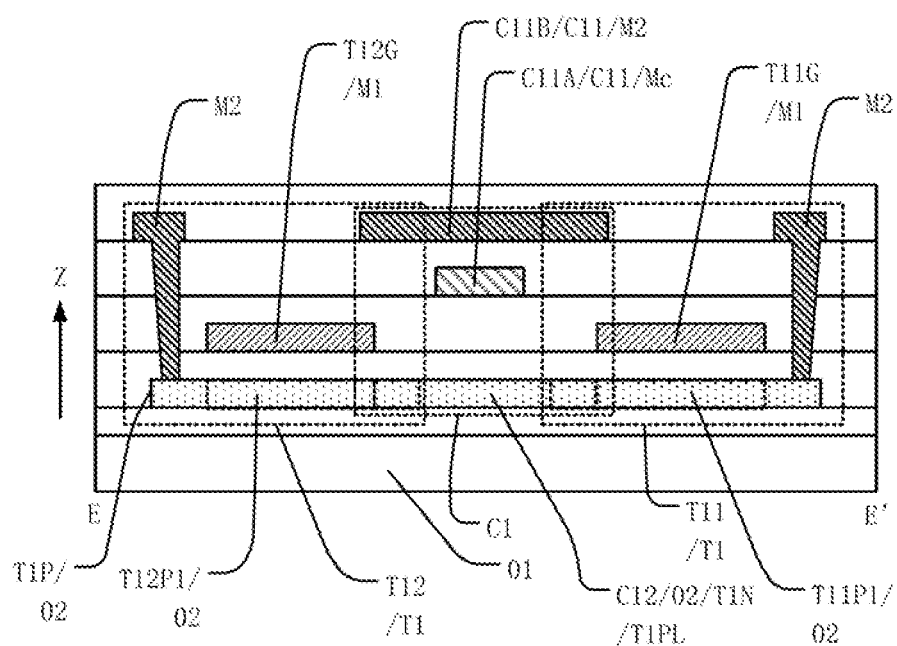
FIG. 29 illustrates an EE'-sectional view of the display panel in FIG. 28.

FIG. 27 illustrates another layout structure of the circuit connection structure in FIG. 6 fabricated on a substrate of the display panel; FIG. 28 illustrates a local zoom-in view of a region J9 in FIG. 27; and FIG. 29 illustrates an EE'-sectional view of the display panel in FIG. 28. It should be noted that transparent filling is applied to FIGS. 27-28 for clarity of the structure in the present disclosure. In certain embodiments, referring to FIG. 3, FIGS. 5-6 and FIGS. 27-29, in the direction Z perpendicular to the plane where the substrate 01 is located, the second sub-electrode C11B may at least partially overlap with the first sub-electrode C11A.

The disclosed embodiments may explain that the first electrode portion C11 of the voltage regulation capacitor C1 may at least include the first sub-electrode portion C11A and the second sub-electrode portion C11B. The first sub-electrode portion C11A and the second sub-electrode portion C11B may be disposed in different layers and may be electrically connected to each other. The second scan signal Scan2 having a phase opposite to the first scan signal Scan1 may be introduced by the second scan line G2. The first sub-electrode portion C11A and the second sub-electrode portion C11B connected to the same potential may be jointly used as the first electrode portion C11 of the voltage-regulation capacitor C1. In the direction perpendicular to the plane where the substrate 01 is located, not only the first sub-electrode portion C11A may at least partially overlap with the channel connection portion T1PL of the first double-gate transistor T1, but also the second sub-electrode portion C11B may at least partially overlap with the channel connection portion T1PL of the first double-gate transistor T1. Further, the first sub-electrode portion C11A may at least partially overlap with the second sub-electrode portion C11B. In other words, the first electrode portion C11 may have a dual-layer plate structure with the same potential. The capacitor with the dual-layer plate may have a better coupling effect than the capacitor with a single-layer plate. Therefore, the coupling and pulling down effect of the voltage-regulation capacitor C1 may be further enhanced, to better pull down the coupling high potential of the middle node TIN of the first double-gate transistor T1, which may facilitate to ensure the stability of the gate potential of the driving transistor DT and to improve the display quality.

It should be understood that the size of the overlapping area between the second sub-electrode portion C11B and the first sub-electrode portion C11A may not be limited by the present disclosure. Under the premise of without affecting the layout of the film layer, the overlapping area between the second sub-electrode portion C11B and the first sub-electrode portion C11A may be as large as possible. For example, the second sub-electrode portion C11B with a substantially large area may overlap with the first sub-electrode portion C11A, as long as the second sub-electrode portion C11B may not be in contact with any other conductive structure (such as the data line S, the first power signal line 301, etc.) of the second metal layer M2 to avoid short circuit.

Optionally, referring to FIG. 3, FIGS. 5-6 and FIGS. 27-29, in one embodiment, the first scan line G1 and the gate of the first double-gate transistor T1 (including the first gate T11G and the second gate T12G) may be disposed in the same layer, while the first scan line G1 and the first electrode portion C11 may be disposed in different layers.

The disclosed embodiments may explain that in the display panel 000, the first scan line G1 that controls the turn-on or turn-off of the first double-gate transistor T1 may be disposed in the same metal layer as the gate of the first double-gate transistor T1. For example, the first scan line G1 and the gate of the first double-gate transistor T1 may be made from the same gate metal layer M1. The first electrode portion C11 of the voltage regulation capacitor C1 may be disposed in a layer different from the first scan line G1, e.g., may be made from the capacitance metal layer Mc. While increasing the area of the first electrode portion C11 to enhance the coupling effect of the voltage regulation capacitor C, the problem of short circuit between the structure of the gate metal layer M1 such as the first scan line G1 and the gate of the first double-gate transistor T1 may be avoided, which may facilitate to ensure the display effect of the display panel.

Optionally, referring to FIG. 3, FIGS. 5-6 and FIGS. 27-29, the first electrode portion C11 and the second scan line G2 may have a one-piece structure. It should be understood that when the first electrode portion C11 has a structure made of a single metal layer, the first electrode portion C11 and the second scan line G2 in the single metal layer film may have a one-piece structure. When the first electrode portion C11 has a structure made of double metal layers, in other words, when the first electrode portion C11 includes the first sub-electrode portion C11A and the second sub-electrode portion C11B that are disposed in different layers, the first sub-electrode portion C11A and the second scan line G2 may have a one-piece structure, while the second sub-electrode portion C11B may be disposed in a layer different from the second scan line G2. In one embodiment, when the first electrode portion C11 is connected to the second scan signal Scan2 having a phase opposite to the first scan signal Scan1 through the second scan line G2, both the first electrode portion C11 and the second scan line G2 may be made from the capacitor metal layer Mc. In other words, the first electrode portion C11 and the second scan line G2 may be formed as a one-piece structure using a same process, which may facilitate simplification of the manufacturing process and improve manufacturing efficiency.

In certain embodiments, referring to FIG. 3 and FIG. 6, the pixel circuit 10 may further include a first reset module 105 and the data-writing module 104. The first terminal of the first reset module 105 may be electrically connected to the reference voltage line REF, and the second terminal of the first reset module 105 may be electrically connected to the control terminal 101C of the driving module 101. The control terminal of the first reset module 105 may be electrically connected to the third scan line G3. The first terminal of the data-writing module 104 may be electrically connected to the first terminal 101A of the driving module 101, the second terminal of the data-writing module 104 may be electrically connected to the data line S, and the control terminal of the data-writing module 104 may be electrically connected to the first scan line G1.

The disclosed embodiments may explain that in addition to the driving module 101, the compensation module 102, and the voltage regulation module 103, the pixel circuit 10 in the display panel 000 may further include the first reset module 105 and the data-writing module 104. Optionally, the pixel circuit 10 may also include a second reset module 106, a first light-emitting control module 107, a second light-emitting control module 108, a storage module 109, or any other module such as a bias module (not shown in the Figure), which may not be limited by the present disclosure.

The first terminal of the second reset module 106 may be electrically connected to the reference voltage line REF, the second terminal of the second reset module 106 may be electrically connected to the anode of the light-emitting element 20, and the control terminal of the second reset module 106 may be electrically connected to the third scan line G3. The first terminal of the first light-emitting control module 107 may be electrically connected to the first power signal line 301, the second terminal of the first light-emitting control module 107 may be electrically connected to the first terminal 101A of the driving module 101. The first terminal of the second light-emitting control module 108 may be electrically connected to the second terminal 101B of the driving module 101, and the second terminal of the second light-emitting control module 108 may be electrically connected to the anode of the light-emitting element 20, such as a light-emitting diode. Both the control terminal of the first light-emitting control module 107 and the second light-emitting control module 108 may be electrically connected to the light-emitting signal line EM. The first electrode of the storage module 109 may be electrically connected to the control terminal 101C of the driving module 101, and the second electrode of the storage module 109 may be electrically connected to the first power signal line 301.

Optionally, as shown in FIG. 6, for illustrative purposes, the first reset module 105 may include a fourth transistor T4, which is also a double-gate transistor. The data-writing module 104 may include a third transistor T3, the second reset module 106 may include a fifth transistor T5, the first light-emitting control module 107 may include a second transistor T2, the second light-emitting control module 108 may include a sixth transistor T6, the driving module 101 may include a driving transistor DT, the compensation module 102 may include the first double-gate transistor T1, the voltage regulation module 103 may include a voltage regulation capacitor C1, and the storage module 109 may include a storage capacitor C2. The storage capacitor C2 may be configured to stabilize the potential of the gate of the driving transistor DT, which may facilitate maintaining the turn-on of the driving transistor DT.

FIG. 6 illustrates the specific connection structure of the pixel circuit 10 in the display panel 000. The pixel circuit 10 may include a plurality of transistors, the voltage regulation capacitor C1, and the storage capacitor C2. One transistor may be the driving transistor DT, and the other transistors may be switching transistors. Taking the connection structure of the pixel circuit 10 electrically connected with the light-emitting element 20 illustrated in FIG. 6 as an example, the gate of the driving transistor DT may be denoted as the first node N1, the source of the driving transistor DT may be denoted as the second node N2, the drain of the driving transistor DT may be denoted as the third node N3, and the anode of the light-emitting element 20 may be denoted as the fourth node N4. The operation principle of the pixel circuit 10 may include following.

During the initial reset stage, the third scan line G3 may transmit a low voltage, both the first scan line G1 and the light-emitting signal line EM may transmit a high voltage, the fourth transistor T4 and the fifth transistor T5 may be turned on, and the other transistors may be turned-off. The voltage at the first node N1 and the fourth node N4 may provide a reset signal to the reference voltage line REF, to reset the gate of the driving transistor DT and the anode of the light-emitting element 20. Optionally, the reference voltage lines connected to the fourth transistor T4 and the fifth transistor T5 may be different. In other words, the reset signal for initializing the gate of the driving transistor DT may be different from the reset signal for initializing the anode of the light-emitting element 20. In view of this, the second scan line G2 may provide a low voltage having a phase opposite to the first scan line G1.

In the data writing and threshold compensation stages, both the third scan line G3 and the light-emitting signal line EM may transmit a high voltage, and the first scan line G1 may transmit a low voltage. The third transistor T3, the driving transistor DT, and the first double-gate transistor T1 may be turned on, and the other transistors may be turned off. The data voltage signal provided by the data line S may be successively written into the gate of the driving transistor DT through the third transistor T3, the driving transistor DT, and the first double-gate transistor T1. In view of this, the second scan line G2 may provide a high voltage having a phase opposite to the first scan line G1.

In the light-emitting stage, the light-emitting signal line EM may transmit a low voltage, and the third scan line G3 and the first scan line G1 may transmit a high voltage. The second transistor T2, the sixth transistor T6, and the driving transistor DT may be turned on, and the other transistors may be turned off. The second transistor T2, the sixth transistor T6, and the driving transistor DT may form a conductive path between the first power signal line 301 and the second power signal line 302. The driving current generated by the driving transistor DT may drive the light-emitting element 20 to emit light. In view of this, the second scan line G2 may provide a low voltage having a phase opposite to the first scan line G1.

In the subsequent light-emitting holding stage, the first scan line G1 may transmit a high voltage, and the first double-gate transistor T1 may be turned off. The second scan line G2 may provide a low voltage having a phase opposite to the first scan line G1. Through the second scan signal Scan2 on the second scan line G2 with a low voltage and the first electrode portion C11 of the voltage regulation capacitor C1, the low voltage may be coupled to the second electrode C12 of the voltage regulation capacitor C1, to pull down the high voltage at the middle node TIN of the first double-gate transistor T1. In other words, the middle node TIN of the first double-gate transistor T1 may be maintained at a substantially low voltage, to eliminate the coupling high voltage caused by the coupling effect of the transistor. Therefore, the voltage at the middle node TIN of the first double-gate transistor T1 may change as little as possible when the first double-gate transistor T1 is switched on and off. The degree of voltage change at the middle node TIN of the first double-gate transistor T1 may be reduced, thereby making the luminous intensity of the light-emitting element 20 stable, improving the overall stability of the display brightness of the display panel 000, and facilitating to improve the display quality.

Figure 30:
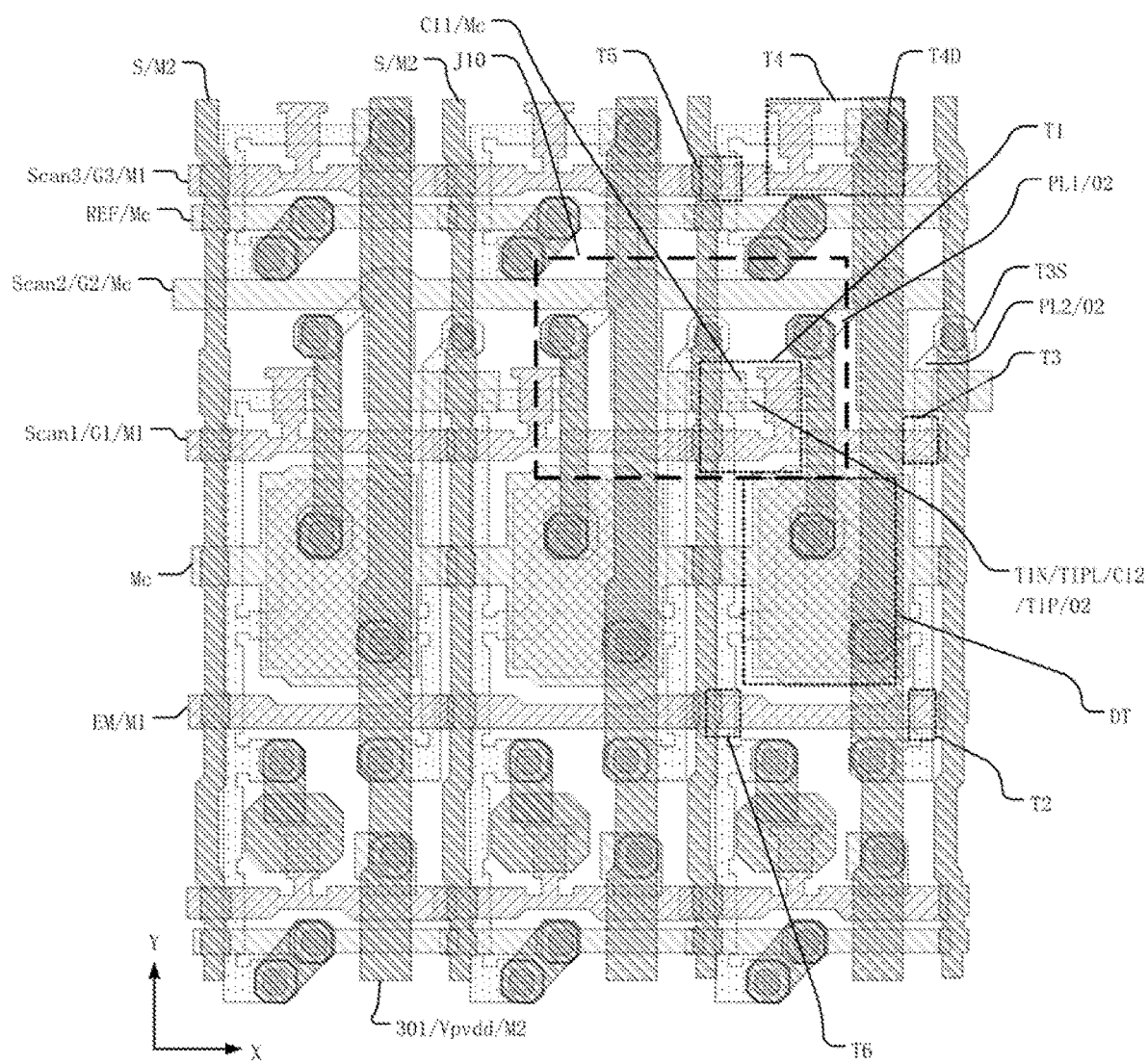
FIG. 30 illustrates another layout structure of the circuit connection structure in FIG. 6 fabricated on a substrate of the display panel consistent with disclosed embodiments of the present disclosure.
Figure 31:
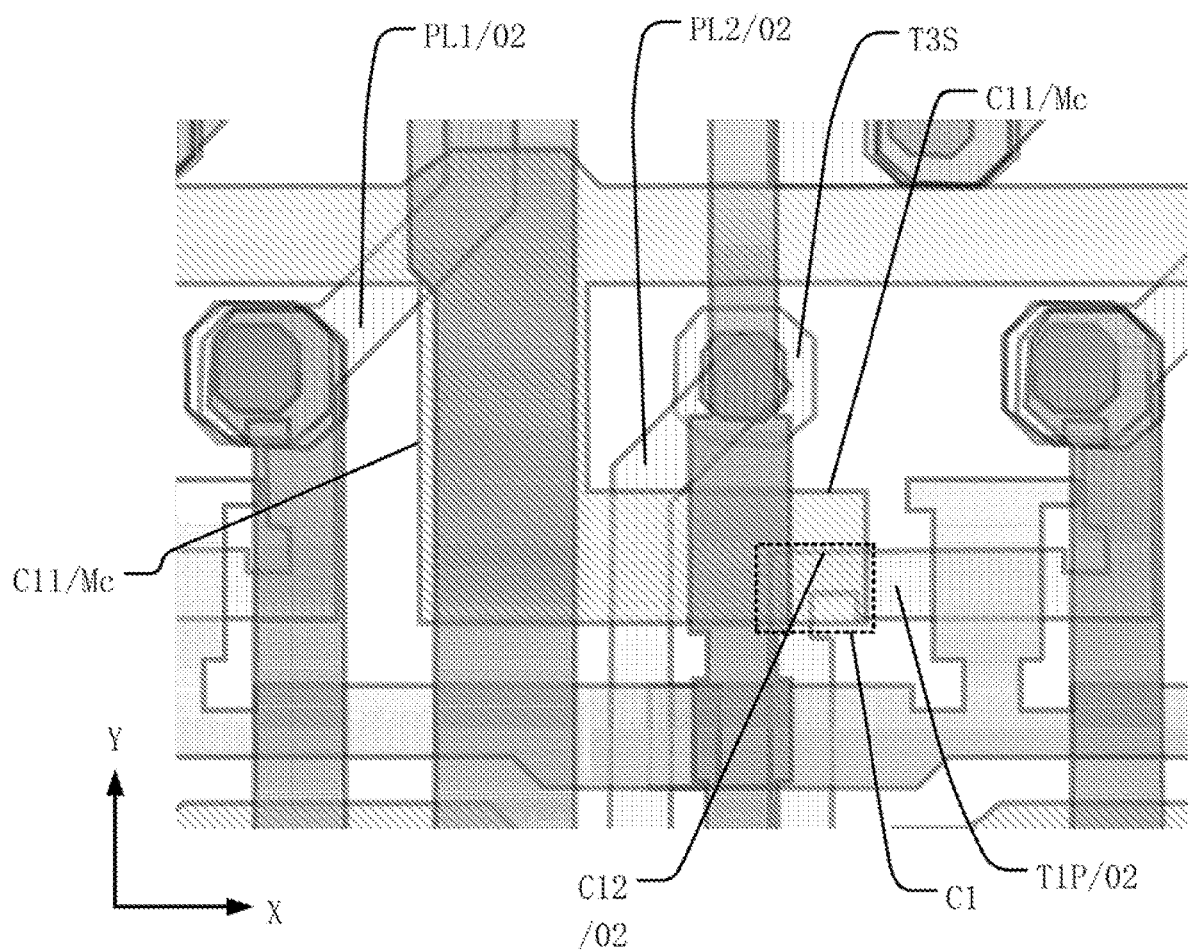
FIG. 31 illustrates a local zoom-in view of a region J10 in FIG. 30.

FIG. 30 illustrates another layout structure of the circuit connection structure in FIG. 6 fabricated on a substrate of the display panel; and FIG. 31 illustrates a local zoom-in view of a region J10 in FIG. 30. It should be noted that transparent filling is applied to FIGS. 30-31 for clarity of the structure in the present disclosure. In certain embodiments, referring to FIG. 3, FIGS. 5-6, and FIGS. 30-31, at least a portion of the first electrode portion C11 may be located between a first active connection portion PL1 and a second active connection portion PL2 along the direction parallel to the plane of the substrate 01.

Both the first active connection portion PL1 and the second active connection portion PL2 may be located in the active layer 02. The first active connection portion PL1 may be a portion of the active layer 02 electrically connected between the second terminal of the first reset module 105 and the control terminal 101C of the driving module 101. The second active connection portion PL2 may be a portion of the active layer 02 electrically connected between the second terminal of the data-writing module 104 and the data line S.

The present disclosure may explain that when the voltage regulation capacitor C1 is fabricated on the substrate 01, in a direction parallel to the plane of the substrate 01, along the length extension direction of the second scan line G2, i.e., along the first direction X shown in the Figure, at least a portion of the first electrode portion C11 used to form the voltage regulation capacitor C1 may be set between the first active connection portion PL1 and the second active connection portion PL2. Specifically, the first active connection portion PL1 may be a portion of the active layer 02 electrically connected between the second terminal of the first reset module 105 and the control terminal 101C of the driving module 101. In other words, the first active connection portion PL1 may be understood as a portion of the active layer 02 electrically connected between the second electrode T4D of the fourth transistor T4 and the gate of the drive transistor DT. The second electrode T4D of the fourth transistor T4 may be understood as one electrode connected to the gate of the drive transistor DT. The second active connection portion PL2 may be a portion of the active layer 02 electrically connected between the first electrode T3S of the third transistor T3 and the data line S. In other words, the second active connection portion PL2 may be understood as a portion of the active layer 02 electrically connected between the first electrode T3S of the third transistor T3 and the data line S. The first electrode T3S of the third transistor T3 may be understood as one electrode connected to the data line S.

It should be understood that the film layer where the first active connection portion PL1 and the second active connection portion PL2 are located may be the active layer 02 is the layout structure shown in FIG. 30. The active layer 02 may not only form the channel of the transistor, the first electrode and second electrode of the transistor at both ends of the channel, but also may form the active connection portion that plays a connection role (such as the first active connection portion PL1 and the second active connection portion PL2). Among the first electrode and the second electrode of the transistor, the first electrode may be the source and the second electrode may be the drain, or the first electrode may be the drain and the second electrode may be the source, which may not be limited by the present disclosure.

The first and second electrodes of the transistor may include a doped active structure that is capable of directly transmitting the current. The channel region may include an active structure that overlaps with the gate of the transistor. The turn-on or turn-off of the channel region may be controlled by applying a voltage signal to the gate of the transistor, to control the turn-on or turn-off of the transistor. In one embodiment, the control of the turn-on or turn-off of the transistor may not be described in detail. The first active connection portion PL1 may be located in a partial region of the active layer 02 and electrically connected between the second electrode T4D of the fourth transistor T4 and the gate of the driving transistor DT. The second active connection portion PL2 may be located in a partial region of the active layer 02 and electrically connected between the first electrode T3S of the third transistor T3 and the data line S.

As the resolution of existing display panel continues to increase, the gap between the metal film layers used to form signal lines and transistors inside the display panel is getting smaller, which leads to a substantially large coupling effect and a substantially large parasitic capacitance between the metal film layers. The parasitic capacitance may further cause unwanted electric field during display of the panel to affect the display effect. The parasitic capacitance between the gate of the driving transistor and the data line may have a significant impact on the display. Once a substantially large parasitic capacitance is formed between the gate of the driving transistor and the data line, the driving current transmitted to the light-emitting element may be affected, resulting in a significant difference between the actual brightness and the standard brightness required for the light-emitting element. Therefore, crosstalk may occur on the display screen of the display panel, resulting in a decrease in display quality. The larger the parasitic capacitance between the gate of the driving transistor and the data line, the greater the difference between the actual driving current and the standard driving current, the greater the deviation between the actual brightness and the standard brightness of the light-emitting element, and the more obvious the crosstalk.

In one embodiment, in a direction parallel to the plane of the substrate 01 (in the first direction X as shown in the Figure), at least a portion of the first electrode portion C11 may be located between the first active connection portion PL1 and the second active connection portion PL2. When there is a coupling effect between the first and second active connection portions PL1 and PL2, and a coupling electric field may be generated. Because at least a portion of the first electrode portion C11 is located between the first and second active connection portions PL1 and PL2, during the data writing and threshold compensation stages, the first scan signal Scan1 on the first scan line G1 may be at a low-level, and in view of this, the second scan signal Scan2 with a high-level may be transmitted to the first electrode portion C11. In other words, during the light-emitting hold stage, at least the portion of the first electrode portion C11 between the first and second active connection portions PL1 and PL2 may receive a fixed voltage signal with a high level. Therefore, at least the portion of the first electrode portion C11 located between the first and second active connection portions PL1 and PL2 may partially block the electric field formed between the first and second active connection portions PL1 and PL2 and may reduce the coupling electric field therebetween, thereby reducing the parasitic capacitance therebetween.

Because the first active connection portion PL1 is electrically connected to the gate of the driving transistor DT and the second active connection portion PL2 is electrically connected to the data line S, the parasitic capacitance between the first active connection portion PL1 and the second active connection portion PL2 may be reduced during the data writing stage, which may be equivalent to reducing the parasitic capacitance between the gate of the driving transistor DT and the data line S. Therefore, the influence of the coupling effect at such location on the driving current flowing into the light-emitting element 20 may be reduced, the difference between the actual brightness and the standard brightness of the light-emitting element 20 may be reduced, making the actual brightness closer to the standard brightness, which may facilitate to avoid the crosstalk caused by coupling and further enhance the display quality.

It should be understood that when the first electrode portion C11 and the second scan line G2 have a one-piece structure, during the manufacturing process, as shown in FIGS. 30-31, a portion of the first electrode portion C11 may be directly pulled down at the position of the second scan line G2 between the first active connection portion PL1 and the second active connection portion PL2. The portion of the first electrode portion C11 at such location may at least partially block the electric field formed between the first active connection portion PL1 and the second active connection portion PL2. Then, the first electrode portion C11 may be further bent and extended to the location of the channel connection portion T1PL of the first double-gate transistor T1. Therefore, the remaining first electrode portion C11 may overlap with the channel connection portion T1PL to form the first capacitor C1, to couple and pull down the potential of the middle node TIN of the first double-gate transistor T1, thereby avoiding the flicker phenomenon of the display panel.

Figure 32:
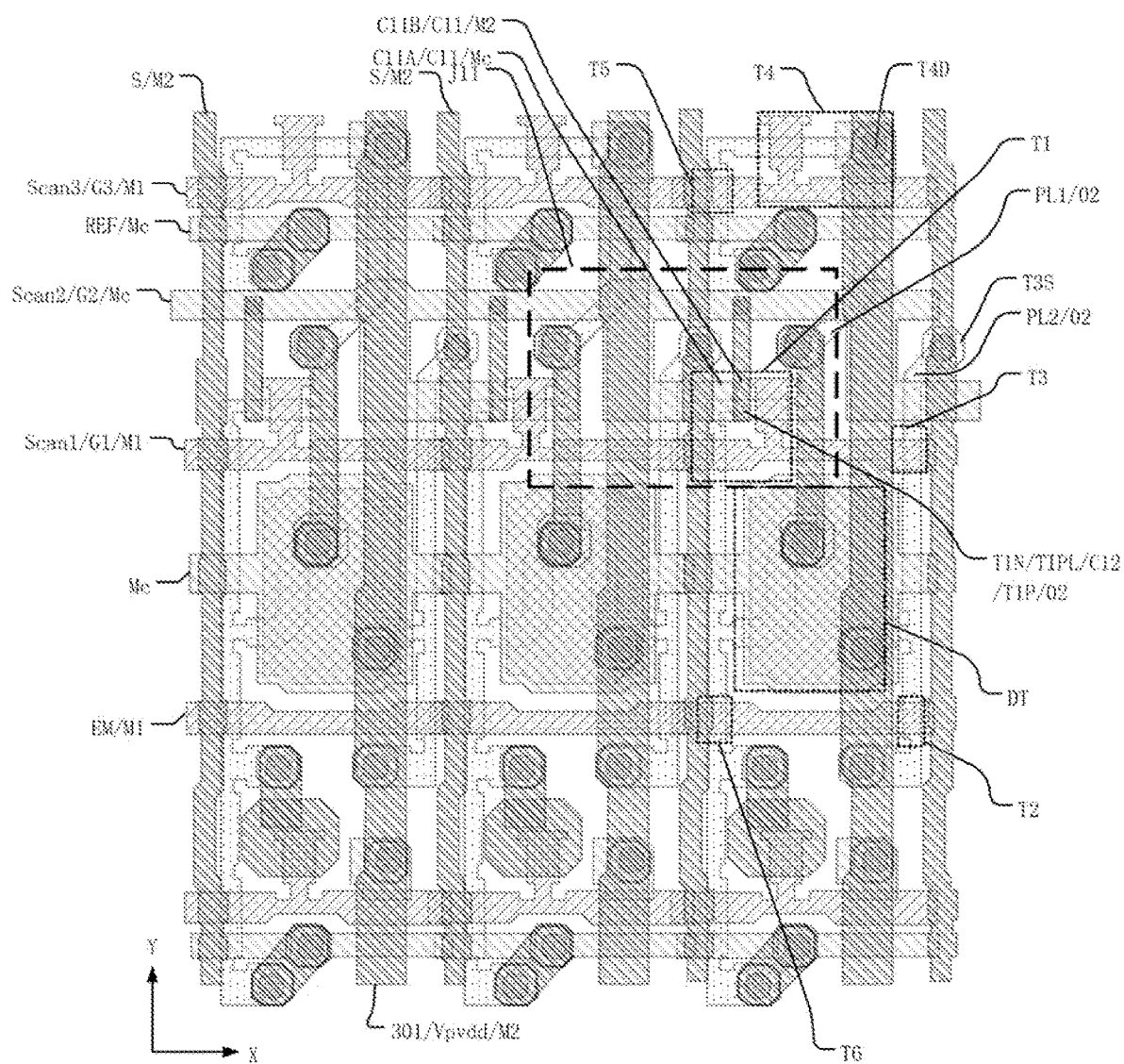
FIG. 32 illustrates another layout structure of three sub-pixels of the circuit connection structure in FIG. 6 fabricated on a substrate of the display panel consistent with disclosed embodiments of the present disclosure.
Figure 33:
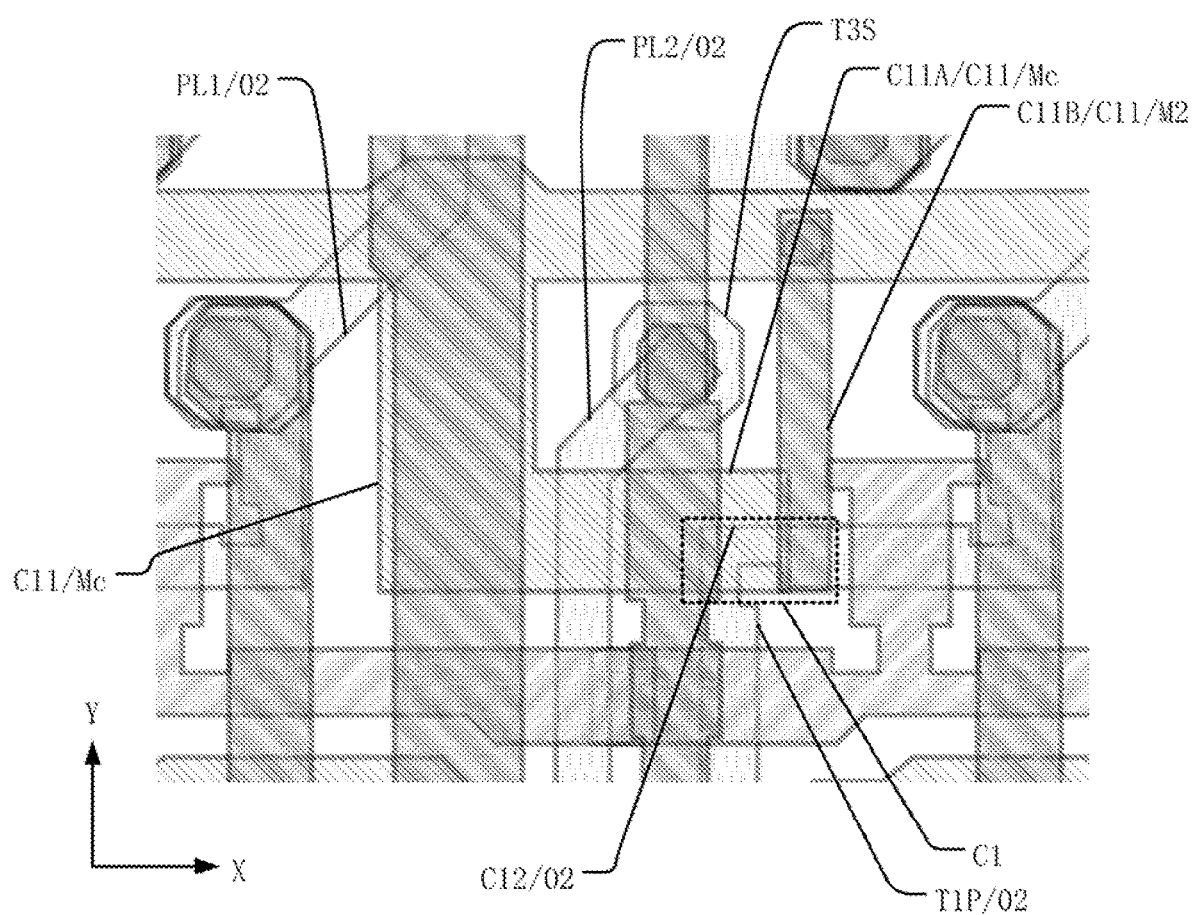
FIG. 33 illustrates a local zoom-in view of a region J11 in FIG. 32.

FIG. 32 illustrates another layout structure of three sub-pixels of the circuit connection structure in FIG. 6 fabricated on a substrate of the display panel; and FIG. 33 illustrates a local zoom-in view of a region J11 in FIG. 32. It should be noted that transparent filling is applied to FIGS. 32-33 for clarity of the structure in the present disclosure. Referring to FIG. 3, FIGS. 5-6 and FIGS. 32-33, the first electrode portion C11 may at least include the first sub-electrode portion C11A and the second sub-electrode portion C11B, which are disposed in different layers and are both connected to the second scan signal Scan2. The first sub-electrode portion C11A may at least partially overlap with the channel connection portion T1PL (i.e., the second electrode portion C12) of the first double-gate transistor T1, and the second sub-electrode portion C11B may at least partially overlap with the channel connection portion T1PL (i.e., the second electrode portion C12) of the first double-gate transistor T1.

When the first sub-electrode portion C11A and the second sub-electrode portion C11B together form the first electrode portion C11 of the voltage regulation capacitor C1, along the direction parallel to the plane where the substrate 01 is located, at least a portion of the first electrode portion C11 may be located between the first active connection portion PL1 and the second active connection portion PL2. The first electrode portion C11 may at least partially block the electric field formed between the first active connection portion PL1 and the second active connection portion PL2, may reduce the coupling effect therebetween, and thus may reduce their parasitic capacitance. The parasitic capacitance of the gate of the driving transistor DT and the data line S may be reduced, which may avoid the crosstalk caused by coupling, and may improve the display quality.

It should be understood that in one embodiment, for illustrative purposes, the transistor in the pixel circuit 10 may be a P-type transistor as an example. Specifically, the type of the transistor in the pixel circuit 10 may include but may not be limited to the P-type transistor, which may not be limited by the present disclosure.

Optionally, as shown in FIG. 3 and FIG. 6, the driving module 101 may include the driving transistor DT and the first double-gate transistor T1. Both the driving transistor DT and the first double-gate transistor T1 may be a low-temperature polysilicon transistor. Furthermore, the other transistors in the pixel circuit 10 may also be a low-temperature polysilicon transistor, and the active layer 02 may also use the low-temperature polysilicon semiconductor. Therefore, the manufacturing steps of the active layer 02 and the complexity of the film layer structure of the display panel may be reduced, the manufacturing process of the pixel circuit 10 may be simplified, the manufacturing difficulty may be simplified, and the manufacturing efficiency may be improved. Further, optionally, all transistors in the pixel circuit 10 may be P-type transistors, such as P-type low-temperature polysilicon transistors. The high mobility and high driving speed characteristics of the low-temperature polysilicon transistor may be utilized to enable the driving transistor DT to respond quickly when the data-writing module 104 is writing the data signal, such that the data signal may be quickly written to avoid the insufficient charging phenomenon caused by the long turn-on time of the driving transistor DT.

Figure 34:
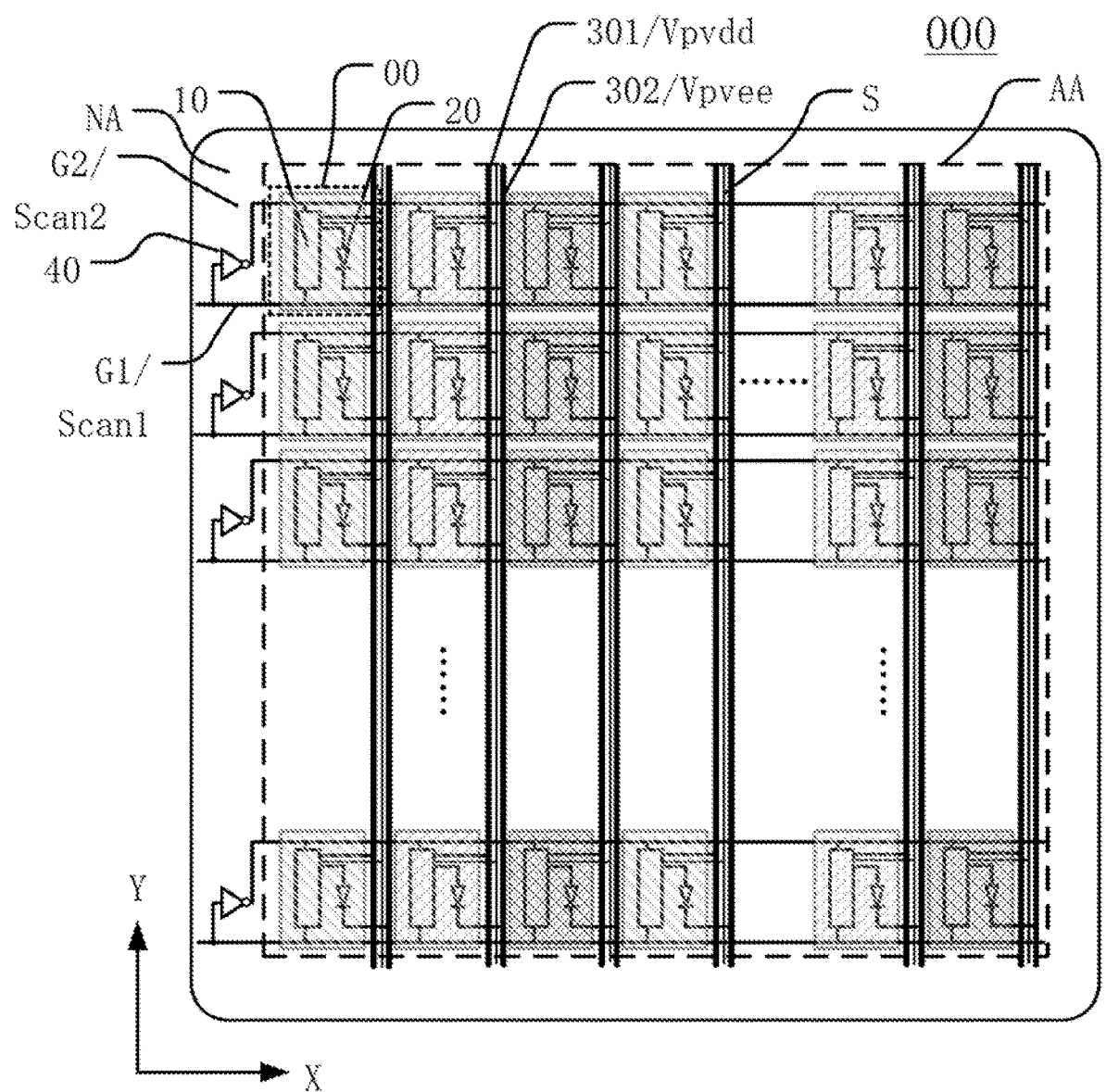
FIG. 34 illustrates a schematic diagram of a planar structure of another exemplary display panel consistent with disclosed embodiments of the present disclosure.

FIG. 34 illustrates a schematic diagram of a planar structure of another display panel consistent with disclosed embodiments of the present disclosure. It should be noted that transparent filling is applied to FIG. 34 for clarity of the structure in the present disclosure. In certain embodiments, referring to FIGS. 5-6 and FIG. 34, an inverter 40 may be connected between the first scan line G1 and the second scan line G2.

The disclosed embodiments may explain that the second terminal 103B of the voltage regulation module 103 may be electrically connected to the second scan line G2. To make the phase of the second scan signal Scan2 provided by the second scan line G2 be opposite to the phase of the first scan signal Scan1 provided by the first scan line G1, the inverter 40 may be connected between the first scan line G1 and the second scan line G2. Optionally, the inverter 40 may be disposed in the non-display region NA of the display panel 000 (e.g., the left frame position shown in FIG. 34), which may avoid the inverter 40 from affecting the display quality of the display region AA.

When the first scan signal Scan1 provided by the first scan line G1 is a high-level that controls the first double-gate transistor T1 to be turned-off, after passing through the inverter 40, the first scan signal Scan1 provided by the first scan line G1 may be outputted to the second scan line G2 as the second scan signal Scan2 with a low-level. The original high-level signal at the middle node TIN of the first double-gate transistor T1 may be lowered by the second scan signal Scan2 with a low-level, to eliminate the coupling high voltage generated by the coupling effect of the transistor, such that the voltage at the control terminal 101C of the driving module 101 may tend to be stable. Therefore, the overall display brightness stability of the display panel 000 may be improved. While improving the display quality of the display panel, a separate signal terminal of the second scan line G2 for providing the second scan signal Scan2 may not need to be provided in the display panel 000, and merely the signal terminal of the first scan line G1 for providing the first scan signal Scan1 may need to be provided. The inverter 40 may convert the first scan signal Scan1 into the second scan signal Scan2, which may facilitate simplifying the panel structure.

Figure 35:
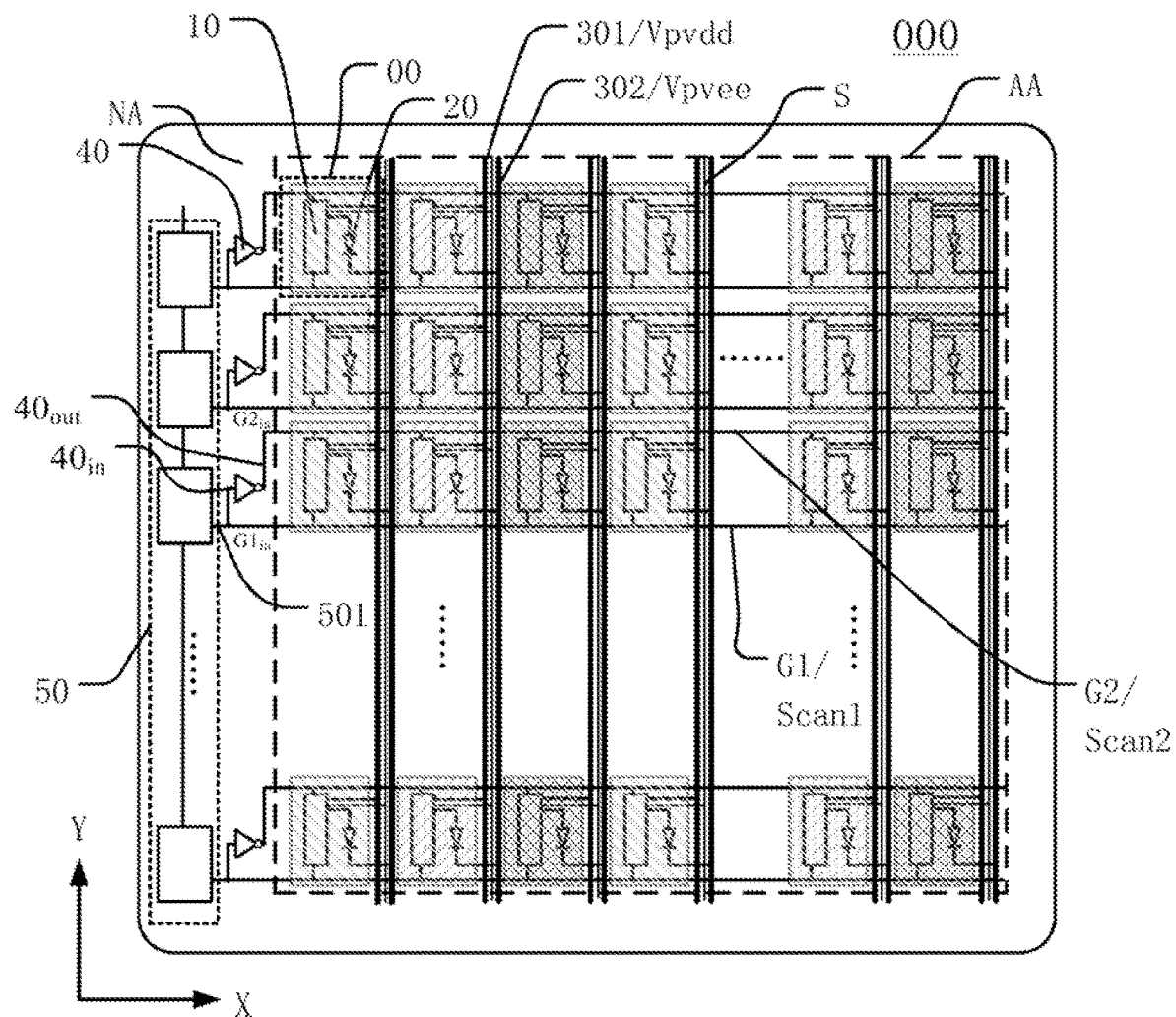
FIG. 35 illustrates a schematic diagram of a planar structure of another exemplary display panel consistent with disclosed embodiments of the present disclosure.

FIG. 35 illustrates a schematic diagram of a planar structure of another display panel consistent with disclosed embodiments of the present disclosure. It should be noted that transparent filling is applied to FIG. 35 for clarity of the structure in the present disclosure. In certain embodiments, referring to FIGS. 5-6 and FIG. 35, the inverter 40 may be connected between the first scan line G1 and the second scan line G2. The non-display region NA of the display panel 000 may include a scan driving circuit 50. The scan driving circuit 50 may include a first scan signal output terminal 501, and the first scan signal output terminal 501 may be connected to an input terminal G1$_{in}$ of the first scan line G1. The first scan signal output terminal 501 may be connected to the input terminal 40$_{in}$ of the inverter 40. An output terminal 40$_{out}$ of the inverter 40 may be connected to an input terminal G2$_{in}$ of the second scan line G2.

The disclosed embodiments may explain that the non-display region NA of the display panel 000 may include the scan driving circuit 50. The scan driving circuit 50 may include the first scan signal output terminal 501, and may be configured to generate at least the first scan signal Scan1. Optionally, the scan driving circuit 50 may include a plurality of cascaded shift register units, and each shift register unit may include a circuit structure for generating a scan driving signal. By connecting the first scan signal output terminal 501 of the scan driving circuit 50 to the input terminal G1$_{in}$ of the first scan line G1, the first scan signal Scan1 of the display panel 000 may provide the first scan line G1.

When the inverter 40 is connected between the first scan line G1 and the second scan line G2, the specific connection structure of the inverter 40 in the display panel 000 may include following. The first scan signal output terminal 501 of the scan driving circuit 50 may be connected to the input terminal 40$_{in}$ of the inverter 40, and the output terminal 40$_{out}$ of the inverter 40 may be connected to the input terminal G2$_{in}$ of the second scan line G2. The first scan signal Scan1 outputted by the first scan signal output terminal 501 of the scan driving circuit 50 may be inverted by the inverter 40, in other words, the signal generated by the output terminal 40$_{out}$ of the inverter 40 may be provided to the second scan line G2 of the display panel 000. Therefore, the second scan signal Scan2 on the second scan line G2 may be a signal with a phase opposite to the first scan signal Scan1 on the first scan line G1. While achieving the coupling and pulling down the voltage of the middle node TIN of the first double-gate transistor T1 by the voltage regulation capacitor C1, the quantity of signal output terminals included in the scan driving circuit 50 may be reduced. Merely the first scan signal output terminal 501 may need to be provided without the need for an additional signal output terminal connected to the second scan line G2, which may further facilitate to reduce the space of the non-display region NA occupied by the scan driving circuit 50, and to reduce the border width of the display panel 000, thereby reducing the wiring difficulty of the scan driving circuit 50 in the non-display region NA.

It should be understood that the Figures in the disclosed embodiments may merely illustrate a block diagram of the scan driving circuit 50. In specific implementation, the circuit structure of the scan driving circuit 50 may be understood by reference to the structure of the scan driving circuit included in the existing display panel, which may not be repeated herein.

Figure 36:
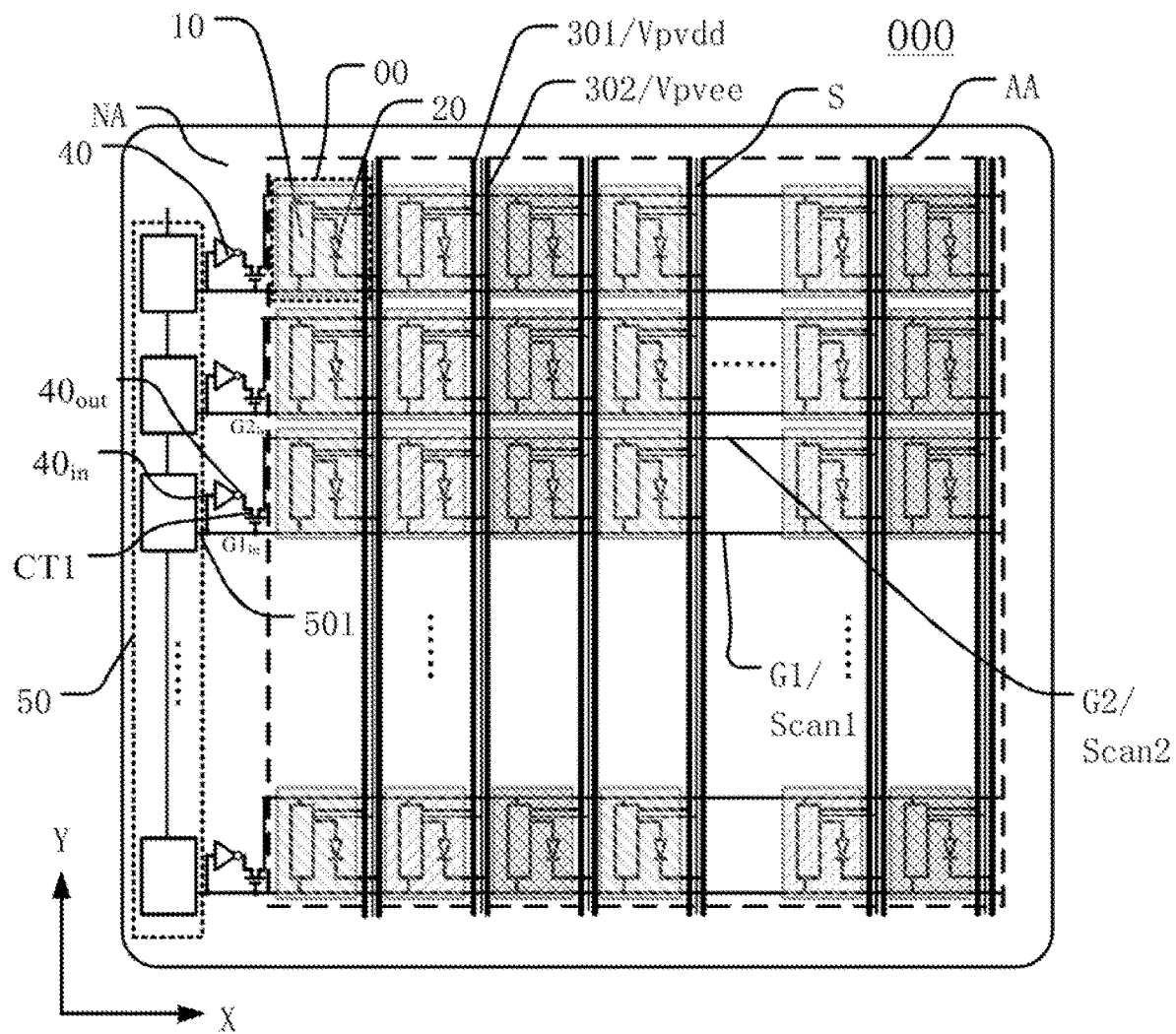
FIG. 36 illustrates a schematic diagram of a planar structure of another exemplary display panel consistent with disclosed embodiments of the present disclosure.
Figure 37:
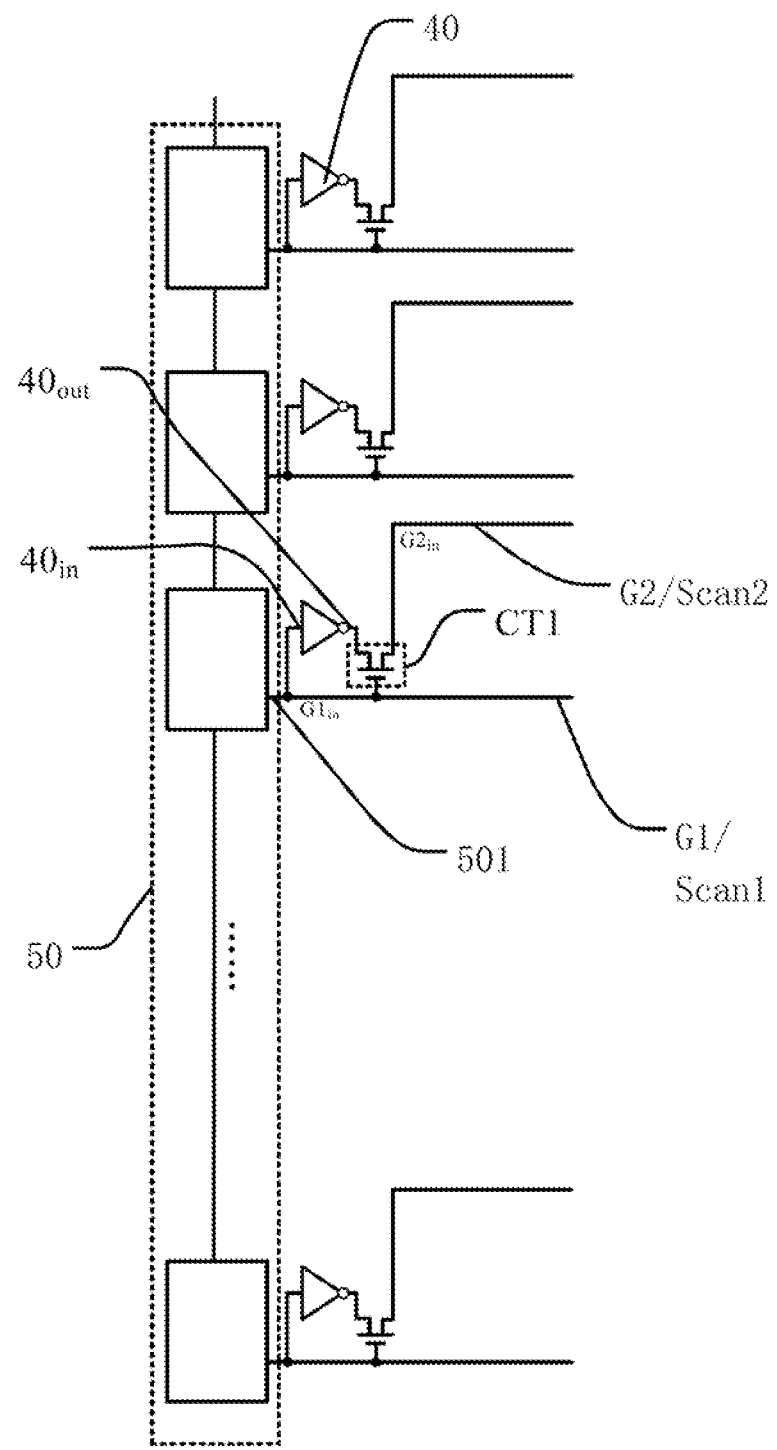
FIG. 37 illustrates a schematic diagram of a connection structure between the scan driving circuit and first and second scan lines in FIG. 36.

FIG. 36 illustrates a schematic diagram of a planar structure of another display panel consistent with disclosed embodiments of the present disclosure; and FIG. 37 illustrates a schematic diagram of a connection structure between the scan driving circuit and the first and second scan lines in FIG. 36. It should be noted that transparent filling is applied to FIG. 36 for clarity of the structure in the present disclosure. In certain embodiments, the inverter 40 may be connected between the first scan line G1 and the second scan line G2, and a first switch control transistor CT1 may also be connected between the first scan line G1 and the second scan line G2. A gate of the first switch control transistor CT1 may be connected to the first scan line G1, a first electrode of the first switch control transistor CT1 may be connected to an output terminal 40$_{out}$ of the inverter 40, and a second electrode of the first switch control transistor CT1 may be connected to the input terminal G2$_{in}$ of the second scan line G2.

When the first double-gate transistor T1 is turned on, the first switch control transistor CT1 may control the second scan line G2 not to be connected with the second scan signal Scan2. When the first double-gate transistor T1 is turned off, the first switch control transistor CT1 may control the second scan line G2 to be connected with the second scan signal Scan2.

Optionally, because the first switch control transistor CT1 needs to control the second scan line G2 not to be connected with the second scan signal Scan2 when the first double-gate transistor T1 is turned on, in other words, the first switch control transistor CT1 may be turned off. The first switch control transistor CT1 may control the second scan line G2 to be connected with the second scan signal Scan2 when the first double-gate transistor T1 is turned off, in other words, the first switch control transistor CT1 may be turned on. Therefore, the gate of the first switch control transistor CT1 may be connected to the first scan line G1, and the turned-on/turned-off state of the first switch control transistor CT1 may be controlled by the first scan signal Scan1 provided on the first scan line G1.

When the first double-gate transistor T1 is a P-type transistor, the first switch control transistor CT1 may be an N-type transistor (as shown in FIGS. 36-37). When the first scan signal Scan1 provided on the first scan line G1 is at a low-level and the first double-gate transistor T1 is turned on, the first scan signal Scan1 with a low-level may control the first switch control transistor CT1 to be turned off. When the first scan signal Scan1 provided on the first scan line G1 is at a high-level and the first double-gate transistor T1 is turned off, the first scan signal Scan1 with the high-level may control the first switch control transistor CT1 to be turned on. Alternatively, when the first double-gate transistor T1 is an N-type transistor, the first switch control transistor CT1 may be a P-type transistor. When the first scan signal Scan1 provided on the first scan line G1 is at a high-level and the first double-gate transistor T1 is turned on, the first scan signal Scan1 with a high-level may control the P-type first switch control transistor CT1 to be turned off. When the first scan signal Scan1 provided on the first scan line G1 is at a low-level and the first double-gate transistor T1 is turned off, the first scan signal Scan1 with the low-level may control the P-type first switch control transistor CT1 to be turned on (not shown in the Figure).

The disclosed embodiments may explain that in the display panel 000, the first scan signal Scan1 outputted from the first scan signal output terminal 501 of the scan driving circuit 50 may be inverted by the inverter 40, to make the signal generated at the output terminal 40$_{out}$ of the inverter 40 be the second scan signal Scan2, which may be provided to the second scan line G2 in the display panel 000. The second scan signal Scan2 on the second scan line G2 may be a signal with a phase opposite to the first scan signal Scan1 on the first scan line G1. The first switch control transistor CT1 may be connected between the first scan line G1 and the second scan line G2. Specifically, the gate of the first switch control transistor CT1 may be connected to the first scan line G1, the first electrode of the first switch control transistor CT1 may be connected to the output terminal 40$_{out}$ of the inverter 40, and the second electrode of the first switch control transistor CT1 may be connected to the input terminal G2$_{in}$ of the second scan line G2.

When the first double-gate transistor T1 is turned on, the first switch control transistor CT1 may control the second scan line G2 not to be connected with the second scan signal Scan2. Therefore, when the first double-gate transistor T1 is turned on to write the data voltage signal to the driving module 101 in the data writing stage, the first switch control transistor CT1 may be in a turned-off state. In view of this, after the first scan signal Scan1 passes through the inverter 40, even if the output terminal 40$_{out}$ of the inverter 40 may output the second scan signal Scan2 with a phase opposite to the first scan signal Scan1, the second scan signal Scan2 may not be transmitted to the input terminal G2$_{in}$ of the second scan line G2. By controlling the first switch control transistor CT1 to be in a turned-off state, during the data writing stage, the second scan line G2 may not be connected with the second scan signal Scan2. Therefore, the second scan signal Scan2 with a low-level may be prevented from affecting the operating performance of the first double-gate transistor T1 in the data writing stage through the voltage-regulation capacitor C1, which may facilitate to ensure the display quality.

When the first double-gate transistor T1 is turned off, the first switch control transistor CT1 may control the second scan line G2 to be connected with the second scan signal Scan2. In other words, during the light emission of the display panel 000, the first switch control transistor CT1 may be controlled to be in a turned-on state, such that the second scan line G2 may be connected with the second scan signal Scan2. In other words, after the first scan signal Scan1 passes through the inverter 40, the output terminal 40$_{out}$ of the inverter 40 may output the second scan signal Scan2 with a phase opposite to the first scan signal Scan1, and the second scan signal Scan2 may be transmitted to the input terminal G2$_{in}$ of the second scan line G2. The second scan signal Scan2 with a low-level may be transmitted to the voltage-regulation capacitor C1, to pull down the coupling high potential of the middle node TIN of the first double-gate transistor T1, thereby preventing the leakage current of the transistor from affecting the potential of the control terminal 101C of the driving module 101 and avoiding the flicker phenomenon of the panel.

Figure 38:
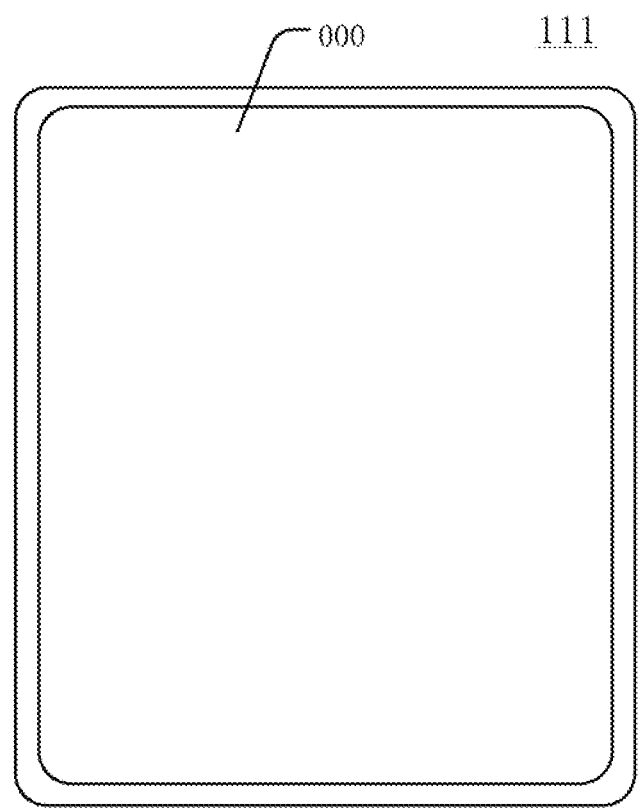
FIG. 38 illustrates a schematic diagram of an exemplary display device consistent with disclosed embodiments of the present disclosure.

The present disclosure also provides a display device. FIG. 38 illustrates a schematic diagram of a display device consistent with disclosed embodiments of the present disclosure. In certain embodiments, referring to FIG. 38, the display device 111 may include the display panel 000 provided in any one of the disclosed embodiments of the present disclosure. FIG. 38 may merely use a mobile phone to describe the display device 111 as an example. It should be understood that the display device 111 in the disclosed embodiments may be any other display device 111 with a display function, such as a computer, a TV, and a car display device, etc., which may not be limited by the present disclosure. The display device 111 may have the beneficial effects of display panel, which may refer to the descriptions of the disclosed display panel 000 in the disclosed embodiments, and may not be repeated herein.

The disclosed display panel and display device may have following beneficial effects. In the disclosed display panel, the sub-pixel may include a pixel circuit and a light-emitting element that are electrically connected to each other. When the pixel circuit drives the light-emitting element to emit light, the driving module may generate a driving current for driving the light-emitting element to emit light through a conductive path between the first power signal line, the driving module, the light-emitting element, and the second power signal line. Thus, the light-emitting effect of the light-emitting element may be achieved. The compensation module in the pixel circuit may be configured to detect and compensate for the threshold voltage deviation of the driving transistor in the driving module during the data writing and threshold compensation stages of the pixel circuit, and may provide the compensated threshold voltage deviation and the data voltage signal provided by the data line to the driving module, to achieve threshold compensation for the driving module. The compensation module may include the first double-gate transistor, which can improve the leakage characteristics of the switching transistor of the compensation module because the leakage current of the double-gate transistor is much smaller than the leakage current of the single-gate transistor. When the pixel circuit drives the light-emitting element to emit light, the potential at the control terminal of the driving module may be stabilized to certain extent.

The pixel circuit may also include the voltage regulation module. The two terminals of the voltage regulation module may be electrically connected to the middle node of the first double-gate transistor and the second scan line, respectively. The second scan line may provide the second scan signal. The first double-gate transistor may be a P-type transistor as an example. When the first double-gate transistor changes from the turned-on state to the turned-off state, in other words, when the gate voltage of the first double-gate transistor changes from a low-level to a high-level, due to the coupling effect of the first double-gate transistor, the voltage at the middle node of the first double-gate transistor may be coupled to a high-level. However, because the second terminal of the voltage regulation module is electrically connected to the second scan line, a phase of the second scan signal may be opposite to a phase of the first scan signal. In other words, the first scan signal may be at a high-level that controls turned-off of the first double-gate transistor, and the second scan signal may be at a low-level.

By using the second scan signal at a low-level, the high-level signal coupled to the middle node of the first double-gate transistor may be pulled down. In other words, the middle node of the first double-gate transistor may be kept at a low-level, to eliminate the coupling high voltage generated by the coupling effect of the transistor. Therefore, the voltage at the middle node of the first double-gate transistor may change as little as possible when the first double-gate transistor is switched on and off, and the degree of voltage change at the middle node of the first double-gate transistor may be reduced. Even if the leakage current characteristics of a sub-transistor of the first double-gate transistor inevitably exist, after the potential at the middle node is transmitted to the control terminal of the driving module, the stability of the control terminal of the driving module may not be affected. Then, the voltage at the control terminal of the driving module may tend to be stable, thereby making the luminous intensity of the light-emitting element stable, improving the overall stability of the display brightness of the display panel, and facilitating to improve the display quality.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
a plurality of sub-pixels, wherein:
each of the plurality of sub-pixels includes a pixel circuit and a light-emitting element that are electrically connected to each other,
the pixel circuit at least includes a driving module and a compensation module, wherein a first terminal of the driving module is electrically connected to a first power signal line, a second terminal of the driving module is electrically connected to an anode of the light-emitting element, and a cathode of the light-emitting element is electrically connected to a second power signal line,
the compensation module includes a first double-gate transistor, wherein a first electrode of the first double-gate transistor is electrically connected to a control terminal of the driving module, a second electrode of the first double-gate transistor is electrically connected to the second terminal of the driving module, and a gate of the first double-gate transistor is connected to a first scan line, wherein the first scan line provides a first scan signal,
the pixel circuit further includes a voltage regulation module, and the first double-gate transistor includes a middle node, wherein a first terminal of the voltage regulation module is electrically connected to the middle node, and a second terminal of the voltage regulation module is electrically connected to a second scan line, wherein the second scan line provides a second scan signal, and
a phase of the second scan signal is opposite to a phase of the first scan signal.

2. The display panel according to claim 1, wherein:
the first double-gate transistor includes a first sub-transistor and a second sub-transistor that are connected in series, wherein:
a first electrode of the first sub-transistor is electrically connected to the control terminal of the driving module, a second electrode of the first sub-transistor is electrically connected to a first electrode of the second sub-transistor, a second electrode of the second sub-transistor is electrically connected to the second terminal of the driving module, and both a gate of the first sub-transistor and a gate of the second sub-transistor are connected to the first scan line, and
the middle node is located at a connection portion of the second electrode of the first sub-transistor and the first electrode of the second sub-transistor.

3. The display panel according to claim 1, wherein:
the voltage regulation module includes a voltage regulation capacitor, and the voltage regulation capacitor includes a first electrode portion and a second electrode portion, wherein the first electrode portion is electrically connected to the second scan line, and the second electrode portion is electrically connected to the middle node.

4. The display panel according to claim 3, further including:
a substrate and an active layer located on a side of the substrate, wherein the active layer includes an active portion of the first double-gate transistor, and in a direction perpendicular to a plane of the substrate, the first electrode portion at least partially overlaps with the active portion of the first double-gate transistor, and at least a portion of the active portion of the first double-gate transistor is multiplexed as the second electrode portion.

5. The display panel according to claim 4, wherein:
the active portion of the first double-gate transistor at least includes a first sub-channel portion, a second sub-channel portion, and a channel connection portion, wherein the first sub-channel portion and the second sub-channel portion are connected by the channel connection portion, and the channel connection portion includes the middle node, and
in the direction perpendicular to the plane of the substrate, the first electrode portion at least partially overlaps with the channel connection portion, and the channel connection portion is multiplexed as the second electrode portion.

6. The display panel according to claim 4, wherein:
the first double-gate transistor includes a first gate and a second gate, wherein in a direction parallel to the plane of the substrate, the first electrode portion and the first gate are spaced apart by a first distance, and the first electrode portion and the second gate are spaced apart by a second distance.

7. The display panel according to claim 4, wherein:
the first double-gate transistor includes a first gate and a second gate, wherein in the direction perpendicular to the plane of the substrate, the first electrode portion overlaps with a portion of the first gate, and/or the first electrode portion overlaps with a portion of the second gate.

8. The display panel according to claim 4, wherein:
the first electrode portion at least includes a first sub-electrode portion and a second sub-electrode portion, wherein the first sub-electrode portion and the second sub-electrode portion are arranged on different layers and are electrically connected to each other, and
in the direction perpendicular to the plane of the substrate, the first sub-electrode portion at least partially overlaps with the active portion of the first double-gate transistor, and the second sub-electrode portion at least partially overlaps with the active portion of the first double-gate transistor.

9. The display panel according to claim 8, wherein:
the first double-gate transistor includes a first gate and a second gate, wherein in the direction perpendicular to the plane of the substrate, the second sub-electrode portion overlaps with a portion of the first gate, and/or the second sub-electrode portion overlaps with a portion of the second gate.

10. The display panel according to claim 8, wherein:
in the direction perpendicular to the plane of the substrate, the second sub-electrode portion at least partially overlaps with the first sub-electrode portion.

11. The display panel according to claim 4, wherein:
the first scan line and the gate of the first double-gate transistor are disposed on a same layer, and the first scan line and the first electrode portion are disposed on different layers.

12. The display panel according to claim 4, wherein:
the pixel circuit further includes a first reset module and a data-writing module, wherein:
a first terminal of the first reset module is electrically connected to a reference voltage line, a second terminal of the first reset module is electrically connected to the control terminal of the driving module, and a control terminal of the first reset module is electrically connected to a third scan line, and a first terminal of the data-writing module is electrically connected to the first terminal of the driving module, a second terminal of the data-writing module is electrically connected to a data line, and a control terminal of the data-writing module is electrically connected to the first scan line.

13. The display panel according to claim 12, wherein:
along a direction parallel to the plane of the substrate, at least a portion of the first electrode portion is located between a first active connection portion and a second active connection portion, wherein:
both the first active connection portion and the second active connection portion are located in the active layer,
the first active connection portion includes a portion of the active layer electrically connected between the second terminal of the first reset module and the control terminal of the driving module, and
the second active connection portion includes another portion of the active layer electrically connected between the second terminal of the data-writing module and the data line.

14. The display panel according to claim 4, wherein:
the first electrode portion and the second scan line have a one-piece structure.

15. The display panel according to claim 1, wherein:
an inverter is connected between the first scan line and the second scan line.

16. The display panel according to claim 15, further including:
a scan driving circuit, wherein the scan driving circuit includes a first scan signal output terminal, and the first scan signal output terminal is connected to an input terminal of the first scan line, the first scan signal output terminal is connected to an input terminal of the inverter, and an output terminal of the inverter is connected to an input terminal of the second scan line.

17. The display panel according to claim 16, wherein:
a first switch control transistor is connected between the first scan line and the second scan line, wherein a gate of the first switch control transistor is connected to the first scan line, a first electrode of the first switch control transistor is connected to the output terminal of the inverter, and a second electrode of the first switch control transistor is connected to the input terminal of the second scan line, and when the first double-gate transistor is turned on, the first switch control transistor controls the second scan line not to be connected with the second scan signal, and when the first double-gate transistor is turned off, the first switch control transistor controls the second scan line to be connected with the second scan signal.

18. The display panel according to claim 17, wherein:
when the first double-gate transistor is a P-type transistor, the first switch control transistor is an N-type transistor; or
when the first double-gate transistor is an N-type transistor, the first switch control transistor is a P-type transistor.

19. The display panel according to claim 1, wherein:
the driving module includes a driving transistor, and both the first double-gate transistor and the driving transistor are a low-temperature polysilicon transistor.

20. A display device, comprising:
a display panel, the display panel including:
a plurality of sub-pixels, wherein:
each of the plurality of sub-pixels includes a pixel circuit and a light-emitting element that are electrically connected to each other,
the pixel circuit at least includes a driving module and a compensation module, wherein a first terminal of the driving module is electrically connected to a first power signal line, a second terminal of the driving module is electrically connected to an anode of the light-emitting element, and a cathode of the light-emitting element is electrically connected to a second power signal line,
the compensation module includes a first double-gate transistor, wherein a first electrode of the first double-gate transistor is electrically connected to a control terminal of the driving module, a second electrode of the first double-gate transistor is electrically connected to the second terminal of the driving module, and a gate of the first double-gate transistor is connected to a first scan line, wherein the first scan line provides a first scan signal,
the pixel circuit further includes a voltage regulation module, and the first double-gate transistor includes a middle node, wherein a first terminal of the voltage regulation module is electrically connected to the middle node, and a second terminal of the voltage regulation module is electrically connected to a second scan line, wherein the second scan line provides a second scan signal, and
a phase of the second scan signal is opposite to a phase of the first scan signal.

* * * * *